United States Patent [19]

Nakao

[11] Patent Number: 5,371,420
[45] Date of Patent: Dec. 6, 1994

[54] OUTPUT CIRCUIT HAVING REDUCED SWITCHING NOISE

[75] Inventor: Kenji Nakao, Itami, Japan

[73] Assignee: Mitsubishi Denki Kabushiki Kaisha, Tokyo, Japan

[21] Appl. No.: 35,115

[22] Filed: Mar. 19, 1993

[30] Foreign Application Priority Data

Mar. 30, 1992 [JP] Japan .................................. 4-073708

[51] Int. Cl.$^5$ ............................................ H03K 17/16
[52] U.S. Cl. ............................................ 326/27; 326/30; 326/82; 327/111; 327/384
[58] Field of Search ............... 307/443, 448, 451, 475, 307/263

[56] References Cited

U.S. PATENT DOCUMENTS

| | | | |
|---|---|---|---|
| 4,760,279 | 7/1988 | Saito et al. | 307/443 X |
| 4,791,321 | 12/1988 | Tanaka et al. | 307/451 |
| 4,818,901 | 4/1989 | Young et al. | 307/443 X |
| 4,829,199 | 5/1989 | Prater | 307/451 X |
| 4,985,644 | 1/1991 | Okihara et al. | 307/443 |
| 5,140,194 | 8/1992 | Okitaka | 307/473 |
| 5,148,048 | 9/1992 | Kawasaki et al. | 307/263 |
| 5,166,555 | 11/1992 | Kano | 307/443 X |
| 5,241,221 | 8/1993 | Fletcher et al. | 307/443 X |

FOREIGN PATENT DOCUMENTS 63-283315 11/1988 Japan .

*Primary Examiner*—David R. Hudspeth
*Attorney, Agent, or Firm*—Oblon, Spivak, McClelland, Maier & Neustadt

[57] ABSTRACT

An output circuit which hardly causes ringing etc. in its output waveform even if a high capacity load is driven at a high speed comprises an input terminal (11), an output terminal (12), an output driving circuit (5) controlled by a signal received in the input terminal (11), and voltage drop means (6) connected between an output terminal (10) of the output driving circuit (5) and the output terminal (12). The output driving circuit (5) is formed by connecting a circuit having high current drivability and that having small current drivability in parallel with each other, to have large current drivability when change of an output voltage is started while having small current drivability at a terminating point of the change. While ringing is suppressed by the output driving circuit (5), it is possible to obtain an output circuit which hardly causes ringing in its output waveform as well as undesired radiation also by optimizing current drivability and output impedance of the output circuit by the voltage drop means (6) in response to a load connected thereto and driving an output buffer of a logic circuit at a high speed.

43 Claims, 52 Drawing Sheets

OUTPUT VOLTAGE Vo OF OUTPUT DRIVING CIRCUIT

OUTPUT VOLTAGE Vo OF OUTPUT DRIVING CIRCUIT

OUTPUT CIRCUIT HAVING REDUCED SWITCHING NOISE

BACKGROUND OF THE INVENTION

1. Field of the Invention

The present invention relates to an output circuit which can suppress ringing of its output voltage waveform, and more particularly, it relates to a technique of suppressing vibration such as ringing, overshooting or undershooting which is caused in the voltage waveform by transient response resulting from conductance, inductance etc. of load capacitance, wires etc. connected to an output terminal, impedance mismatching between the output circuit and the load, and the like.

2. Description of the Background Art

In recent years, a high-speed operation is required for a logic circuit due to a demand for high-speed processing of digital data. Also in an output circuit, therefore, it is necessary to drive a load having high capacitance at a high speed.

When an output circuit which is connected with high load capacitance is driven at a high speed, however, the output circuit inevitably energizes a resonance circuit which is formed on the load side by inductance of the load capacitance, wires and the like, to cause ringing in the output waveform thereof.

In order to increase the operating speed of such an output circuit, further, it is necessary to regard the load connected to the output circuit, which can be handled as a lumped parameter element having simple inductance and capacitance, also as a distributed parameter element. For example, wires provided on a multilayer substrate must be handled as microstriplines, which are distributed parameter elements.

FIG. 54 shows an exemplary CMOS output circuit of a conventional MOS integrated circuit. Referring to FIG. 54, the CMOS output circuit comprises an N-channel transistor 100N which outputs a low level and a P-channel transistor 100P which outputs a high level. The transistors 100P and 100N have gates which are connected to an input terminal 11, drains which are connected to an output terminal 12, and sources which are connected to a ground potential 2 and a power source 3 respectively. These transistors 100P and 100N are complementarily driven by an input signal supplied to the input terminal 11, which is connected to the gates of these transistors 100P and 100N in common. When the input terminal 11 receives a high-level input signal, the transistor 100N is driven and the other transistor 100P not driven so that the logical level of the output terminal 12 goes low, and vice versa.

In order to drive a load by the conventional output circuit at a high speed, the N-channel transistor 100N and the P-channel transistor 100P may be increased in current drivability by increasing ratios of channel widths channel lengths, for example. In general, the channel widths of such transistors are increased. When such transistors are simply increased in current drivability, however, ringing may disadvantageously be caused in the output waveform, depending on a load which is connected to the output terminal 12.

FIG. 55 illustrates an equivalent circuit of the output circuit shown in FIG. 54, which is connected with a load to be driven, with a simple model. This equivalent circuit is in a state outputting a low level. The N-channel transistor 100N is expressed by parallel connection of a current source CSU and ON resistance $R_{ON}$. A load capacitor 320 having a conductance value C is connected to the output terminal 12 through an inductor 310 having an inductance value L.

The inductor 310 is a parasitic inductor which is formed by a wire, a copper foil wire provided on a printed board, a bonding wire for an integrated circuit, or the like.

As clearly understood from FIG. 55, the output circuit including the load forms a resonance circuit.

A resonance frequency $f_0$ of the equivalent circuit of this model is expressed as follows:

$$f_0 = \frac{1}{2\pi \sqrt{LC}} \qquad (1)$$

($f_0$: the resonance frequency)

Assuming that $2\pi f_0 = \omega_0$, the Q value in the resonance frequency $f_0$ is expressed as follows:

$$Q = \frac{j\omega_0 L}{R_{ON}} \qquad (2)$$

The ON resistance $R_{ON}$ of the output transistor is reduced as the current drivability of the transistor is increased for increasing the speed of the output circuit. FIG. 56 shows output voltage/output current characteristics of the output circuit which is increased in current drivability. Referring to FIG. 56, a line 201 represents the characteristics provided before the current drivability is increased, and symbol $\theta_1$ represents an inclination showing the inverse number of an ON resistance value of the output circuit in the vicinity of a low level measured before increase of the current drivability. On the other hand, a line 202 represents the characteristics provided when the current drivability is increased, and symbol $\theta_2$ represents an inclination showing the inverse number of an ON resistance value of the output circuit in the vicinity of a low level measured after increase of the current drivability. As understood from FIG. 56, the ON resistance (output voltage/output current) is reduced and that in the vicinity of a low level is also reduced when the current drivability is increased. When the ON resistance is thus reduced, the Q value is increased as understood from the above expression 2, whereby the resonance circuit is energized by abrupt change of the output signal, which tends to vibrate. In other words, ringing, overshooting or undershooting is caused in the output waveform.

On the other hand, ringing may also be caused in the output waveform by impedance mismatching when the load, such as a transmission line, must be handled as a distributed parameter element. In this case, such ringing causes a noise in the transmission line to result in a malfunction of the logic circuit system, or an interference wave, called undesired radiation, to other electric apparatus.

FIG. 57 shows exemplary ringing resulting from simulation of an output waveform.

In the conventional CMOS output circuit having the aforementioned structure, ringing or the like is caused in its output waveform when the current drivability of the output transistor is increased in order to attain a high speed.

SUMMARY OF THE INVENTION

An output circuit according to the first aspect of the present invention comprises an input terminal which is supplied with an input signal, an output terminal which outputs an output signal of a first or second logical level, a power supply terminal which supplies a voltage of the first logical level, voltage drop means having an end which is connected to the output terminal, and an output driving circuit which is connected between the power supply terminal and the other end of the voltage drop means for receiving the input signal as a control signal and providing the output signal to the output terminal in response to the input signal. The output driving circuit has such current drivability that the rate of change with respect to conversion of the output signal outputted from the output terminal from the second logical level to the first logical level occurring when the level of the output signal is close to the second logical level is larger than that with respect to the conversion occurring when the level of the output signal is close to the first logical level, and the current drivability is monotonically reduced with respect to the conversion.

In an output circuit according to the second aspect of the present invention, the voltage drop means includes resistor means having a variable resistance value.

In an output circuit according to the third aspect of the present invention, the resistor means is formed by an element serving as a plurality of resistors which are formed on a substrate, so that the resistance value of the resistor means can be varied by changing the connection pattern of the element.

In an output circuit according to the fourth aspect of the present invention, the resistor means comprises control means, a plurality of elements which are interposed in a plurality of current paths coupling the output terminal and the output driving circuit respectively for serving as resistors, and at least one switch which is independently connected in series with prescribed ones of the elements so that the same can be controlled in a connected or a non-connected state by the control means.

In an output circuit according to the fifth aspect of the present invention, the output driving circuit comprises a first circuit which is connected between the other end of the voltage drop means and the power supply terminal and controlled by the input signal so that its current drivability is monotonically reduced as the level of the output signal outputted from the output terminal is converted from the second logical level to the first logical level while the current drivability is zeroed when the level of the output signal reaches the first logical level, and a second circuit which is connected in parallel with the first circuit and controlled by the input signal so that its current drivability is monotonically reduced at a larger reduction rate than the first circuit as the level of the output signal is converted from the second logical level to the first logical level while the current drivability is zeroed before the level of the output signal reaches the first logical level.

An output circuit according to the sixth aspect of the present invention comprises an input terminal which is supplied with an input signal, an output terminal which outputs an output signal of a first or second logical level, a first power supply terminal which provides a voltage of the first logical level, voltage drop means having an end which is connected to the output terminal, a second power supply terminal which is connected with a power source outputting a voltage of the second logical level, a first output driving circuit which is connected between the first power supply terminal and the other end of the voltage drop means for receiving the input signal as a control signal and providing the output signal of the first logical level to the output terminal in response to the input signal, and a second output driving circuit which is connected between the second power supply terminal and the other end of the voltage drop means for receiving the input signal as a control signal and providing the output signal of the second logical level to the output terminal in response to the input signal. The first output driving circuit has such current drivability that a change rate with respect to unidirectional conversion of the output signal outputted from the output terminal from the second logical level to the first logical level occurring when the output signal is in the vicinity of the second logical level is larger than that with respect to the unidirectional conversion occurring when the output signal is in the vicinity of the first logical level and the current drivability is monotonically reduced with respect to the unidirectional conversion, while the second output driving circuit has such current drivability that a change rate with respect to backward conversion of the output signal outputted from the output terminal from the first logical level to the second logical level occurring when the output signal is in the vicinity of the first logical level is larger than that with respect to the backward conversion occurring when the output signal is in the vicinity of the second logical level and the current drivability is monotonically reduced with respect to the backward conversion.

In an output circuit according to the seventh aspect of the present invention, the voltage drop means includes resistor means which has a variable resistance value.

In an output circuit according to the eighth aspect of the present invention, the first output driving circuit comprises a first circuit which is connected between the other end of the voltage drop means and the power supply terminal and controlled by the input signal so that its current drivability is monotonically reduced along the unidirectional conversion of the level of the output signal outputted from the output terminal while the current drivability is zeroed when the level of the output signal reaches the first logical level, and a second circuit which is connected in parallel with the first circuit and controlled by the input signal so that its current drivability is monotonically reduced at a larger reduction rate than the first circuit along the unidirectional conversion of the level of the output signal while the current drivability is zeroed before the level of the output signal reaches the first logical level. The second output driving circuit comprises a third circuit which is connected between the other end of the voltage drop means and the second power supply terminal and controlled by the input signal so that its current drivability is monotonically reduced along the backward conversion of the level of the output signal outputted from the output terminal while the current drivability is zeroed when the level of the output signal reaches the second logical level, and a fourth circuit which is connected in parallel with the third circuit and controlled by the input signal so that its current drivability is monotonically reduced at a larger reduction rate than the third circuit along the backward conversion of the level of the output signal while the current drivability is zeroed before the level of the output signal reaches the second logical level.

In an output circuit according to the ninth aspect of the present invention, the output driving circuit comprises first switching means which is connected between the other end of the voltage drop means and the power supply terminal and controlled by the input signal for switching, second switching means which is supplied with an output signal from the output terminal through the first switching means and the voltage drop means for switching off when the level of the output signal exceeds a prescribed value, and another voltage drop means which is connected in parallel with the second switching means.

According to the first aspect of the present invention, the output driving circuit has such current drivability that the rate of change with respect to conversion of the output signal outputted from the output terminal from the second logical level to the first logical level occurring when the level of the output signal is close to the second logical level is larger than that with respect to the conversion occurring when the level of the output signal is close to the first logical level, and the current drivability is monotonically reduced with respect to the conversion, whereby the output circuit has high current drivability in the vicinity of the second logical level, to be capable of driving a load at a high speed. The output signal is rapidly converted toward the first logical level. When the output signal approaches the first logical level, the reduction rate of the current drivability of the output driving circuit with respect to the conversion is so reduced that the output driving circuit loosely loses its current drivability. The output signal is also loosely converted to the second logical level. Thus, ringing is hardly caused with no regard to the load which is connected to the output circuit. Further, it is possible to vary the rate of change of the current drivability of the output driving circuit with respect to the conversion by the voltage drop means which is connected between the output driving circuit and the output terminal, while output characteristics can be optimized, whereby it is possible to suppress reflection caused by impedance mismatching or the like.

According to the second aspect of the present invention, the voltage drop means can optimize the output characteristics of the output circuit by varying the resistance value through the resistor means in response to the load which is connected to the output circuit as well as adjust the rate of change of the current drivability with respect to the conversion in response to the load connected to the output circuit or the working state of the output circuit, thereby attaining current drivability which is responsive to the load connected to the output circuit or the working state of the output circuit.

According to the third aspect of the present invention, the voltage drop means can easily vary the resistance value of the resistor means by changing the connection pattern of the element provided on the substrate for serving as a plurality of resistors in response to the load which is connected to the output circuit for optimizing the output characteristics of the output circuit as well as adjust the rate of change of the current drivability with respect to the conversion in response to the load which is connected to the output circuit or the working state of the output circuit, thereby easily attaining current drivability which is suitable for the load connected to the output circuit or the working state of the output circuit.

According to the fourth aspect of the present invention, the resistor means can easily vary the resistance value of the voltage drop means by selecting a connected or non-connected state of the switch by the control means in response to the load which is connected to the output circuit and changing the current path connecting the output terminal and the output driving circuit with each other thereby optimizing output characteristics of the output circuit, as well as adjust the rate of change of the current drivability with respect to the conversion in response to the load which is connected to the output circuit or the working state of the output circuit, thereby easily attaining current drivability which is suitable for the load connected to the output circuit or the working state of the output circuit.

According to the fifth aspect of the present invention, the first and second circuits are connected in parallel with each other, whereby the output driving circuit has current drivability which is equal to the sum of those of the first and second circuits. As to the current drivability of the output driving circuit, therefore, the current drivability of the second circuit greatly contributes to the rate of change with respect to the conversion of the level of the output signal from the second logical level to the first logical level occurring when the level of the output signal is in the vicinity of the second logical level, while the rate of change with respect to the conversion occurring when the level of the output signal is in the vicinity of the first logical level depends on the current drivability of the first circuit. Therefore, the output driving circuit has high current drivability attained by the sum of those of the first and second circuits in the vicinity of the second logical level, so that the same can drive the load at a high speed. The output signal is rapidly changed toward the first logical level. When the output signal approaches the first logical level, the current drivability depends only on that of the first circuit, and is loosely lost. The output signal is also loosely converted to the second logical level. Thus, ringing is hardly caused with respect to an arbitrary load which is connected to the output circuit. Further, the voltage drop means which is connected between the output driving circuit and the output terminal can change the rate of change of the current drivability of the output driving circuit with respect to the conversion as well as minimize the output characteristics, thereby suppressing reflection caused by impedance mismatching or the like.

According to the sixth aspect of the present invention, the first driving circuit has such current drivability that a change rate with respect to unidirectional conversion of the output signal outputted from the output terminal from the second logical level to the first logical level occurring when the output signal is in the vicinity of the second logical level is larger than that with respect to the unidirectional conversion occurring when the output signal is in the vicinity of the first logical level and the current drivability is monotonically reduced with respect to the unidirectional conversion, whereby the same has high current drivability in the vicinity of the second logical level to be capable of driving the load at a high speed. The output signal rapidly changed toward the first logical level. When the output signal approaches the first logical level, the reduction rate of the current drivability is so reduced in the first output driving circuit that its current drivability is loosely lost. The output signal is also loosely converted to the second logical level. Thus, ringing is hardly caused when the output signal is converted from the first logical level to the second logical level, with no regard to the load which is connected to the output circuit.

Similarly, the second output driving circuit has such current drivability that a change rate with respect backward conversion of the output signal outputted from the output terminal from the first logical level to the second logical level occurring when the output signal is in the vicinity of the first logical level is larger than that with respect to the backward conversion occurring when the output signal is in the vicinity of the second logical level and the current drivability is monotonically reduced with respect to the backward conversion, whereby the same has high current drivability in the vicinity of the first logical level, to be capable of driving the load at a high speed. The output signal is rapidly changed toward the second logical level. When the output signal approaches the second logical level, the reduction rate of the current drivability is reduced in the second output driving circuit, whereby the current drivability is loosely lost. The output signal is also loosely converted to the first logical level. Therefore, ringing is hardly caused when the output signal is converted from the second logical level to the first logical level, with no regard to the load which is connected to the output circuit. Namely, it is possible to suppress ringing with respect to both of unidirectional conversion and backward conversion of the output signal.

Further, the voltage drop means which is connected between the first and second output driving circuits and the output terminal can change the rates of change of the current drivability of the first and second output driving circuits with respect to the conversion as well as optimize the output characteristics, thereby suppressing reflection caused by impedance mismatching or the like.

According to the seventh aspect of the present invention, the voltage drop means can optimize the output characteristics of the output circuit by varying the resistance value through the resistor means in response to the load which is connected to the output circuit as well as adjust the rates of change of the current drivability of the first and second circuits with respect to the conversion, thereby providing the output circuit with current drivability which is suitable for the load connected to the output circuit or the working state of the output circuit.

In the output circuit according to the eighth aspect of the present invention, the first output driving circuit has current drivability which is the sum of those of the first and second circuits, since the first and second circuits are connected in parallel with each other. As to the current drivability of the first output driving circuit, therefore, the current drivability of the second circuit greatly contributes to the rate of change with respect to the unidirectional conversion of the level of the output signal from the second logical level to the first logical level occurring when the level of the output signal is in the vicinity of the second logical level, while the rate of change with respect the unidirectional conversion occurring when the level of the output signal is in the vicinity of the first logical level depends on the current drivability of the first circuit. Therefore, the output driving circuit has high current drivability attained by the sum of those of the first and second circuits in the vicinity of the second logical level, to be capable of driving the load at a high speed. The output signal is rapidly changed toward the first logical level. When the output signal approaches the first logical level, the current drivability depends only on that of the first circuit, and is loosely lost. The output signal is also loosely converted to the second logical level. Thus, ringing is hardly caused with respect to an arbitrary load which is connected to the output circuit in the unidirectional conversion of the output signal.

Similarly, the second output driving circuit has current drivability which is the sum of those of the third and fourth circuits, since the third and fourth circuits are connected in parallel with each other. As to the current drivability of the second current driving circuit, therefore, the current drivability of the fourth circuit greatly contributes to the rate of change with respect to the backward conversion of the level of the output signal from the first logical level to the second logical level occurring when the level of the output signal is in the vicinity of the first logical level, while the rate of change with respect the backward conversion occurring when the level of the output signal is in the vicinity of the second logical level depends on the current drivability of the third circuit. Therefore, the second output driving circuit has high current drivability attained by the sum of those of the third and fourth circuits in the vicinity of the second logical level, to be capable of driving the load at a high speed. The output signal is rapidly changed toward the second logical level. When the output signal approaches the second logical level, the current drivability depends only on that of the third circuit, and is loosely lost. The output signal is also loosely converted to the first logical level. Thus, ringing is hardly caused with respect to an arbitrary load which is connected to the output circuit in the backward conversion of the output signal. Namely, it is possible to suppress ringing with respect to the unidirectional conversion and the backward conversion of the output signal by the first and second output driving circuits.

Further, the voltage drop means which is connected between the first and second output driving circuits and the output terminal can change the rates of change of the current drivability of the first and second output driving circuits with respect to the unidirectional conversion and the backward conversion as well as optimize the output characteristics, thereby suppressing reflection caused by impedance mismatching or the like.

In the output circuit according to the ninth aspect of the present invention, the first switching means is switched in response to the input signal, so that an output current flows from the output terminal to the second switching means and the other voltage drop means through the voltage drop means and the first switching means along the output signal. Since the second switching means is connected in parallel with the other voltage drop means, the output current is divided into the second switching means and the other voltage drop means. The second switching means is switched off when the voltage of the output signal supplied through the first switching means exceeds a prescribed level. After the second switching means is switched off, therefore, the output current flows only the other voltage drop means.

Until the output signal reaches the prescribed level, the output signal is driven by current drivability of the circuit defined by the voltage drop means, the second switching means, the other voltage drop means and the first switching means, to be rapidly converted to a level close to the first logical level. When the output signal exceeds the prescribed level, on the other hand, the current is limited by resistance values of the voltage drop means, the first switching means and the other voltage drop means. Consequently, it is possible to reduce the rate of change the current drivability only when the output signal is converted to a level close to the first logical level. Thus, ringing is hardly caused even if a load having a distributed constant is connected to the output circuit, for example.

Further, it is possible to match the resistance values of the voltage drop means and the other voltage drop means with the characteristic impedance of the load which is connected to the output terminal by adjusting the resistance value of the voltage drop means, thereby reducing a reflection coefficient.

As hereinabove described, the output circuit according to the invention of the first aspect comprises the output driving circuit having such current drivability that the rate of change with respect to conversion of the output signal outputted from the output terminal from the second logical level to the first logical level occurring when the level of the output signal is close to the second logical level is larger than that with respect to the conversion occurring when the level of the output signal is close to the first logical level, and the current drivability is monotonically reduced with respect to the conversion. This output driving circuit has high current drivability in the vicinity of the second logical level and the output signal is rapidly changed toward the first logical level while the reduction rate of the current drivability with respect to the conversion is reduced in the output driving circuit when the output signal approaches the first logical level such that the current drivability is loosely lost, whereby the load can be driven at a high speed and ringing is hardly caused with no regard to the load which is connected to the output circuit. Further, the rate of change of the current drivability of the output driving circuit with respect to the conversion can be changed by the voltage drop means which is connected between the output driving circuit and the output terminal so that ringing can be prevented in response to the load connected to the output circuit, while the output characteristics can be optimized. Thus, it is possible to suppress reflection caused by impedance mismatching or the like, thereby preventing generation of undesired radiation.

The voltage drop means of the output circuit according to the invention of the second aspect comprises the resistor means which has a variable resistance value, whereby output characteristics of the output circuit can be optimized while the rate of change of the current drivability with respect to the conversion can be adjusted in response to the load which is connected to the output circuit or the working state of the output circuit to attain current drivability which is suitable for the load connected to the output circuit or the working state of the output circuit. Thus, ringing can be prevented in response to the load which is connected to the output circuit while the output characteristics can be optimized, thereby suppressing reflection caused by impedance mismatching or the like and preventing generation of undesired radiation.

The output circuit according to the invention of the third aspect comprises an element serving as a plurality of resistors whose resistance value can be easily changed by changing the connection pattern of the resistors, such that the ON resistance of the output circuit can be easily changed by changing the connection pattern of the element serving as a plurality of resistors which are formed on the substrate for easily preventing ringing in response to the load which is connected to the output circuit. Further, it is possible to suppress reflection caused by impedance mismatching or the like, thereby easily preventing generation of undesired radiation.

The output circuit according to the invention of the fourth aspect comprises the control means, the plurality of elements interposed in the plurality of current paths connecting the output terminal and the output driving circuit with each other for serving as resistors, and at least one switch which can be controlled in a connected or non-connected state by the control means and is connected in series with prescribed ones of the elements, so that connection and non-connection of each switch is controlled by the control means in response to the load which is connected to the output circuit to change the connection pattern of the resistors thereby easily changing the ON resistance of the output circuit and easily preventing ringing in response to the connected load, for example, while the output characteristics can be optimized. Thus, it is possible to suppress reflection caused by impedance mismatching or the like as well as to easily prevent generation of undesired radiation.

The output circuit according to the invention of fifth aspect comprises the current driving circuit formed by the first circuit which is connected between the other end of the voltage drop means and the power supply terminal and controlled by the input signal so that its current drivability is monotonically reduced as the output signal outputted from the output terminal is converted from the second logical level to the first logical level and the current drivability is zeroed when the level of the output signal reaches the first logical level, and the second circuit which is connected in parallel with the first circuit and controlled by the input signal so that its current drivability is monotonically reduced at a larger reduction rate than the first circuit as the level of the output signal is converted from the second logical level to the first logical level and the current drivability is zeroed before the level of the output signal reaches the first logical level. Thus, the first and second circuits are connected in parallel with each other so that the output driving circuit has current drivability which is equal to the sum of those of the first and second circuits. Therefore, the output driving circuit has high current drivability which is equal to those of the first and second circuits in the vicinity of the second logical level so that the load can be driven at a high speed. When the output signal approaches the first logical level, the current drivability depends on only that of the first circuit to prevent excess reduction of the ON resistance, thereby suppressing ringing. Further, ringing can be easily prevented by changing the ON resistance of the output circuit by the voltage drop means in response to the load which is connected to the output circuit, for example, while the output characteristics can be optimized, thereby suppressing reflection caused by impedance mismatching or the like and easily preventing generation of undesired radiation.

The output circuit according to the invention of the sixth aspect comprises the voltage drop means having an end which is connected to the output terminal, the first output driving circuit which is connected between the first power supply terminal and the other end of the voltage drop means and supplied with the input signal as a control signal for providing the output signal of the first logical level to the output terminal in response to the input signal, and the second output driving circuit which is connected between the other end of the voltage drop means and the second power supply terminal having the second logical level and supplied with the input signal as a control signal for providing the output signal of the second logical level to the output terminal in response to the input signal. The first output driving circuit has such current drivability that a change rate with respect to unidirectional conversion of the output signal outputted from the output terminal from the second logical level to the first logical level occurring when the output signal is in the vicinity of the second logical level is larger than that with respect to the unidirectional conversion occurring when the output signal is in the vicinity of the first logical level and the current drivability is monotonically reduced with respect to the unidirectional conversion, while the second output driving circuit has such current drivability that a change rate with respect to backward conversion of the output signal outputted from the output terminal from the first logical level to the second logical level occurring when the output signal is in the vicinity of the first logical level is larger than that with respect to the backward conversion occurring when the output signal is in the vicinity of the second logical level and the current drivability is monotonically reduced with respect to the backward conversion, whereby high current drivability is attained in the vicinity of the second logical level so that the load can be driven at a high speed while the reduction rate of the current drivability is reduced in the first output driving circuit when the output signal approaches the first logical level, so that ringing is hardly caused when the output signal is converted from the first logical level to the second logical level. Further, high current drivability is attained in the vicinity of the first logical level so that the load can be driven at a high speed while the reduction rate of the current drivability is reduced in the second output driving circuit when the output signal approaches the second logical level, whereby ringing is hardly caused. Namely, the speed of the operation can be increased with respect to the unidirectional conversion and the backward conversion of the output signal so that ringing is hardly caused, while it is possible to easily prevent ringing with respect to the unidirectional conversion and the backward conversion of the output signal in response to the connected load by changing the ON resistance of the output circuit in response to the load connected to the output circuit, for example, while the output characteristics can be optimized, whereby it is possible to suppress reflection caused by impedance mismatching or the like as well as easily prevent generation of undesired radiation.

The output circuit according to the invention of the seventh aspect comprises the resistor means whose resistance value can be varied, whereby it is possible to optimize the output characteristics of the output circuit and adjust the rates of change of the current drivability of the first and second output driving circuits with respect to the conversion in response to the load which is connected to the output circuit or the working state of the output circuit attain current drivability which is suitable for the load connected to the output circuit or the working state of the output circuit. Thus, it is possible to prevent ringing with respect to the unidirectional conversion and the backward conversion of the output signal in response to the connected load while the output characteristics can be optimized, whereby it is possible to suppress reflection caused by impedance mismatching or the like as well as to prevent generation of undesired radiation.

In the output circuit according to the invention of the eighth aspect, the first output driving circuit comprises the first circuit which is connected between the other end of the voltage drop means and the power supply terminal and controlled by the input signal so that its current drivability is monotonically reduced along unidirectional conversion of the level of the output signal outputted from the output terminal and the current drivability is zeroed when the output signal reaches the first logical level, and the second circuit which is connected in parallel with the first circuit and controlled by the input signal so that its current drivability is monotonically reduced at a larger reduction rate than the first circuit along the unidirectional conversion of the level of the output signal and the current drivability is zeroed before the output signal reaches the first logical level. The second output driving circuit comprises the third circuit which is connected between the voltage drop means and the second power supply terminal and controlled by the input signal so that its current drivability is monotonically reduced along the backward conversion of the level of the output circuit outputted from the output terminal and the current drivability is zeroed when the level of the output signal reaches the second logical level, and the fourth circuit which is connected in parallel with the third circuit and controlled by the input signal so that its current drivability is monotonically reduced at a larger reduction rate than the third circuit along the backward conversion of the level of the output signal and the current drivability is zeroed before the level of the output signal reaches the second logical level. The first and second circuits are connected in parallel with each other so that the first output driving circuit has current drivability which is equal to the sum of those of the first and second circuits. Thus, the first output driving circuit has high current drivability which is equal to those of the first and second circuits in the vicinity of the second logical level with respect to the unidirectional conversion of the output signal from the second logical level to the first logical level, while its current drivability depends only on that of the first circuit when the output signal approaches the first logical level. Thus, it is possible to prevent excess reduction of the ON resistance, drive the load at a high speed, and reduce ringing.

Similarly, the third and fourth circuits are connected in parallel with each other so that the second output driving circuit has current drivability which is equal to the sum of those of the third and fourth circuits. Thus, the second output driving circuit has high current drivability which is equal to the sum of those of the third and fourth circuits in the vicinity of the first logical level in the backward conversion of the level of the output signal from the first logical level to the second logical level, while its current drivability depends only on that of the third circuit when the output signal approaches the second logical level. Thus, it is possible to prevent excess reduction of the ON resistance and the load can driven at a high speed, so that ringing is hardly caused. Namely, ringing is hardly caused with respect to the unidirectional conversion and the backward conversion of the output signal due to the first and second output driving circuits, while the rates of change of the current drivability of the first and second output driving circuits with respect to the unidirectional conversion and the backward conversion can be changed by the voltage drop means which is connected between the first and second output driving circuits and the output terminal, whereby ringing can be prevented with respect to the unidirectional conversion and the backward conversion of the level of the output signal in response to the connected load, while the output characteristics can be optimized. Thus, it is possible to suppress reflection caused by impedance mismatching or the like, as well as to prevent generation of undesired radiation.

In the output circuit according to the invention of the ninth aspect, the output driving circuit comprises the first switching means which is connected between the other end of the voltage drop means and the power supply terminal and controlled by the input signal for switching, the second switching means which is supplied with the output signal from the output terminal through the first switching means and the voltage drop means for switching off when the level of the output signal exceeds a prescribed value, and the other voltage drop means having a desired resistance value and connected in parallel with the second switching means. Until the output signal reaches the prescribed level, therefore, the output signal is driven in accordance with the current drivability of the circuit formed by the voltage drop means, the second switching means, the other voltage drop means and the first switching means. When the output signal exceeds the prescribed level, the current is limited by the resistance values of the voltage drop means, the first switching means and the other voltage drop means to prevent excess reduction of the ON resistance, whereby the load can be driven at a high speed and ringing is hardly caused. Further, it is possible to prevent ringing in response to the connected load, for example, by adjusting the ON resistance of the output circuit by the voltage drop means, while matching with the characteristic impedance of the load connected to the output circuit can be attained, whereby it is possible to reduce the reflection coefficient for preventing undesired radiation.

Accordingly, it is an object of the present invention to provide an output circuit which can drive a large capacitance load at a high speed as well as change its output characteristics in response to the load, substantially with no ringing etc. in its output waveform.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
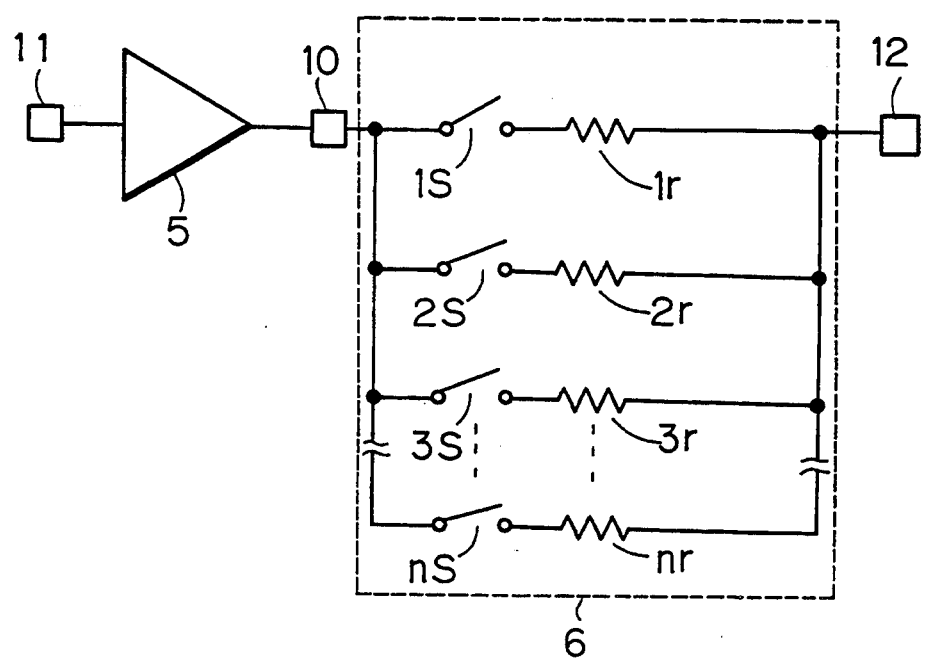
FIG. 1 is a conceptual diagram showing an output circuit according to a first embodiment of the present invention.

The first embodiment of the present invention is now described with reference to FIGS. 1 to 5. FIG. 1 shows an output circuit according to the first embodiment of the present invention. Referring to FIG. 1, an output driving circuit 5 which is formed by connecting a second circuit having high current drivability in parallel with a first circuit having small current drivability, so that the same has high current drivability when the level of an output signal is in a transition state from a high level to a low level or vice versa while the current drivability is loosely reduced when the output signal reaches a high or low level from the transition state thereby preventing abrupt change of current drivability of the output circuit. The output circuit further comprises voltage drop means 6 which can change a resistance value made on a semiconductor integrated circuit including the output driving circuit 5, an output terminal 10 of the output driving circuit 5, an input terminal 11, and an output terminal 12. As shown in FIG. 1, the voltage drop means 6 is formed by resistors 1r to nr and switching means 1S to nS which are connected with the resistors 1r to nr for selecting whether or not resistors 1r to nr are to be connected between the terminals 10 and 12.

Figure 2:
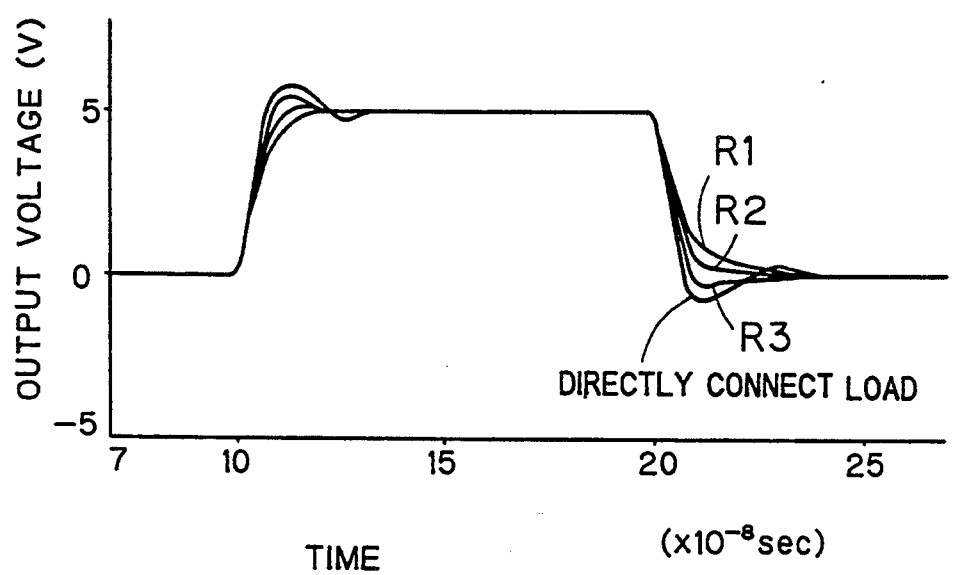
FIG. 2 is an output waveform diagram of the output circuit according to the first embodiment of the present invention.

The operation of the output circuit shown in FIG. 1 is now described with reference to FIG. 2. Consider that the input terminal 11 is converted from a low level to a high level. Since the output driving circuit 5 serves as an inverter, the output terminal 12 is converted from a high level to a low level in response to such change of the input terminal 11. Upon initial change of an input signal received in the input terminal 11, the output circuit has high current drivability when the output terminal 12 has a high voltage, i.e., at a starting point of change, while the current drivability is reduced as the output voltage of the output terminal 12 is reduced to approach a low level (ground potential). Thus, the output driving circuit 5 is so formed that its current drivability is loosely reduced as the output signal approaches a low level. Also when a load is directly connected to the output driving circuit 5 through no connection with the voltage drop means 6, therefore, ringing is not much caused. When the load is directly connected to the output driving circuit 5, however, ringing may be caused depending on the load, as shown in FIG. 2. Such ringing can be suppressed by connecting the voltage drop means 6. For example, it is assumed that R1, R2 and R3 represent resistance values of the resistors 1r, 2r and 3r respectively in relations R1>R2>R3. When only the resistor 1r having the high resistance value is connected between the terminals 10 and 12, the waveform of the output signal is remarkably rounded on its leading and trailing edges although no ringing is caused. When only the resistor 2r is connected, on the other hand, no ringing is caused and the waveform is not much rounded, as understood from FIG. 2. When the resistor 3 having the small resistance value is connected, small overshooting and undershooting are caused on the leading and trailing edges of the output signal. As shown in FIG. 2, the voltage drop means 6 is adapted to optimize the output waveform by preventing excess reduction of ON resistance $R_{ON}$ of the output circuit and setting damping resistance in response to the load, thereby suppressing generation of ringing etc. Also when the input terminal 11 is converted from a high level to a low level, a similar operation is performed except for that the polarity of the current is inverted.

Figure 3:
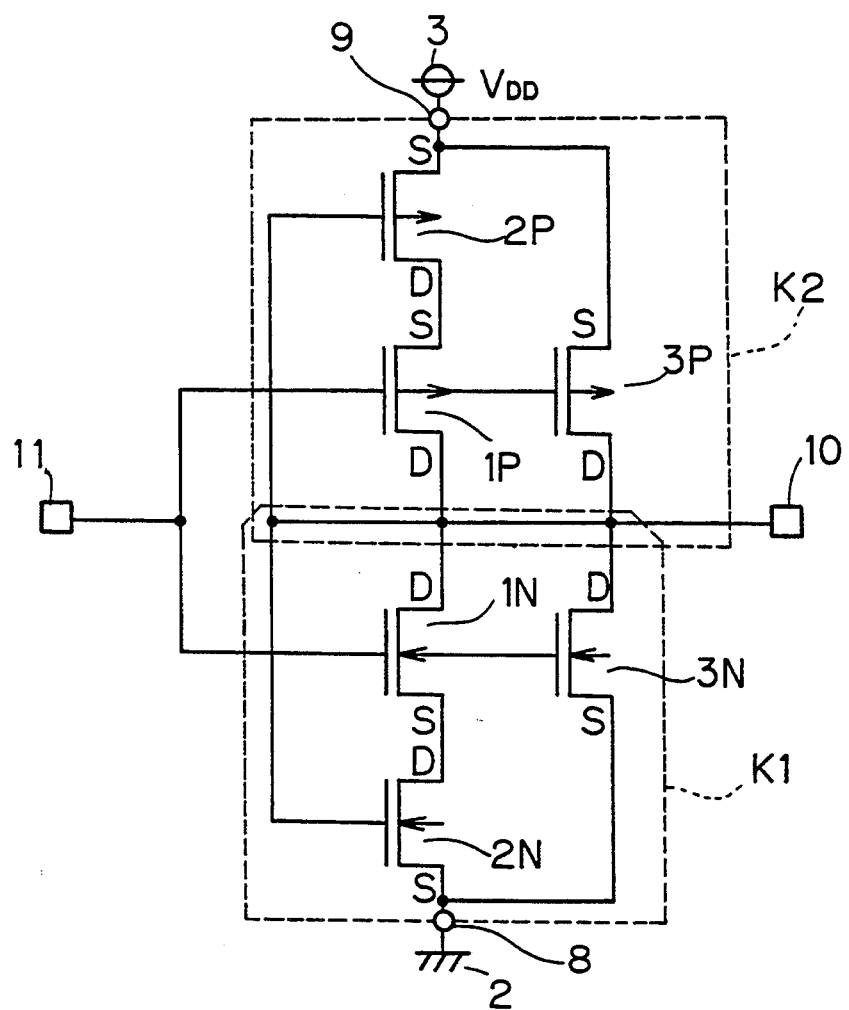
FIG. 3 is a circuit diagram of an output driving circuit in the first embodiment.
Figure 4:
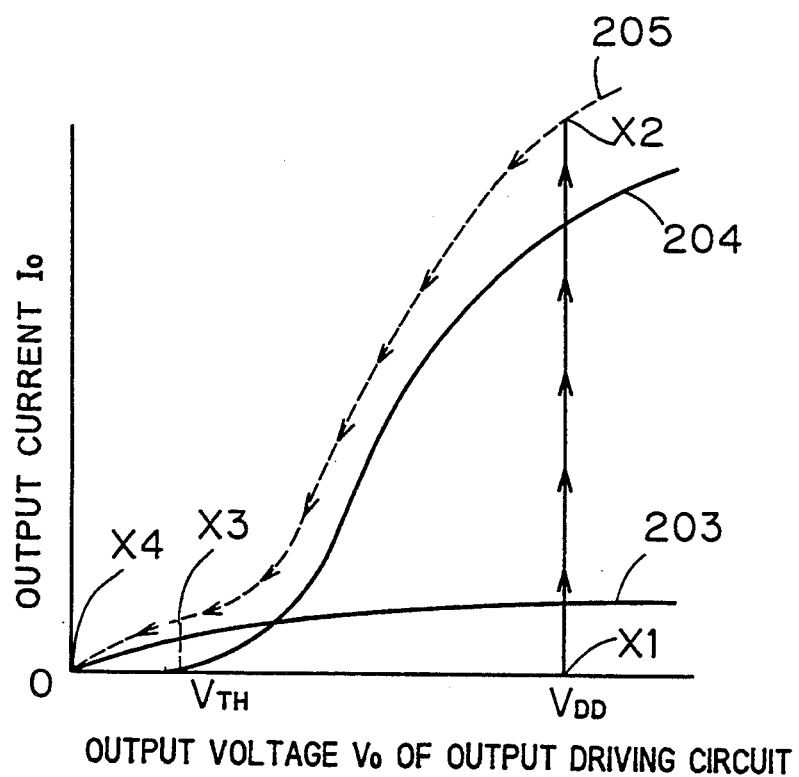
FIG. 4 illustrates output characteristics of the output driving circuit shown in FIG. 3, outputting a low-level signal.

FIG. 3 is a circuit diagram of the output driving circuit 5 shown in FIG. 1. FIG. 4 is an output characteristic diagram of the output driving circuit 5 shown in FIG. 1. The output driving circuit shown in FIG. 3 is formed by an MOS transistor output driving circuit, which comprises a low level output driving circuit K1 connected between the output terminal 10 of the output driving circuit 5 and a power supply terminal 8 set at the ground potential and a high level output driving circuit K2 connected between the output terminal 10 and another power supply terminal 9 supplied with a voltage $V_{DD}$ from a power source 3. The low level output driving circuit K1 is formed by a first N-channel transistor 1N having a gate which is connected to the input terminal 11 and a drain which is connected to the output terminal 10, a second N-channel transistor 2N having a gate which is connected to the output terminal 10, a drain which is connected to a source of the first N-channel transistor 1N, and a source which is connected to the power supply terminal 8, and a third N-channel transistor 3N having a gate which is connected to the input terminal 11, a drain which is connected to the output terminal 10, and a source which is connected to the power supply terminal 8.

The first and second N-channel transistors 1N and 2N form a second circuit of the low level output driving circuit K1, while the third N-channel transistor 3N forms a first circuit which is connected in parallel with the second circuit. As described later with reference to FIG. 4, output voltage/output current characteristics (hereinafter simply referred to as output characteristics) of the first and second circuits are different from each other.

The high level output driving circuit K2 is similarly formed by a first P-channel transistor 1P having a gate which is connected to the input terminal 11 and a drain which is connected to the output terminal 10, a second P-channel transistor 2P having a gate which is connected to the output terminal 10, a drain which is connected to a source of the first P-channel transistor 1P, and a source which is connected to the power supply terminal 9, and a third P-channel transistor 3P having a gate which is connected to the input terminal 11, a drain which is connected to the output terminal 10, and a source which is connected to the power supply terminal 9.

Also in the high level output driving circuit K2, the first and second P-channel transistors 1P and 2P form a second circuit of the high level output driving circuit K2 and the third P-channel transistor 3P forms a first circuit which is connected in parallel with the second circuit. The first and second circuits of the high level output driving circuit K2 also have different output characteristics.

As to the low level output driving circuit K1, the output characteristics of the second circuit formed by series connection of the first and second N-channel transistors 1N and 2N and those of the first circuit formed by the third N-channel transistor 3N are now described with reference to FIG. 4. Referring to FIG. 4, a curve 203 shows the output characteristics of the first circuit which is formed by the third N-channel transistor 3N, with a small ON-state current and considerably high internal resistance. Another curve 204 shows the output characteristics of the second circuit which is formed by the first and second N-channel transistors 1N and 2N, with small ON-state internal resistance and high current drivability. However, since the voltage of the output terminal 10 is applied to the gate of the transistor 2N, the gate-to-source voltage of the transistor 2N drops below a threshold voltage $V_{TH}$ when the output voltage of the output driving circuit K1 approaches 0 V, whereby the current drivability is abruptly reduced. A curve 205 shows the total output characteristics of the low level output driving circuit K1 which is formed by parallel connection of the first and second circuits.

The operations of the respective output driving circuits shown in FIG. 3 are now described in due order.

(1) When the input terminal 11 is at a low level:

The P-channel transistors 1P and 3P are in ON states and the N-channel transistors 1N and 3N are in OFF states, while the output terminal 10 is at a high level. Due to the high level of the output terminal 10, the P-channel transistor 2P is in an OFF state and the N-channel transistor 2N is in an ON state, while both second circuits of the low and high level output driving circuits K1 and K2 are in OFF states and the output terminal 10 is maintained at a high level since the P-channel transistor 3P is in an ON state and the N-channel transistor 3N is in an OFF state as described above.

(2) When the input terminal 11 is converted from a low level to a high level:

The first and third N-channel transistors 1N and 3N immediately enter ON states. At this time, the output terminal 10 is still at a high level and the second N-channel transistor 2N is in an ON state. Thus, the first and second circuits of the low level output driving circuit K1 are in ON states and a current flowing in the low level output driving circuit K1 is abruptly increased from a point X1 to a point X2 on the characteristic curve 205 shown in FIG. 4, to provide high current drivability. When the level of the output terminal 10 is lowered and the gate voltage of the second N-channel transistor 2N drops below the threshold voltage $V_{TH}$, the second N-channel transistor 2N enters an OFF state. Between points X3 and X4, therefore, the ON resistance $R_{ON}$ of the low level output driving circuit K1 determined substantially only by the ON resistance of the first circuit which is formed by the third N-channel transistor 3N, whereby it is possible to prevent excess reduction of the ON resistance $R_{ON}$ of the low level output driving circuit K1 for suppressing generation of ringing on the output voltage waveform of the output terminal 10.

(3) When the input terminal 11 is at a high level:

The N-channel transistors 1N and 3N are in ON states and the P-channel transistors 1P and 3P are in OFF states, while the output terminal 10 is at a low level. Due to the low level of the output terminal 10, the P-channel transistor 2P is in an ON state and the N-channel transistor 2N is in an OFF state. At this time, only the first circuit which is formed by the N-channel transistor 3N of the low level output driving circuit K1 is in an ON state, whereby the output terminal 10 is maintained at a low level.

(4) When the input terminal 11 is converted from a high level to a low level:

Through the same process as the above (2), both the first and second circuits of the high level output driving circuit K2 first enter ON states to drive the load with high current drivability, and finally only the first circuit which is formed by the P-channel transistor 3P enters an ON state while the output terminal 10 is converted to a high level. Also in this case, the ON resistance $R_{ON}$ of the high level output driving circuit K2 is determined by the ON resistance of only the first circuit which is formed by the third P-channel transistor 3P, being in an ON state, in the vicinity of a termination point of the transition period, whereby it is possible to prevent excess reduction of the ON resistance $R_{ON}$ of the high level output driving circuit K2 for suppressing generation of ringing.

Figure 5:
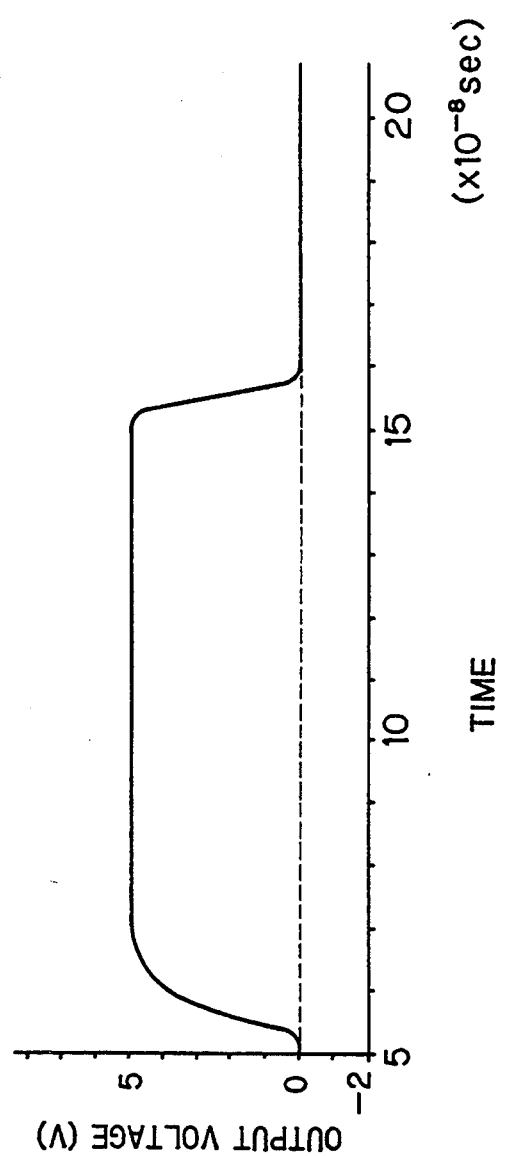
FIG. 5 illustrates change of an output voltage obtained by the output driving circuit shown in FIG. 3.
Figure 56:
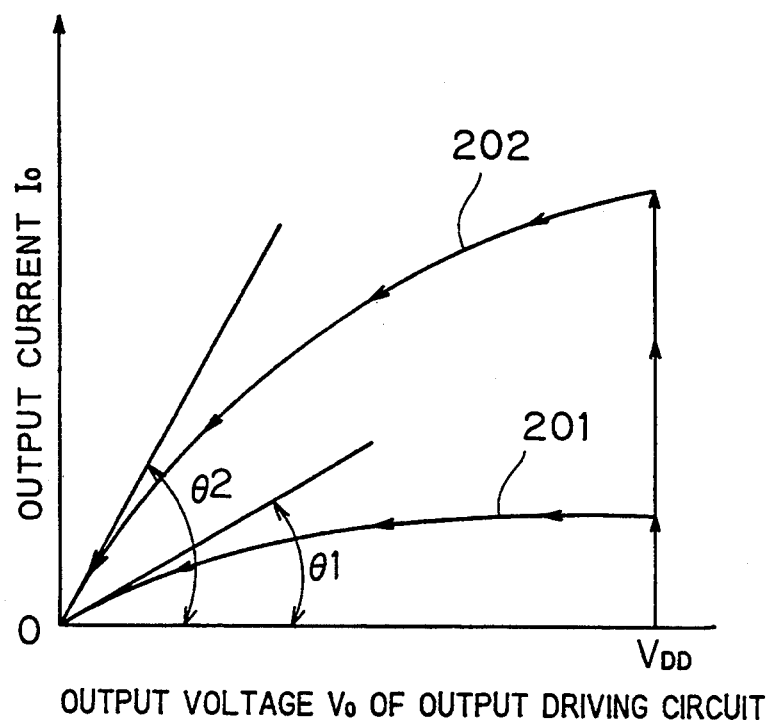
FIG. 56 is an output equivalent circuit diagram of the conventional output circuit.
Figure 57:
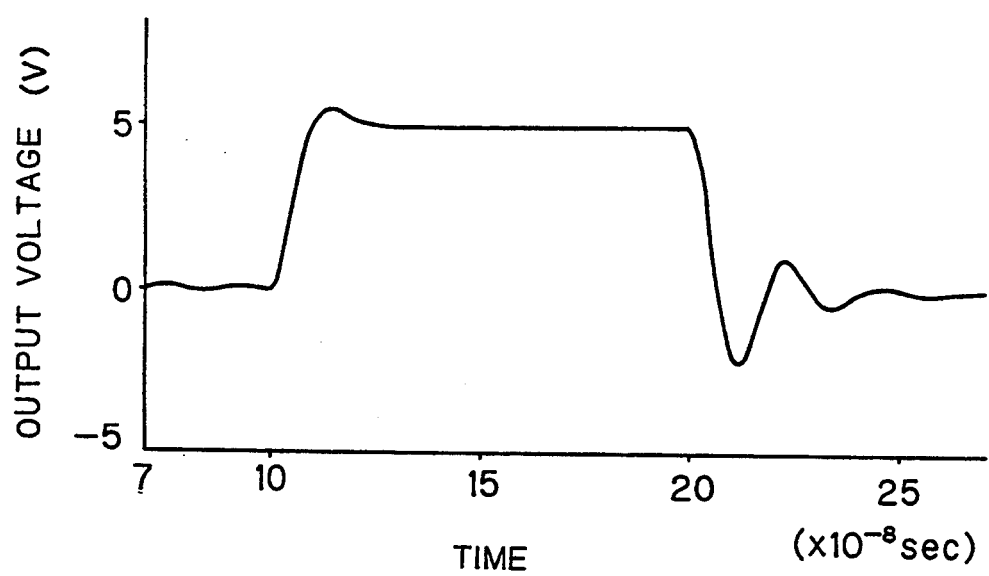
FIG. 57 is an output waveform diagram of the conventional circuit.

FIG. 5 shows a simulated output voltage waveform which appears when a load of the same size as that shown in FIG. 56, having an inductor 310 and a capacitor 320, is connected to the output driving circuits K1 and K2. As clearly understood from FIG. 5, ringing is substantially completely suppressed. When a load is employed while changing inductance and capacitance values L and C, however, ringing may be caused as shown in FIG. 2.

Figure 6:
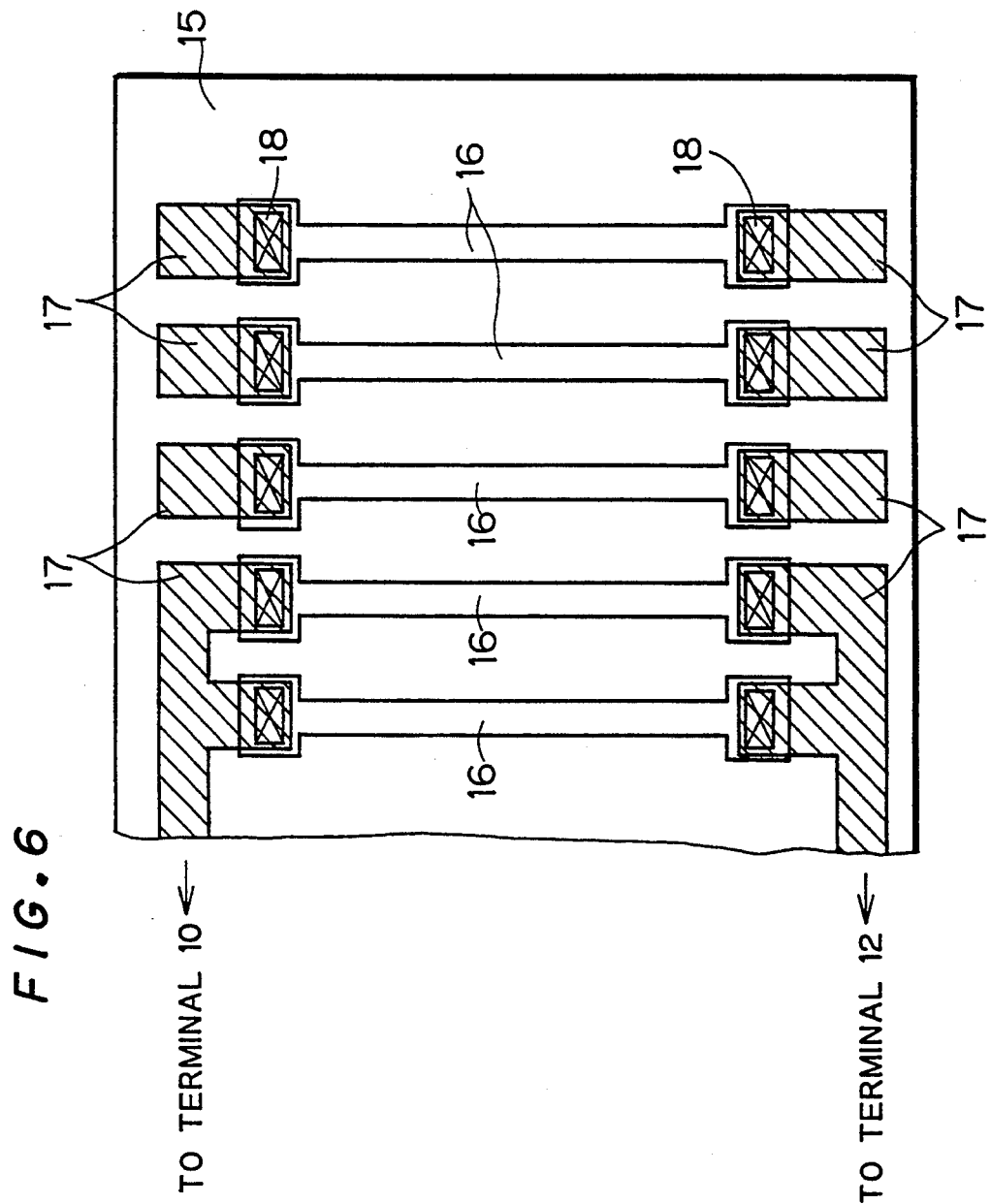
FIG. 6 illustrates voltage drop means in the first embodiment of the present invention.

The structure of the voltage drop means 6 is now described with reference to FIG. 6. Referring to FIG. 6, the voltage drop means comprises a substrate 15, a plurality of diffused resistors 16 which are formed on the substrate 15, aluminum wires 17, and contact holes 18 for connecting the aluminum wires 17 with the diffused resistors 16. The voltage drop means shown in FIG. 6 can set the diffused resistors 16 which are previously formed on a semiconductor integrated circuit at arbitrary resistance values by changing the patterns of the aluminum wires 17 during fabrication steps. Referring to FIG. 6, two of the diffused resistors 16 are connected in parallel with each other and connected to the terminals 10 and 12, to serve as the voltage drop means 6. The resistors are not restricted the diffused resistors but may be prepared from polysilicon resistors, to attain an effect similar to the above. Alternatively, the resistors may be prepared from ON resistors of transistors, to attain a similar effect to the above.

Figure 7:
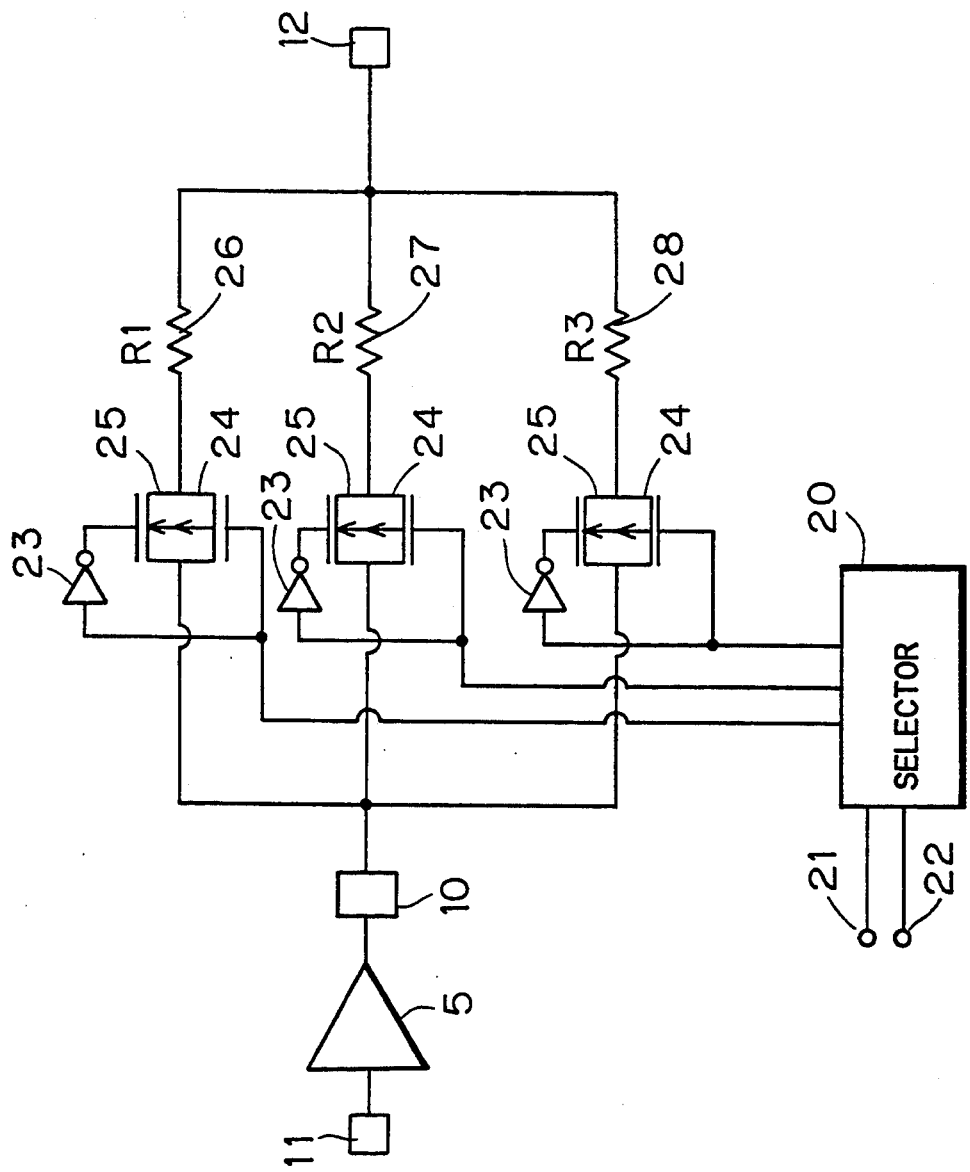
FIG. 7 illustrates an output circuit according to a second embodiment of the present invention.

FIG. 7 shows a second embodiment of the present invention, which is provided with voltage drop means having another structure. The voltage drop means can be formed by switching resistors by a logic circuit and inputting a switching signal from the exterior of a semiconductor integrated circuit which is provided with the output circuit. Referring to FIG. 7, an output selector 20 outputs signals for selecting connection and non-connection of respective resistors by control signals received from control terminals 21 and 22, inverters 23 receive the respective output signals from the selector 20, P-channel MOS transistors 24 have gates which receive the respective output signals from the selector 20 and first electrodes which are connected to a terminal 10, N-channel MOS transistors 25 have gates which receive the output signals from the selector 20 through the inverters 23 and electrodes which are connected to the terminal 10, and resistors 26 to 28 having resistance values R1 to R3 respectively. Each of the resistors 26 to 28 has an end which is connected to an output terminal 12 and another end which is connected to other electrodes of the transistors 24 and 25. The transistors 24 and 25 form a transmission gate. As to the resistance values, it is assumed that R1>R2>R3. When high and low level signals are inputted in the control terminals 21 and 22 of the selector 20 respectively, for example, only the resistor 27 is connected. It is possible to vary the connected resistor by changing the inputted signals, thereby changing the resistance value of the voltage drop means. Although the resistors are formed by diffused resistors in this embodiment, such resistors may alternatively be formed by polysilicon resistors, to attain an effect similar to the above. Alternatively, the transmission gate formed by the transistors 24 and 25 may be provided with ON resistance to serve as a resistance element, and the resistors 26 to 28 may be omitted.

Figure 8:
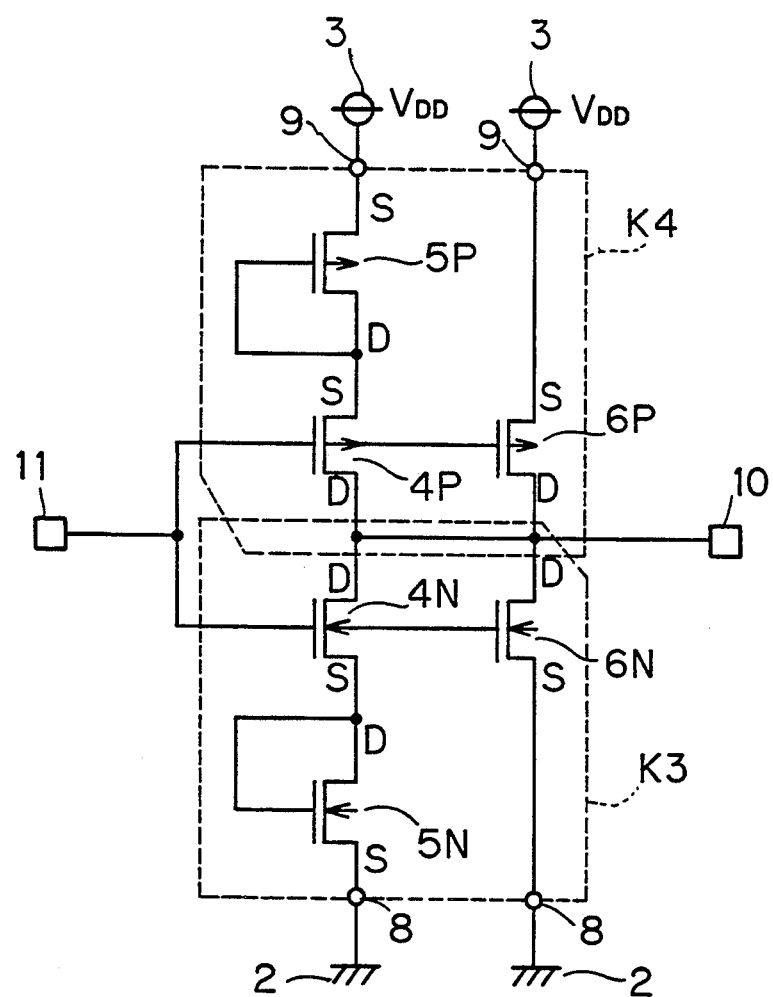
FIG. 8 is a circuit diagram showing a second example of the output driving circuit according to the present invention.

FIG. 8 shows a second example of the output driving circuit, which has a structure different from that described above. Referring to FIG. 8, a MOS transistor output driving circuit comprises a low level output driving circuit K3 which is connected between an output terminal 10 and grounded power supply terminals 8, and a high level output driving circuit K4 which is connected between the output terminal 10 and power supply terminals 9 being set at potentials $V_{DD}$ of power sources 3. The low level output driving circuit K3 is formed by a first N-channel transistor 4N having a gate which is connected to an input terminal 11 and a drain which is connected to the output terminal 10, a second N-channel transistor 5N having a gate and drain which are connected to a source of the first N-channel transistor 4N and a source which is connected to one of the power supply terminals 8, and a third N-channel transistor 6N having a gate which is connected to the input terminal 11, a drain which is connected to the output terminal 10, and a source which is connected to the other power supply terminal 8.

The first and second N-channel transistors 4N and 5N which are connected in series to each other form a second circuit of the low level output driving circuit K3, while the third N-channel transistor 6N forms a first circuit which is connected in parallel with the second circuit. As described later with reference to FIG. 9, output voltage/output current characteristics (hereinafter referred to as output characteristics) of the first and second circuits are different from each other.

The high level output driving circuit K4 is formed by a first P-channel transistor 4P having a gate which is connected to the input terminal 11 and a drain which is connected to the output terminal 10, a second P-channel transistor 5P having a gate and a drain which are connected to a source of the first P-channel transistor 4P and a source which is connected to one of the power supply terminals 9, and a third P-channel transistor 6P having a gate which is connected to the input terminal 11, a drain which is connected to the output terminal 10, and a source which is connected to the other power supply terminal 9.

Also in the high level output driving circuit K4, the first and second P-channel transistors 4P and 5P which are connected in series to each other form a second circuit, while the third P-channel transistor 6P forms a first circuit which is connected in parallel with the second circuit. The first and second circuits of the high level output driving circuit K4 also have different output characteristics.

The positions of the first and second N-channel transistors 4N and 5N and those of the first and second P-channel transistors 4P and 5P may be exchanged, to attain operations absolutely identical to those of the embodiment shown in FIG. 8.

As to the low level output driving circuit K4, the output characteristics of the second circuit which is formed by the series-connected first and second N-channel transistors 4N and 5N and the first circuit which is formed by the third N-channel transistor 6N are now described with reference to FIG. 9.

Figure 9:
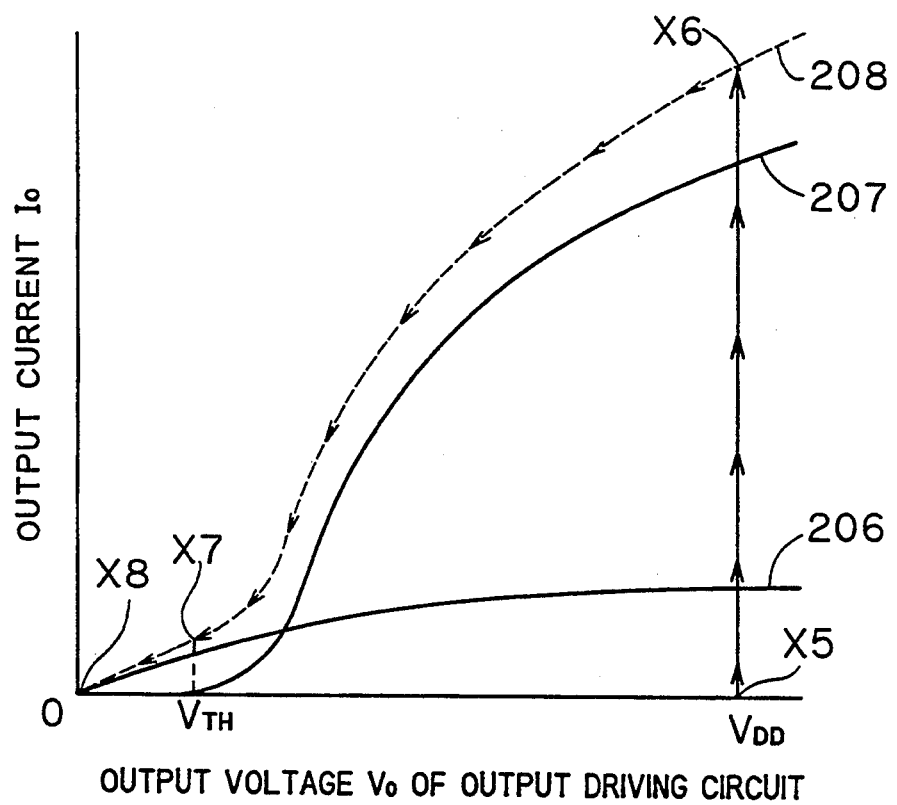
FIG. 9 is a characteristic diagram for illustrating the operation of the driving circuit shown in FIG. 8.

Referring to FIG. 9, a curve 206 shows the output characteristics of the first circuit which is formed by the third N-channel transistor 6N. As understood from the curve 206, the first circuit has a small ON-state current and considerably high internal resistance. On the other hand, the second circuit is formed by the transistors 4N and 5N of higher capacitance as compared with the third N-channel transistor 6N to have high initial current drivability. However, the second circuit includes the second N-channel transistor 5N whose gate and drain are interconnected with each other, whereby the second transistor 5N abruptly enters a cutoff state in the vicinity of a gate-to-source threshold voltage $V_{TH}$, to provide the output characteristics of the second circuit as shown by a curve 207. Therefore, the low level output driving circuit K3 formed by the series-connected first and second circuits has the total output characteristics as shown by a curve 208. Also as to the high level output driving circuit K4, the first and second circuits show output characteristics similar to the curves 206 and 207, and the total output characteristics are similar to the curve 208.

The operations of the output driving circuit shown in FIG. 8 are now described in due order.

(1) When the input terminal 11 is at a low level:

The P-channel transistors 4P and 6P are in ON states and the N-channel transistors 4N and 6N are in OFF states, while the output terminal 10 is at a high level. Due to the high level of the output terminal 10, the P-channel transistor 5P is in an OFF state. Therefore, both second circuits of the low and high level output driving circuits K3 and K4 are in OFF states and the output terminal 10 is maintained at a high level since the P-channel transistor 6P is in an ON state and the N-channel transistor 6N is in an OFF state as described above.

(2) When the input terminal 11 is converted from a low level to a high level:

The first and third N-channel transistors 4N and 6N immediately enter ON states. At this time, the output terminal 10 is still at a high level, and the second N-channel transistor 5N is also in an ON state. In the low level output driving circuit K3, therefore, both the first and second circuits are in ON states so that the current flowing in the low level output driving circuit K3 is abruptly increased from a point X5 to a point X6 on the characteristic curve 208 shown in FIG. 9, to provide high current drivability. When the level of the output terminal 10 is lowered to approach a threshold voltage $V_{TH}$ of the second N-channel transistor 5N, the second N-channel transistor 5N abruptly enters an OFF state so that the low level output driving circuit K3 is defined substantially only by the first circuit which is formed by the third N-channel transistor 6N between points X7 and X8. Thus, resistance $R_{ON}$ of the low level output driving circuit K3 is determined substantially only by the first circuit between the points X7 and X8, whereby it is possible to prevent excess reduction of the ON resistance $R_{ON}$ for suppressing generation of ringing in the output voltage waveform of the output terminal 10.

(3) When the input terminal 11 is at a high level:

The N-channel transistors 4N and 6N are in ON states and the P-channel transistors 4P and 6P are in OFF states, while the output terminal 10 is at a low level. Due to the low level of the output terminal 10, the N-channel transistor 5N is in an OFF state. At this time, only the first circuit which is formed by the N-channel transistor 6N of the low level output driving circuit K3 is in an ON state, whereby the output terminal 10 is maintained at a low level.

(4) When the input terminal 11 is converted from a high level to a low level:

First, both of the first and second circuits of the high level output driving circuit K4 enter ON states through a similar process as the above (2) to drive a load with high current drivability, and finally only the first circuit which is formed by the P-channel transistor 6P enters an ON state and the output terminal 10 is converted to a high level. Also in this case, the ON resistance $R_{ON}$ of the high level output driving circuit K4 is determined by ON resistance of only the first circuit which is formed by the third P-channel transistor 6P, being in an ON state, in the vicinity of a termination point of a transition period similarly to the above, whereby it is possible to prevent excess reduction of the ON resistance $R_{ON}$ of the high level output driving circuit K4 for suppressing generation of ringing.

FIG. 5 shows a simulated output voltage waveform which appears when a load of the same size as that shown in FIG. 56, having an inductor 310 and a capacitor 320, is connected to the output driving circuits K3 and K4. As clearly understood from FIG. 5, ringing is substantially completely suppressed. When a load is employed while changing inductance and capacitance values L and C, however, ringing may be caused as shown in FIG. 2.

Figure 10:
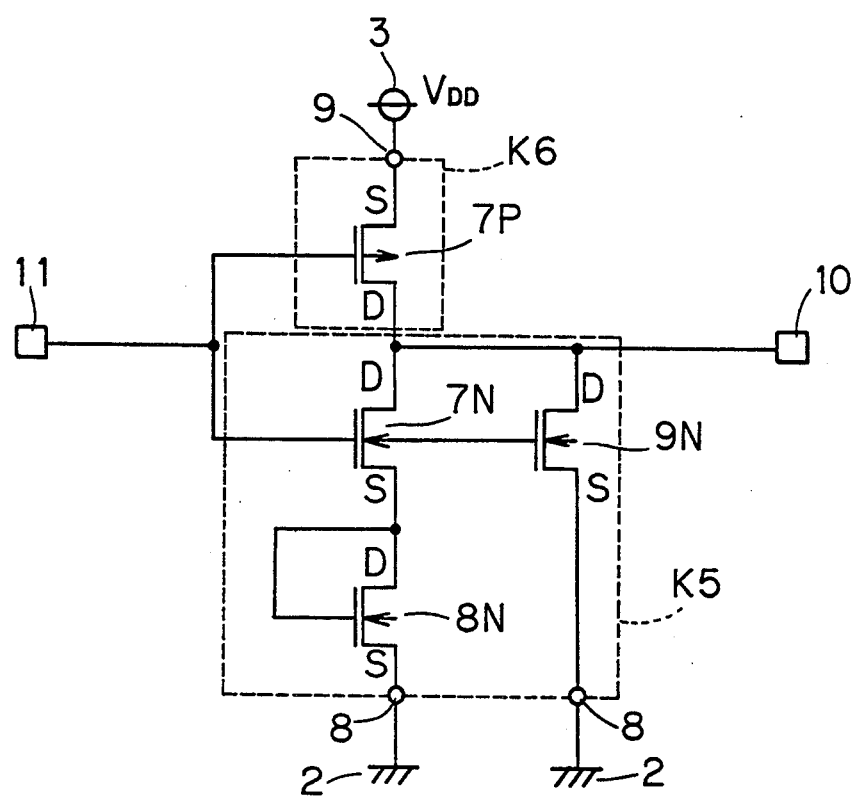
FIG. 10 is a circuit diagram showing a third example of the output driving circuit according to the present invention.

A third example of the output driving circuit according to the present invention is now described with reference to FIG. 10. FIG. 10 is a circuit diagram showing a MOS transistor output driving circuit comprising a low level output driving circuit K5 which is formed by first to third N-channel transistors 7N to 9N similarly to the low level output driving circuit K3 shown in FIG. 8, and a high level output driving circuit K6 which is formed by a single P-channel transistor 7P similarly to the conventional output driving circuit. Also in this embodiment, the positions of the N-channel transistors 7N and 8N may be exchanged.

In a logic circuit, it may be necessary to particularly increase the operating speed only on the leading or trailing edge of its output voltage waveform, or only one of ringing caused on the trailing edge or that generated on the leading edge may cause a problem.

The example shown in FIG. 10 is particularly effective in such a case that an operating speed for converting an output voltage of an output terminal 12 from a low level to a high level is not important and the resulting ringing is not so much problematic while the output voltage must be converted from a high level to a low level at a high operating speed and the resulting ringing must be suppressed.

Depending on application of the MOS transistor output driving circuit, the high level output driving circuit may be formed by the high level output driving circuit K4 which is formed by the first to third P-channel transistors 4P to 6P in the output circuit shown in FIG. 8, and the low level output driving circuit may be formed by a single N-channel transistor similarly to the conventional output driving circuit. Also in this case, positions of transistors corresponding to the P-channel transistors 4P and 5P may be exchanged.

Figure 11:
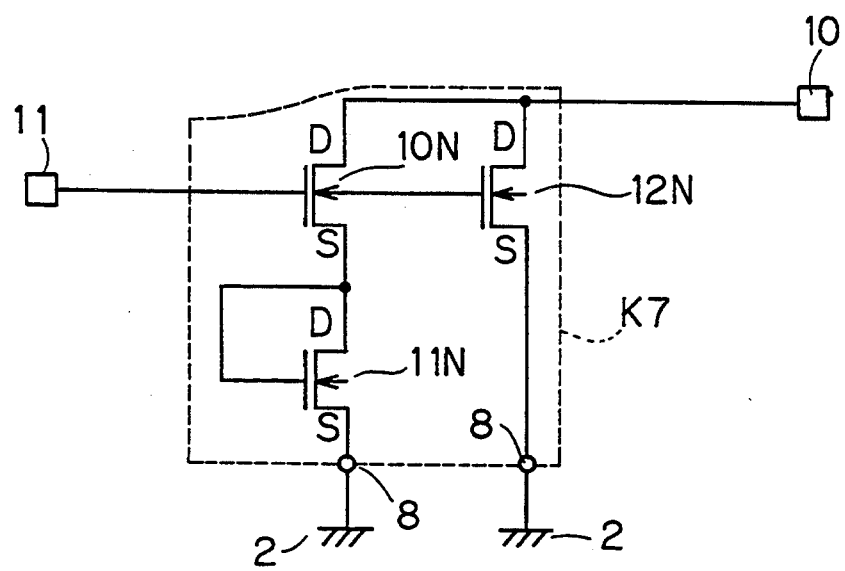
FIG. 11 is a circuit diagram showing a fourth example of the output driving circuit according to the present invention.

FIG. 11 is a circuit diagram showing an open drain type output driving circuit forming a fourth example of the output driving circuit according to the present invention. In this example, a low level output driving circuit K7, which corresponds to the low level output driving circuit K3 formed by the first to third N-channel transistors 4N to 6N in the second example of the output driving circuit shown in FIG. 8, is connected between an output terminal 10 and grounded power supply terminals 8, so that the output terminal 10 is converted to a low level when an input terminal 11 is at a high level and the former enters a high impedance state (floating state) when the latter is at a low level. Also in this example, the output terminal 10 is abruptly driven toward a low level when the input terminal 11 is converted from a low level to a high level, while generation of ringing in the output voltage waveform is suppressed. Also in this example, an effect similar to the above is attained even if transistors 10N and 11N are exchanged, as a matter of course.

Figure 12:
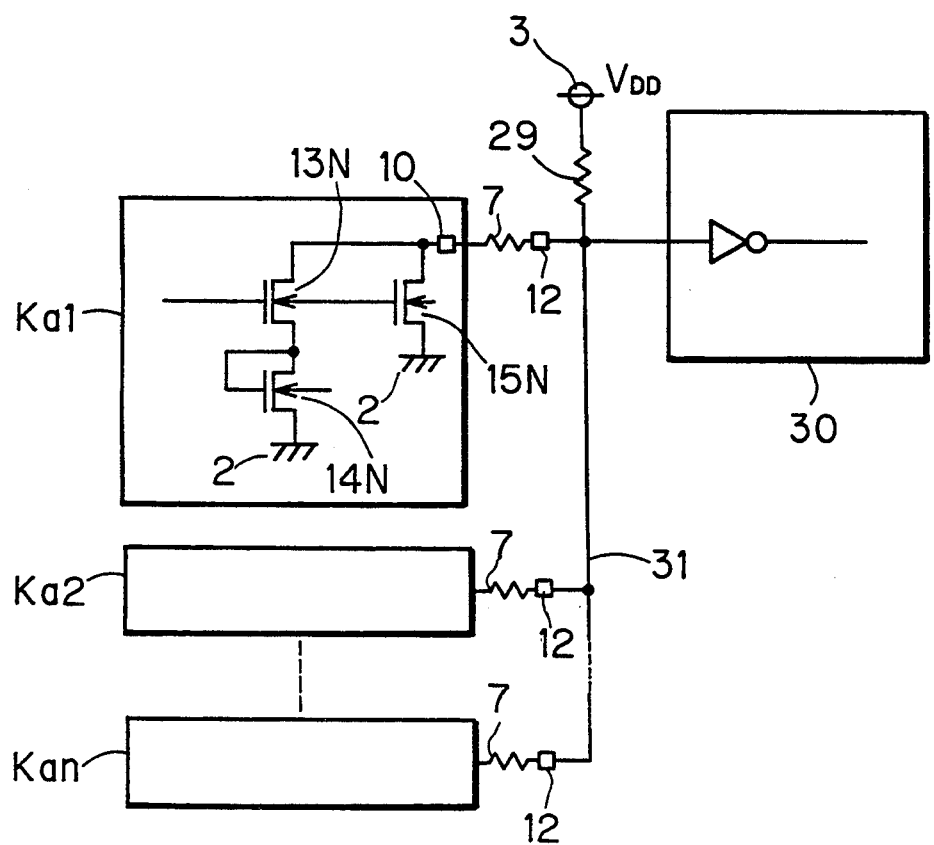
FIG. 12 is a schematic block diagram showing a working mode of an output circuit employing the output driving circuit shown in FIG. 11.

FIG. 12 illustrates working mode of the output driving circuit shown in FIG. 11. Respective output terminals 10 of output driving circuits Ka1, Ka2 ... Kan are connected to output terminals 12 through voltage drop means 7, to be further connected to a load resister 29 well as to a load IC 30, such as a microcomputer, for example, through a bus line 31. An end of the resistor 29 is connected to a power source 3 which outputs a voltage $V_{DD}$. When the output terminal 12 of any output circuit is converted to a low level, a low level signal is supplied to the IC 30. When the output terminals 10 of all output driving circuits Ka1 to Kan are in high impedance states (floating states), the supply voltage $V_{DD}$, i.e., a high level, is supplied to the IC 30 through the resistor 29. The output driving circuits shown in FIGS. 8 and 10 cannot be used in the manner shown in FIG. 12, since both low and high level output voltages are generated from the output terminals 12.

Alternatively, the open drain type output driving circuit can be formed by providing the high level output driving circuit K4 comprising the first to third P-channel transistors 4P to 6P in the output circuit shown in FIG. 8 between the output terminal 10 and the power supply terminal 9 connected to the power source 3 and opening the low level output driving circuit. In this case, the output terminal 10 is converted to a high level when the input terminal 11 is at a low level, while the former enters a high impedance state (floating state) when the latter is at a high level. Also in this example, the first and second P-channel transistor 4P and 5P may be exchanged.

Figure 13:
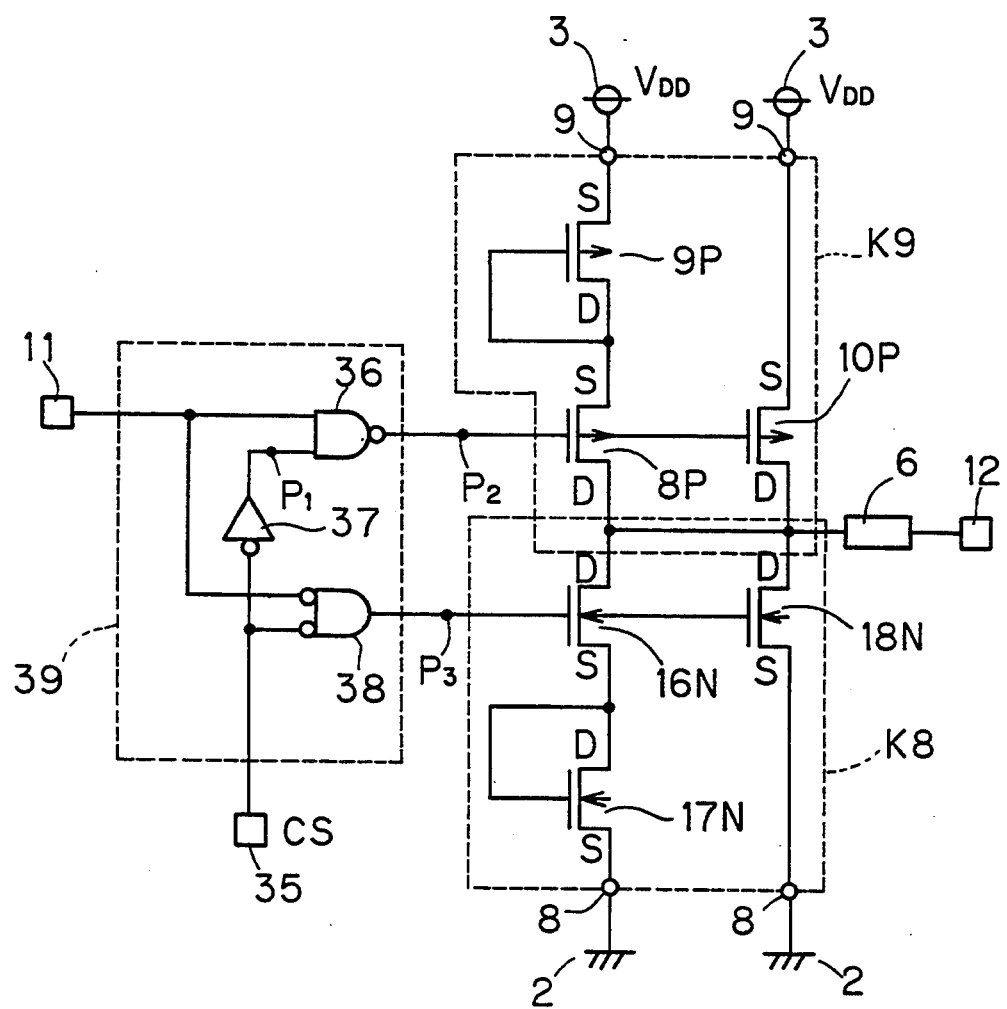
FIG. 13 is a circuit diagram showing a working mode of an output circuit employing the output driving circuit shown in FIG. 8.

FIG. 13 illustrates working mode of the MOS transistor output circuit shown in FIG. 8. A high impedance control logic circuit 39 is provided between low level and high level output driving circuits K8 and K9 and an input terminal 11 for controlling and bringing an output terminal 12 into a high impedance state (floating state) through voltage drop means 6.

As clearly understood from FIG. 13, the high impedance control circuit 39 is formed by an output NOT AND circuit (corresponding to NAND) 36 having a first input which is connected to the input terminal 11 and an output which is connected to a gate of a P-channel transistor 8P, an input NOT AND circuit (corresponding to NOR) 38 having a first input which is connected to the input terminal 11 and an output which is connected to a gate of an N-channel transistor 16N, and an inverter 37 which is connected between a control input terminal 35 and a second input of the AND circuit 36. A second input of the AND circuit 38 is directly connected to the control input terminal 35.

Figure 14:
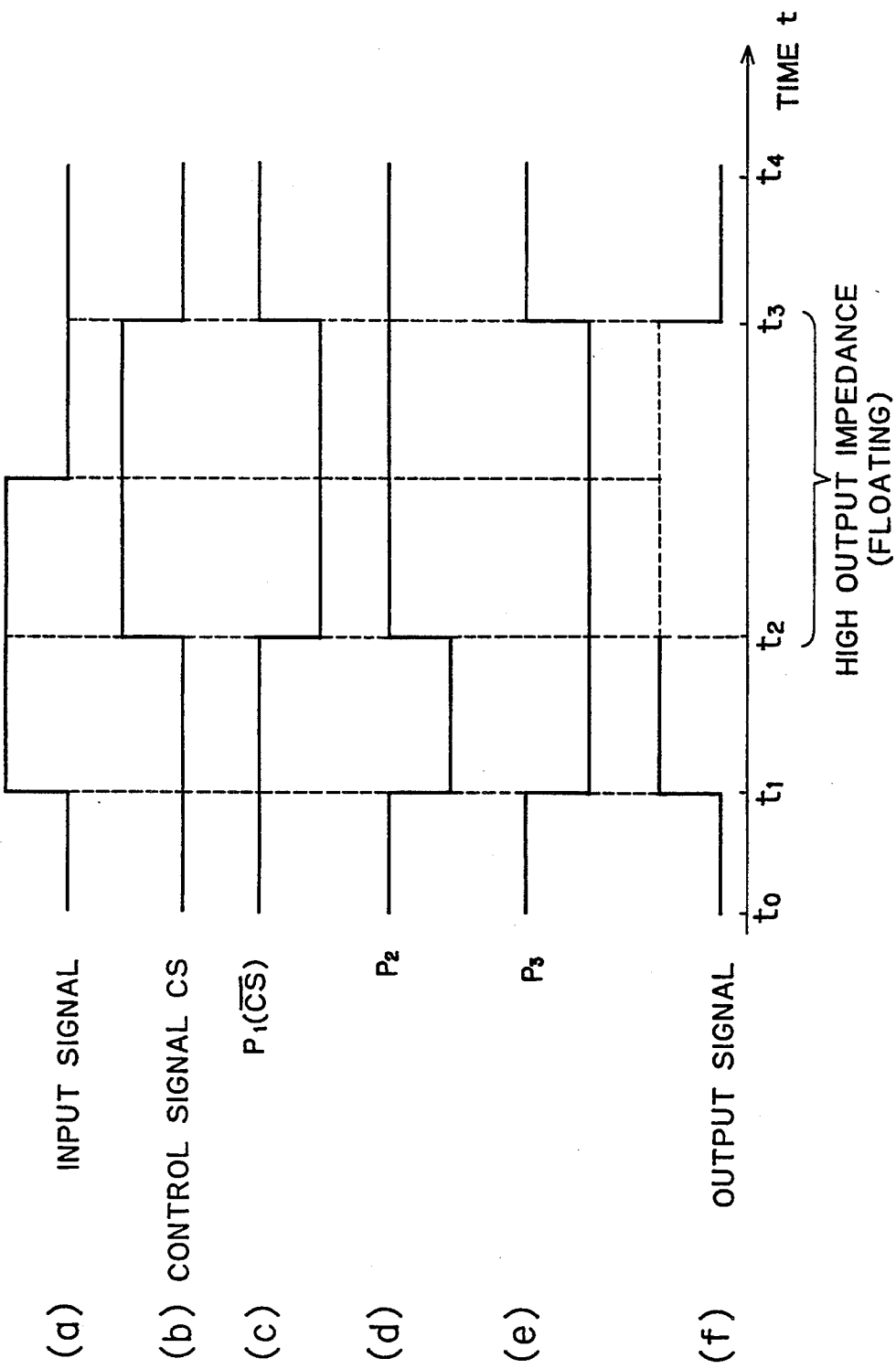
FIG. 14 is a diagram for illustrating the operation of the circuit etc. shown in FIG. 13.

The operations of the MOS transistor output circuit shown in FIG. 13 are now described with reference to FIG. 14 illustrating levels of the respective parts. Referring to FIG. 14, (a) represents the level of the input signal which is supplied to the input terminal 11, and (b) represents a control signal CS which is supplied to the control input terminal 35. (c) represents the level at a point $P_1$, which is $\overline{CS}$. Thus, levels at points $P_2$ and $P_3$ become as shown at (d) and (e). The output terminal 12 goes to a low level during periods $t_0$ to $t_1$ and $t_3$ to $t_4$ when both of the points $P_2$ and $P_3$ are at high levels while the same goes to a high level during a period $t_1$ to $t_2$ when both of the points $P_2$ and $P_3$ are at low levels. On the other hand, the point $P_2$ is at a high level and the point $P_3$ is at a low level during a period $t_2$ to $t_3$ when the control signal CS supplied to the control input terminal 15 is at a high level, whereby both of the low and high level output driving circuits K8 and K9 enter OFF states and the output terminal 12 enters a high impedance state (floating state). Thus, it is possible to control the state of the output terminal 12 by the control signal CS which is supplied to the control input terminal 15.

Also in the MOS transistor output circuit shown in FIG. 13, the output signal is converted from a low level to a high level or vice versa at an extremely high speed in response to change of the input signal, while it is possible to prevent excess reduction of the ON resistance $R_{ON}$ of the output circuit in the vicinity of termination of the change as well as to suppress generation of ringing. Also in this output circuit, the N-channel transistors 16N and 17N as well as the P-channel transistors 8P and 9P can be exchanged.

Figure 15:
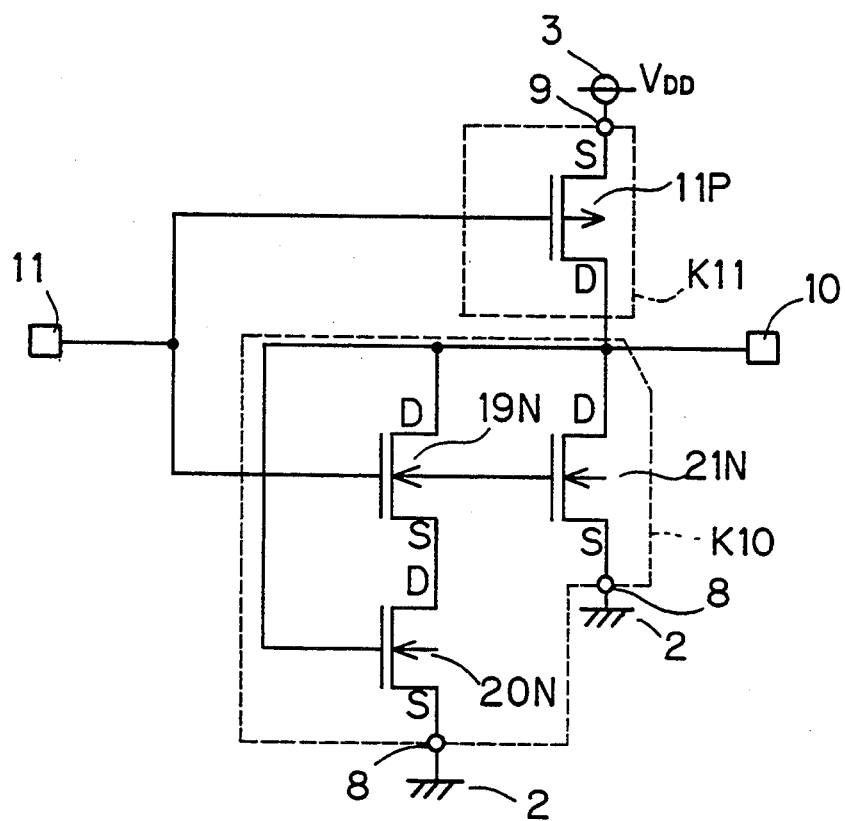
FIG. 15 is a circuit diagram showing a fifth example of the output driving circuit according to the present invention.

FIG. 15 is a circuit diagram showing a MOS transistor output driving circuit forming a fifth example of the output driving circuit according to the present invention. A low level output driving circuit K10 is formed by first to third N-channel transistors 19N to 21N which are similar to those of the low level output driving circuit K1 provided in the first embodiment of the present invention as shown in FIG. 3, and a high level output driving circuit K11 is formed by a single P-channel transistor 11P which is similar to the conventional output driving circuit.

In a logic circuit, it may be necessary to particularly increase the operating speed only on the leading or trailing edge of its output voltage waveform, or only one of ringing caused on the trailing edge or that generated on the leading edge may cause a problem.

The fifth example of the output driving circuit shown in FIG. 15 is particularly effective in such a case that an operating speed for converting an output voltage of an output terminal from a low level to a high level is not important and the resulting ringing is not so much problematic while the output voltage must be converted from a high level to a low level at a high operating speed and the resulting ringing must be suppressed.

Depending on application of the MOS transistor output driving circuit, the high level output driving circuit may be formed by the high level output driving circuit K2 which is formed by the first to third P-channel transistors 1P to 3P in the output circuit shown in FIG. 3, and the low level output driving circuit may be formed by a single N-channel transistor similarly to the conventional output driving circuit.

Figure 16:
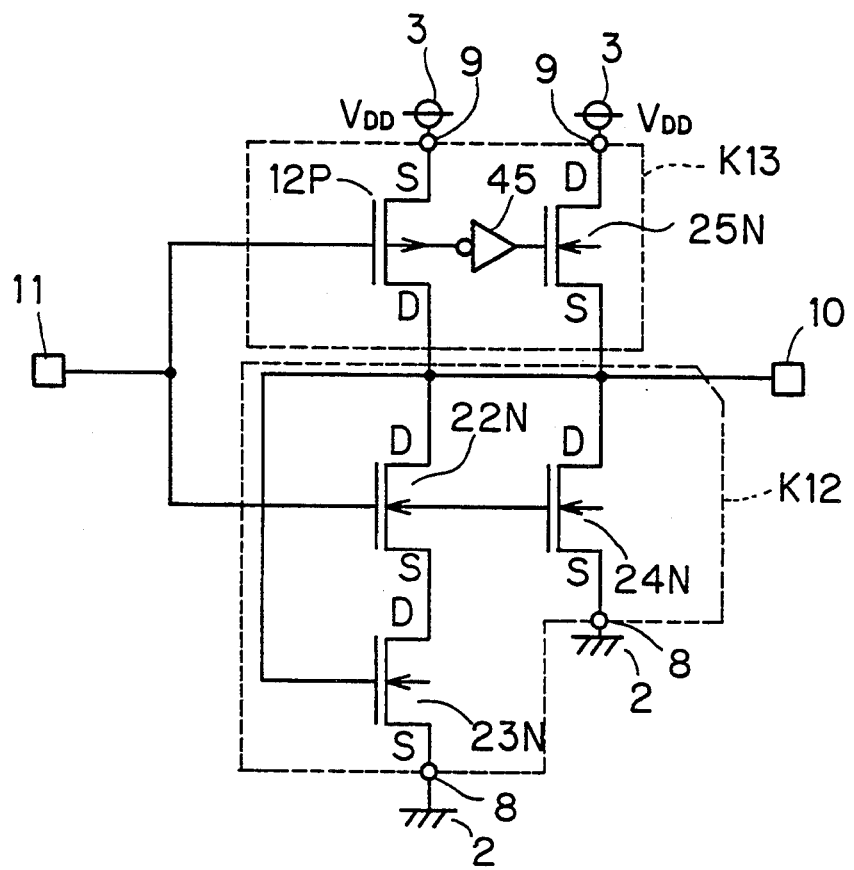
FIG. 16 is a circuit diagram showing a sixth example of the output driving circuit according to the present invention.

FIG. 16 is a circuit diagram showing a MOS transistor output driving circuit forming a sixth example of the output driving circuit according to the present invention. A low level output driving circuit K12 is formed by a circuit which is similar to the low level output driving circuit K1 formed by the three N-channel transistors 1N to 3N in the first embodiment of the present invention as shown in FIG. 3, while a high level output driving circuit K13 is formed by a P-channel transistor 12P having a source which is connected to a power supply terminal 9 being supplied with a voltage $V_{DD}$, a drain which is connected to an output terminal 10, and a gate which is connected to an input terminal 11, an inverter 45 having an input which connected to the input terminal 11, and an N-channel transistor 25 having a source which is connected to the output terminal 10, a drain which is connected to another power supply terminal 9, and a gate which is connected to an output of the inverter 45.

The operation of the low level output driving circuit K13 shown in FIG. 16 is similar to that of the output circuit shown in FIG. 3. When the level of the input terminal 11 is converted from a high level to a low level, N-channel transistors 22N and 24N enter OFF states and the P-channel transistor 12P enters an ON state. The inverter 45 applies a high level to the gate of the N-channel transistor 25N, whereby the N-channel transistor 25N also enters an ON state. Thus, the output terminal 10 goes to a high level.

Figure 17:
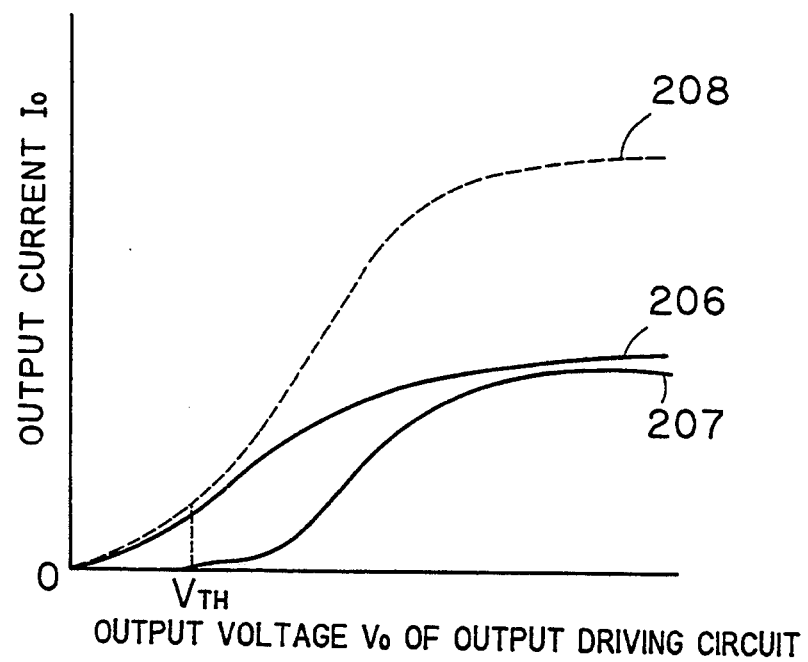
FIG. 17 is a characteristic diagram for illustrating the operation of the output driving circuit shown in FIG. 16.

In this case, the N-channel transistor 25N operates as a source follower with output voltage/output current characteristics shown by a curve 207 in FIG. 17, to enter a cutoff state in the vicinity of a gate threshold voltage $V_{TH}$. On the other hand, the P-channel transistor 12P loses current drivability when the voltage of the output terminal 10 reaches 0 V, with output voltage/output current characteristics shown by a curve 206. Thus, the high level output driving circuit K13 has total output voltage/output current characteristics as shown by a dotted curve 208. As clearly understood from the characteristic curve 208, the high level output driving circuit K13 can attain abrupt driving and ringing suppressing actions, similarly to the low level output driving circuit K12.

Figure 18:
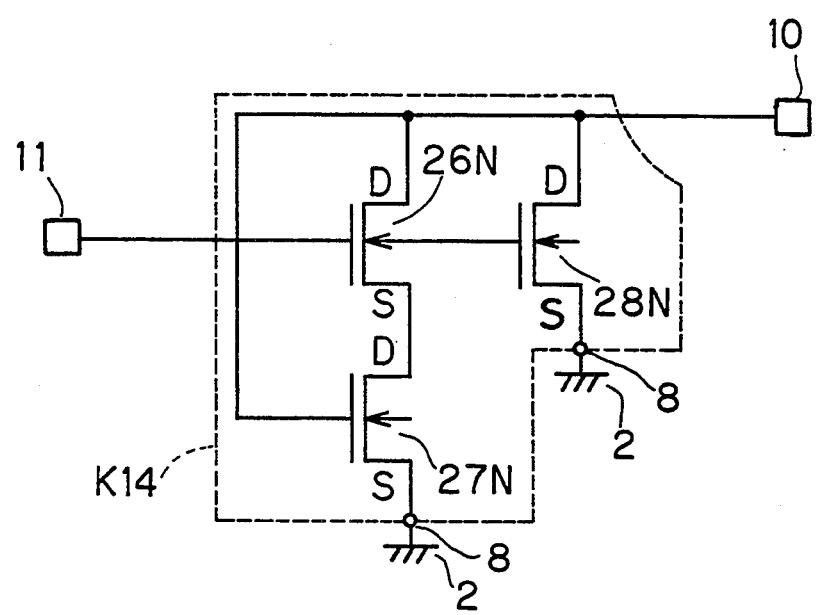
FIG. 18 is a circuit diagram showing a seventh example of the output driving circuit according to the present invention.

FIG. 18 is a circuit diagram showing a MOS transistor output driving circuit forming a seventh example of the output driving circuit according to the present invention. The output driving circuit shown in FIG. 18 is formed by the so-called open drain type output driving circuit. In this example, a low level output driving circuit K14, which is similar to the low level output driving circuit K1 of the first embodiment shown in FIG. 3 formed by the first to third N-channel transistors 1N to 3N, is connected between an output terminal 10 and grounded power supply terminals 8, so that the output terminal 10 goes to a low level when an input terminal 11 is at a high level and the former enters a high impedance state (floating state) when the latter is at a low level. Also in this example, the output terminal 10 is abruptly driven toward a low level when the input terminal 11 is converted from a low level to a high level, while it is possible to suppress generation of ringing in the output voltage waveform.

Figure 19:
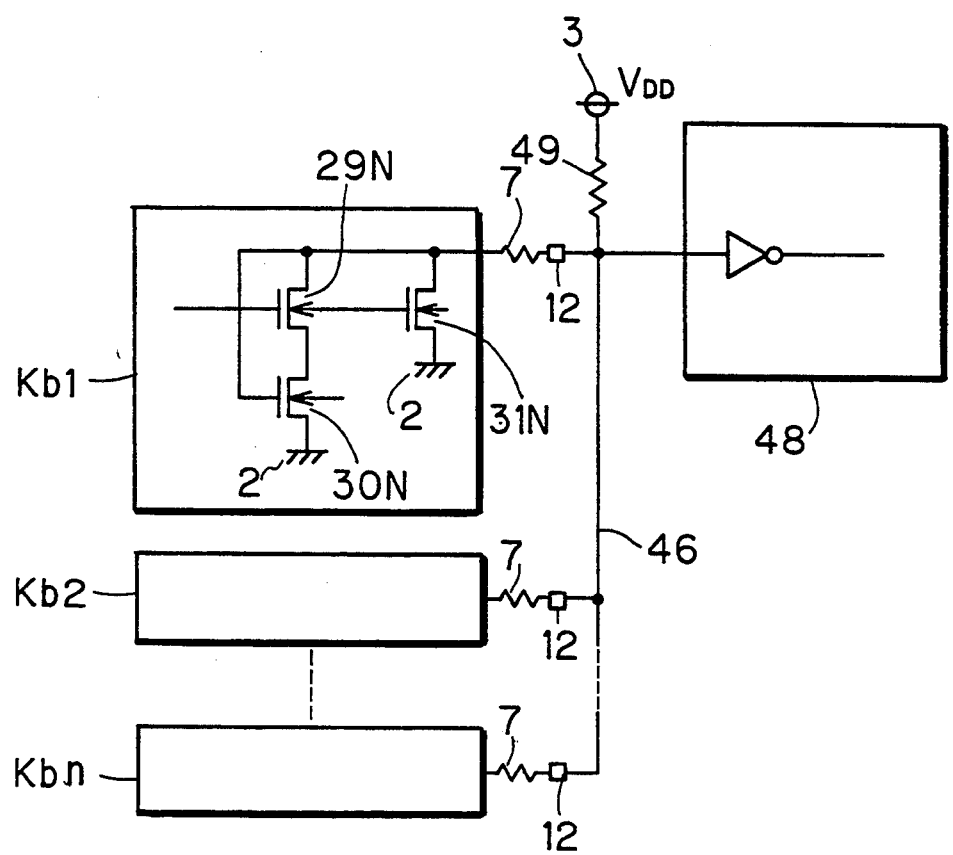
FIG. 19 is a schematic block diagram showing a working mode of an output circuit employing the output driving circuit shown in FIG. 18.

FIG. 19 illustrates exemplary application of an output circuit including a plurality of the output driving circuits shown in FIG. 18. Respective output terminals 10 of output driving circuits Kb1, Kb2, ..., Kbn are connected to output terminals 12 through voltage drop means 7, to be further connected to a load resistor 49 as well as to a load IC 48, such as a microcomputer, for example, through a bus line 46. An end of the resistor 49 is connected to a power source 3 which outputs a potential $V_{DD}$. In this circuit, a low level is supplied to the IC 48 when the output terminal 12 of any one of the output driving circuits goes to a low level, while the source potential $V_{DD}$, i.e., a high level, is supplied to the IC 48 through the resistor 49 when the output terminals 12 of all output driving circuits Kb1 to Kbn are in high impedance states (floating states). The output driving circuits shown in FIGS. 3, 15 and 16 cannot be employed in the manner shown in FIG. 19 since either low or high level output voltages are generated at the output terminals 10.

As to an open drain type output driving circuit, it is also possible to provide the high level output driving circuit K2 formed by the first to third P-channel transistors 1P to 3P in the output circuit shown in FIG. 3 between an output terminal and a power supply terminal which is connected to a power source while opening a low level output driving circuit, as a matter of course. In this case, the output terminal goes to a high level when an input terminal is at a low level, while the former enters a high impedance state (floating state) when the latter is at a high level.

Figure 20:
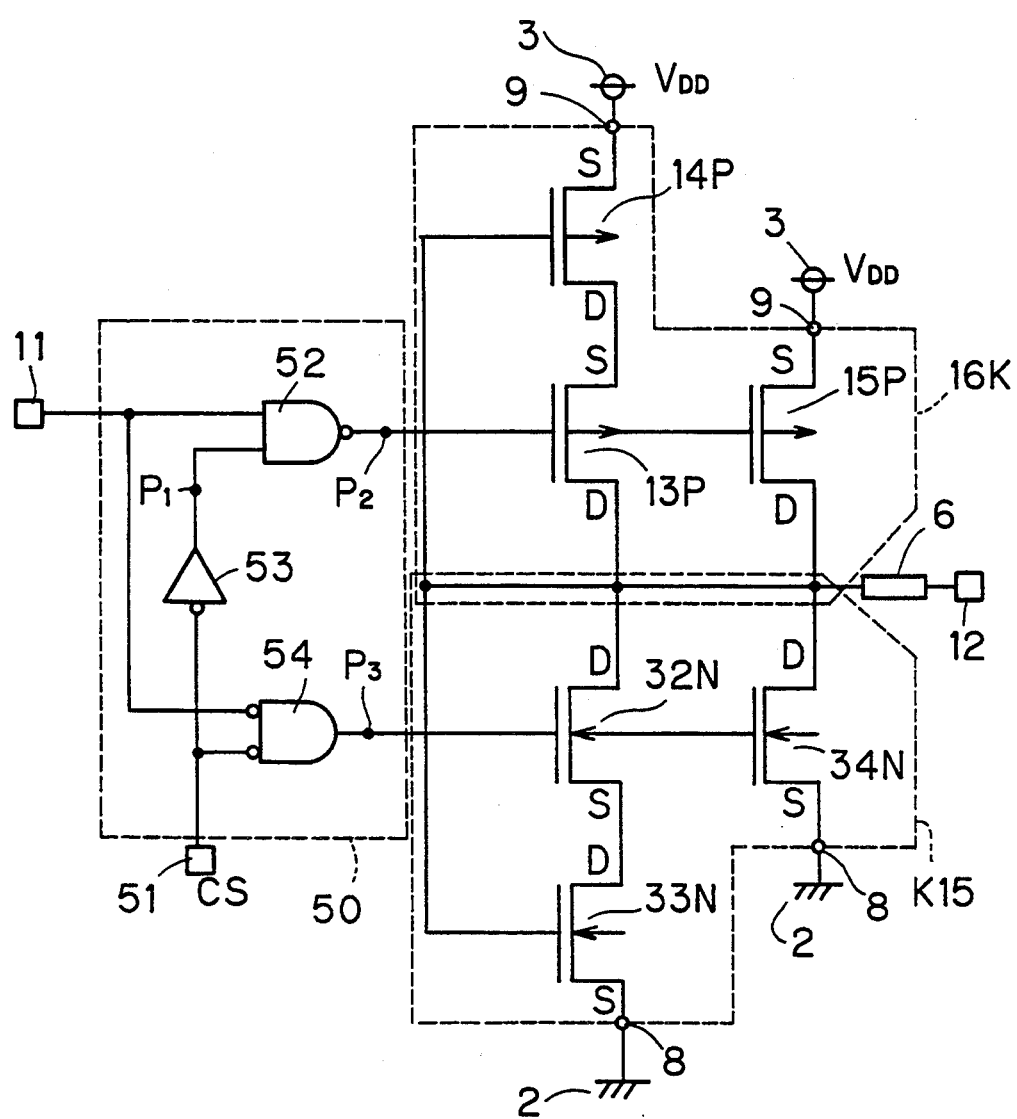
FIG. 20 is a circuit diagram showing a working mode of an output circuit employing the output driving circuit shown in FIG. 3.

FIG. 20 illustrates exemplary application of the MOS transistor output circuit shown in FIG. 3. Referring to FIG. 20, a high impedance control logic circuit 50 is provided between low and high level output driving circuits K15 and K16 corresponding to the low and high level output driving circuits K1 and K2 shown in FIG. 3 and an input terminal 11 for bringing an output terminal 12 into a high impedance state (floating state) through voltage drop means 6.

As clearly understood from FIG. 20, the high impedance control logic circuit 50 is formed by an output NOT AND circuit (corresponding to NAND) 52 having a first input which is connected to the input terminal 11 and an output which is connected to a gate of a P-channel transistor 13P, an input NOT AND circuit (corresponding to NOR) 54 having a first input which is connected to the input terminal 11 and an output which is connected to a gate of an N-channel transistor 32N, and an inverter 53 which is connected between a control input terminal 51 and a second input of the AND circuit 52. The second input of the AND circuit 54 is directly connected to the control input terminal 51.

The operations of the MOS transistor output circuit shown in FIG. 20 are now described again with reference to the levels of the respective parts shown in FIG. 14. Referring to FIG. 14, (a) represents the level of the input signal which is supplied to the input terminal 11, and (b) represents a control signal CS which is supplied to the control input terminal 51. (c) represents the level at a point $P_1$, which is $\overline{CS}$. Thus levels at points $P_2$ and $P_3$ become as shown at (d) and (e). The output terminal 12 goes to a low level during periods $t_0$ to $t_1$ and $t_3$ to $t_4$ when both of the points $P_2$ and $P_3$ are at high levels while the same goes to a high level during a period $t_1$ to $t_2$ when both of the points $P_2$ and $P_3$ are at low levels, while the point $P_2$ is at a high level and the point $P_3$ is at a low level during a period $t_2$ to $t_3$ when the control signal CS supplied to the control input terminal 51 is at a high level, whereby both of the low and high level output driving circuits K15 and K16 enter OFF states and the output terminal 12 enters a high impedance state (floating state). Thus, it is possible to control the state of the output terminal 12 by the control signal CS which is supplied to the control input terminal 51.

Also in the MOS transistor output circuit shown in FIG. 20, the output signal is converted from a low level to a high level or vice versa at an extremely high speed in response to change of the input signal, while it is possible to prevent excess reduction of the ON resistance $R_{ON}$ of the output circuit in the vicinity of termination of the change as well as to suppress generation of ringing.

Figure 21:
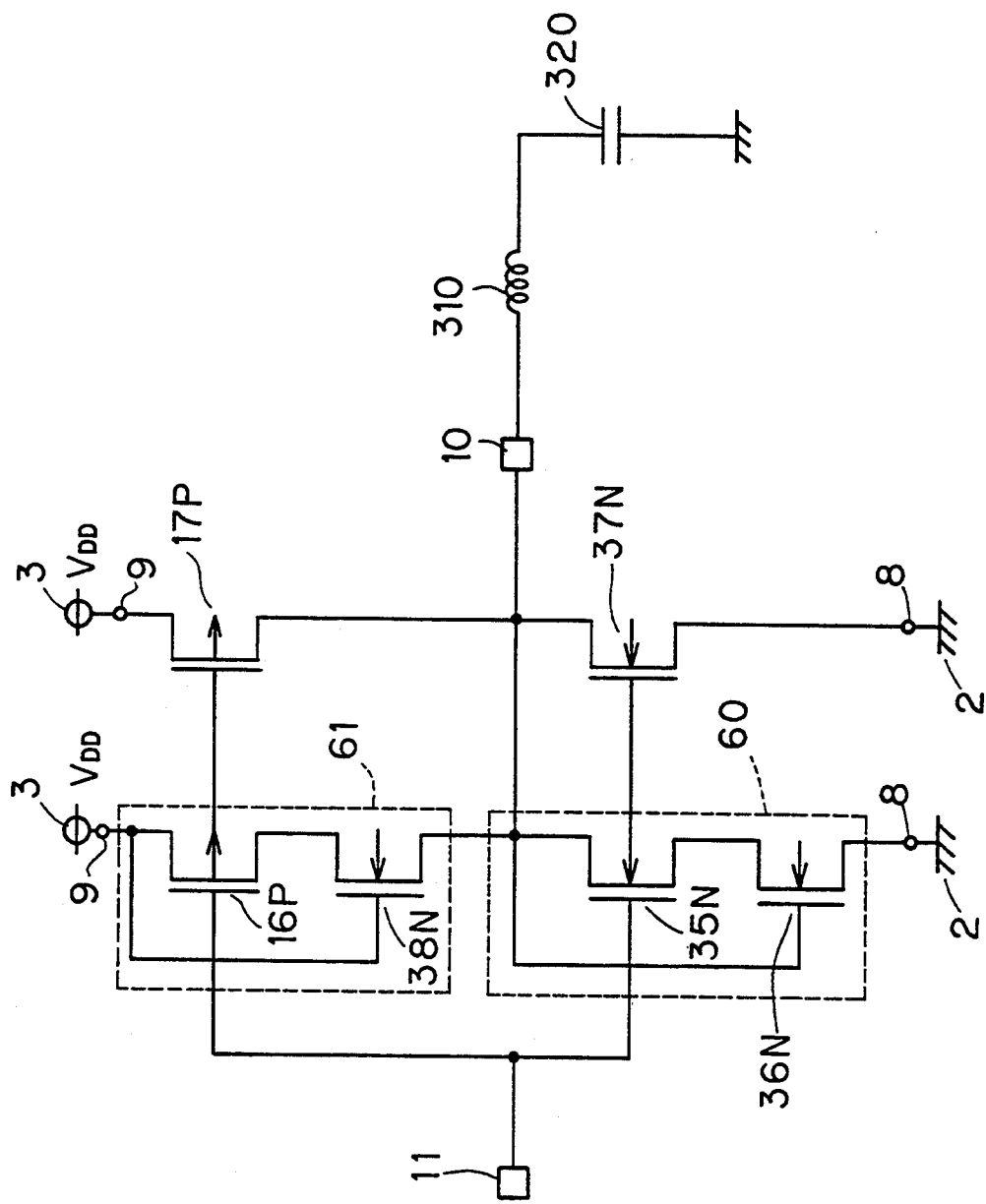
FIG. 21 is a circuit diagram showing an eighth example of the output driving circuit according to the present invention.

FIG. 21 is a circuit diagram showing an eighth example of the output driving circuit according to the present invention. The circuit shown in FIG. 21 is different from the conventional circuit shown in FIG. 54 in a point that first and second buffer circuits 60 and 61 are newly provided. The first buffer circuit 60 is connected in parallel with an N-channel MOS transistor 37N, and the second buffer circuit 61 is connected in parallel with a P-channel MOS transistor 17P.

The first buffer circuit 60 is formed by N-channel MOS transistors 35N and 36N. The N-channel MOS transistor 35N has a gate which is connected to an input terminal 11, and a drain which is connected to an output terminal 10 respectively. The N-channel MOS transistor 36N has a gate which is connected to the output terminal 10, a drain which is connected to a source of the N-channel MOS transistor 35N, and a source which is connected to a grounded power supply terminal 8.

The second buffer circuit 61 is formed by a P-channel MOS transistor 16P and an N-channel MOS transistor 38N. The P-channel MOS transistor 16P has a gate which is connected to the input terminal 11, and a source which is connected to a power source 3 outputting a voltage $V_{DD}$ respectively. The N-channel MOS transistor 38N has a gate which is connected to a power supply terminal 9, a drain which is connected to the drain of the P-channel MOS transistor 16P, and a source which is connected to the output terminal 10 respectively. Other structures are similar to those of the conventional circuit.

First, the operation of the first buffer circuit 60 is described. It is assumed here that a low level is inputted in the input terminal 11. At this time, the P-channel MOS transistors 16P and 17P are in ON states and the N-channel MOS transistors 37N and 35N are in OFF states, while the output terminal 10 outputs a high level. i.e., the voltage $V_{DD}$, to charge a load capacitor 320. At this time, the N-channel MOS transistor 38N is in an OFF state and the N-channel MOS transistor 36N is in an ON state.

When the input received in the input terminal 11 is converted from the low level to a high level, the N-channel MOS transistors 35N and 37N which have been in OFF states enter ON states while the P-channel MOS transistors 16P and 17P simultaneously enter OFF states. The charges of the load capacitor 320, which has been charged at a high level, are discharged through an inductor 310 and the N-channel MOS transistors 37N, 35N and 36N, so that the level of the output terminal 10 is reduced to a low level. When the output terminal 10 is still at a sufficiently high level, the N-channel MOS transistor 36N is in an ON state and hence the charges are discharged through the N-channel MOS transistor 37N and the first buffer circuit 60. When the level of the output terminal 10 drops below a threshold voltage $V_1$ of the N-channel MOS transistor 36N, on the other hand, the N-channel MOS transistor 36N enters an OFF state so that the charges are discharged only through the N-channel MOS transistor 37N.

Figure 22:
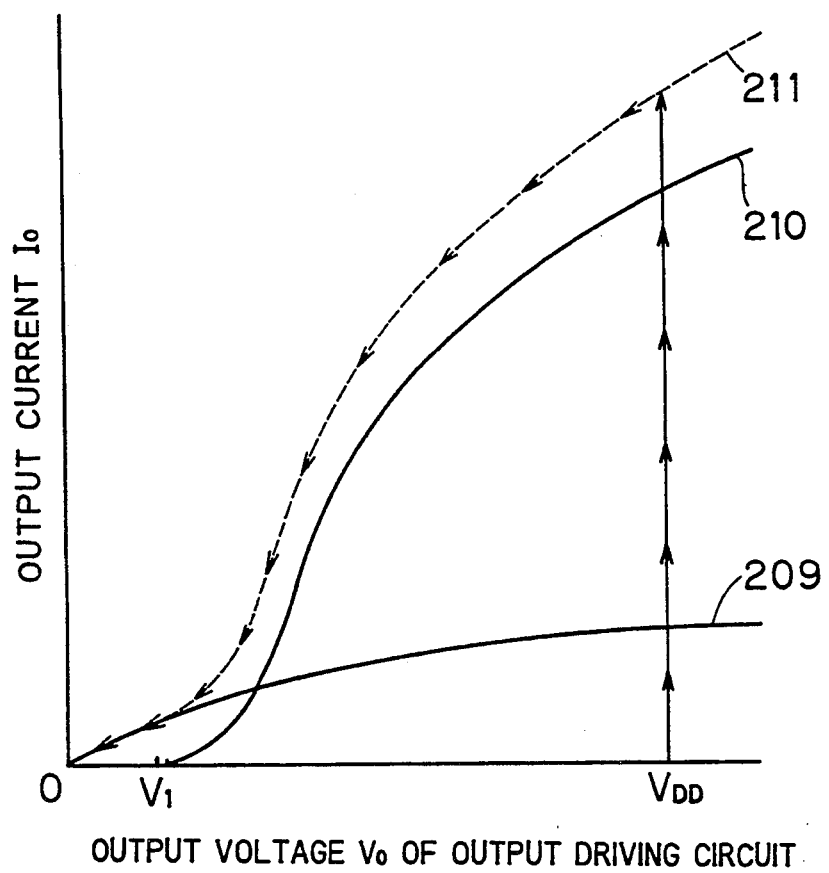
FIG. 22 is a diagram for illustrating the operation of the output driving circuit shown in FIG. 21.

The voltage/current characteristics of the N-channel MOS transistor 37N and the first buffer circuit 60 are set as shown by curves 209 and 210 in FIG. 22 respectively. Namely, the maximum value of an output current $I_O$ of the N-channel MOS transistor 37N is set to be smaller than that of the first buffer circuit 60. On the other hand, the N-channel MOS transistor 36N enters an OFF state when the level of the output terminal 10 drops below its threshold voltage $V_1$. In the output circuit shown in FIG. 21, therefore, the total voltage/current characteristics of the N-channel MOS transistor 37N and the first buffer circuit 60 are as shown by a curve 211 shown in FIG. 22.

The N-channel MOS transistor 37N and the first buffer circuit 60 act when an input level is converted from a low level to a high level, and an operating point moves along arrows in FIG. 22. Namely, the current drivability is high when the output terminal 10 is at a relatively high level, while the same is reduced as the output level is reduced to approach $V_1$, to prevent excess reduction of ON resistance $R_{ON}$ (refer to expression 2) of the output circuit. Thus, it is possible to prevent excess increase of the Q value shown in the expression 2, thereby suppressing ringing.

The operation of the second buffer circuit 61 is now described. It is assumed here that a high level is received in the input terminal 11. At this time, the P-channel MOS transistors 17P and 16P are in OFF states and the N-channel MOS transistors 35N and 37N are in ON states, whereby a low level, i.e., a voltage of 0 V, is outputted from the output terminal 10 to discharge the charges from the load capacitor 320. At this time, the N-channel MOS transistor 36N is in an OFF state and the N-channel MOS transistor 38N is in an ON state.

When the input level received in the input terminal 11 is converted from the high level to a low level, the P-channel MOS transistors 16P and 17P which have been in OFF states enter ON states, while the N-channel MOS transistors 35N and 37N simultaneously enter OFF states. The load capacitor 320 which has been discharged is charged through the inductor 310, the P-channel MOS transistors 16P and 17P and the N-channel MOS transistor 38N, whereby the level of the output terminal 10 is increased toward a high level. When the level of the output terminal 10 is sufficiently low, the load capacitor 320 is charged through the P-channel MOS transistor 17P and the second buffer circuit 61 since the N-channel MOS transistor 38N is in an ON state, while the same is charged only by the P-channel MOS transistor when the level of the output terminal 10 is increased and the gate-to-source voltage of the N-channel MOS transistor 38N drops below a threshold voltage $V_2$ thereof.

Figure 23:
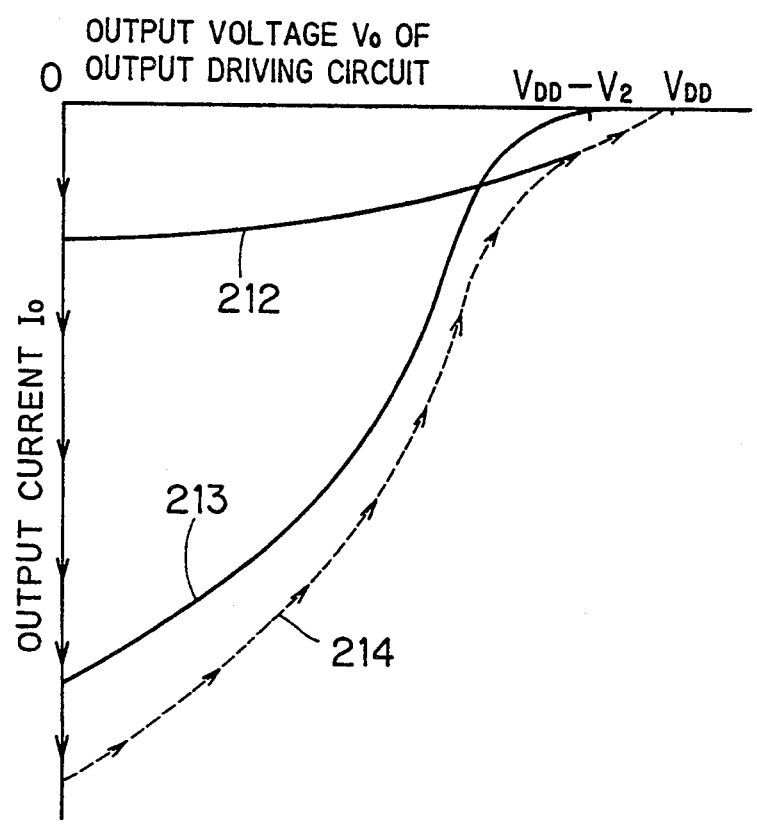
FIG. 23 is a diagram for illustrating the operation of the output driving circuit shown in FIG. 21.

Voltage/current characteristics of the P-channel MOS transistor 17P and the second buffer circuit 61 are set as shown by curves 212 and 213 in FIG. 23. Namely, the maximum value of an output current $I_O$ from the P-channel MOS transistor 17P is set to be smaller than that of the second buffer circuit 61. The N-channel MOS transistor 38N enters an OFF state when the level of the output terminal 10 is increased and the gate-to-source voltage drops below its threshold voltage $V_2$. Thus, the total voltage/current characteristics of the P-channel MOS transistor 17P and the second buffer circuit 61 in the output circuit shown in FIG. 21 are as shown by a curve 214 in FIG. 23.

The P-channel MOS transistor 17P and the second buffer circuit 61 act when the input level is converted from a high level to a low level, and an operating point moves along arrows in FIG. 23 in this case. Namely, the current drivability is high when the output terminal 10 is at a relatively low level, while the same is reduced when the output level is increased and the gate-tosource voltage of the N-channel MOS transistor 38N approaches its threshold voltage $V_2$, to prevent excess reduction of the ON resistance $R_{ON}$ of the output circuit. Thus, it is possible to prevent excess increase of the Q value shown in the expression 2, thereby suppressing ringing.

A simulated output voltage waveform of the output driving circuit shown in FIG. 21 is similar to the output signal waveform of the output driving circuit according to the first embodiment as shown in FIG. 5. Namely, no ringing is generated.

Figure 24:
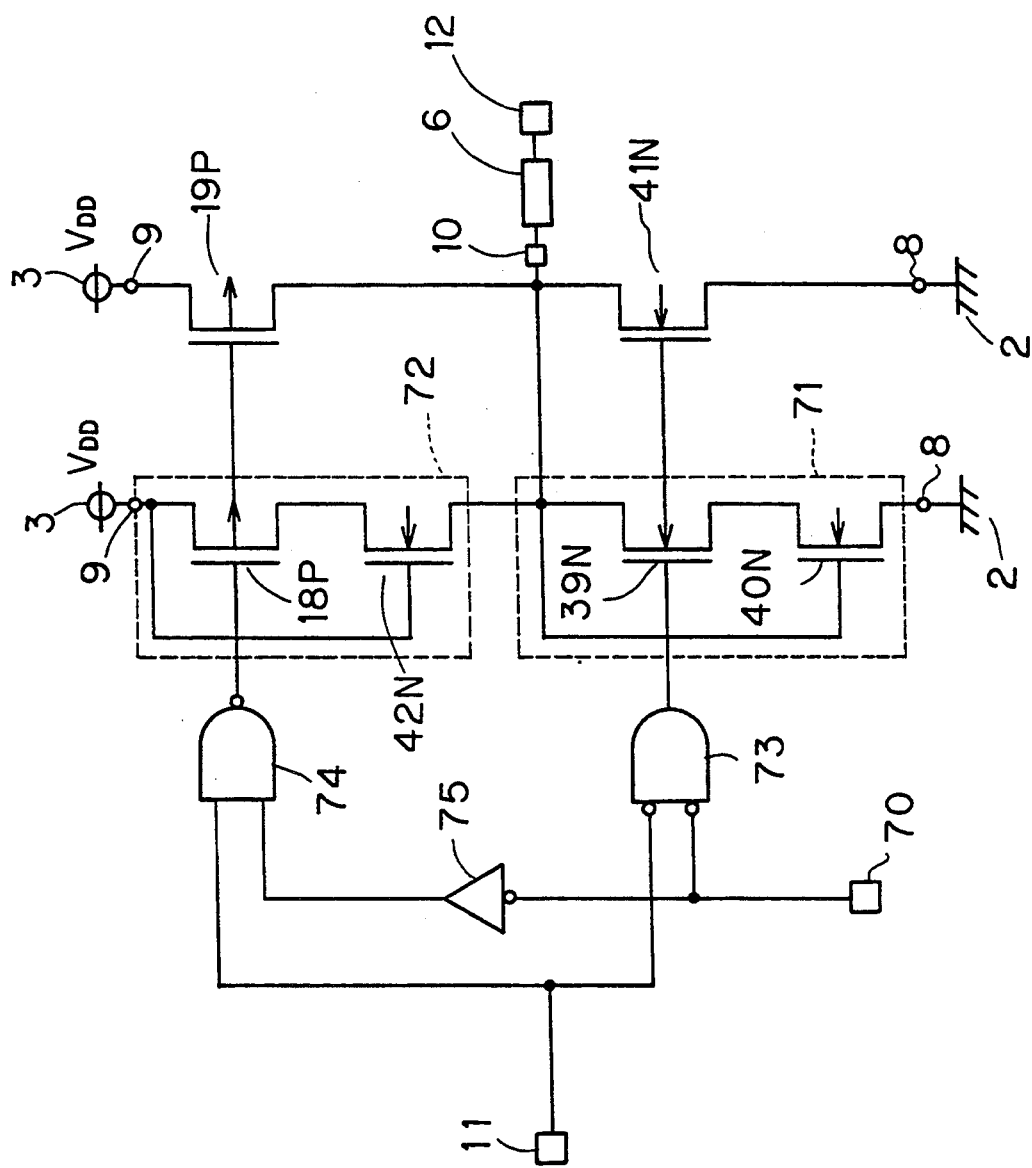
FIG. 24 is a circuit diagram showing working mode of the output driving circuit shown in FIG. 21.

FIG. 24 illustrates working mode of the output circuit according to the present invention employing the output driving circuit shown in FIG. 21. The output driving circuit shown in FIG. 21 is applied to an output circuit provided with a high impedance control function. Referring to FIG. 24, an input NOT AND circuit (corresponding to NOR) 73, an output NOT AND circuit (corresponding to NAND) 74 and an inverter 75 are high impedance control logical elements. In response to combination of input levels received in input terminals 11 and 70, the level of an output from an output terminal 12 takes three states of a high level state, a low level state and a high impedance state.

While the eighth example of the output driving circuit has been described with reference to MOS transistors, bipolar transistors may alternatively be employed to attain a similar effect. Although the eighth example comprises the first and second buffer circuits 60 and 61, the output driving circuit may alternatively comprise only one of such buffer circuits, to suppress ringing in output change either from a high level to a low level or vice versa.

Figure 25:
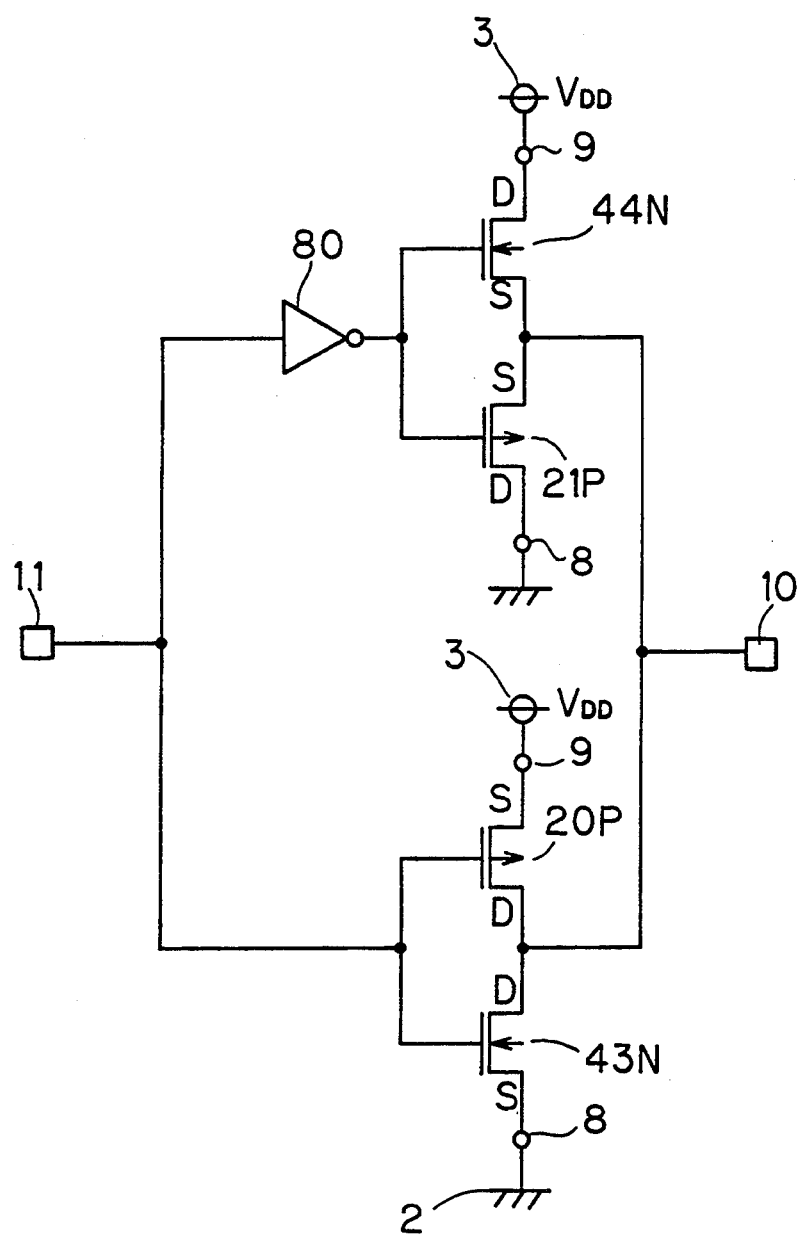
FIG. 25 is a circuit diagram showing a ninth example of the output driving circuit according to the present invention.

A ninth example of the output driving circuit according to the present invention is now described with reference to FIG. 25. FIG. 25 is a circuit diagram showing a MOS transistor output driving circuit according to the present invention, which serves as an inverter. Referring to FIG. 25, a low level output driving circuit for outputting a low level from an output terminal 10 is formed by a first N-channel transistor 43N having a drain which is connected to the output terminal 10 and a source which is connected to a grounded power supply terminal 8, and the so-called source-follower type second P-channel transistor 21P having a gate which is connected to an output of an inverter 80, a source which is connected to the output terminal 10, and a grounded drain. A high level output driving circuit for outputting a high level from the output terminal 10 is formed by a first P-channel transistor 20P having a gate which is connected to the input terminal 11, a drain which is connected to the output terminal 10, and a source which is connected to a power supply terminal 9 being set at voltage $V_{DD}$ of a power source 3, and a source-follower type second N-channel transistor 44N having a gate which is connected to the output of the inverter 80, a source which is connected to the output terminal 10, and a drain which is connected to another power supply terminal 9. An input end of the inverter 80 is connected to the input terminal 11.

The respective transistors 21P and 43N are so formed that the channel width/channel length ratio of the second P-channel transistor 21P which is connected as a source follower of the low level output driving circuit is at least twice that of the source-grounded first N-channel transistor 43N. Similarly, the respective transistors 44N and 20P are so formed that the channel width/channel length ratio of the second N-channel transistor 44N which is connected as a source follower of the high level output driving circuit is at least twice that of the source-grounded first P-channel transistor 20P.

Figure 26:
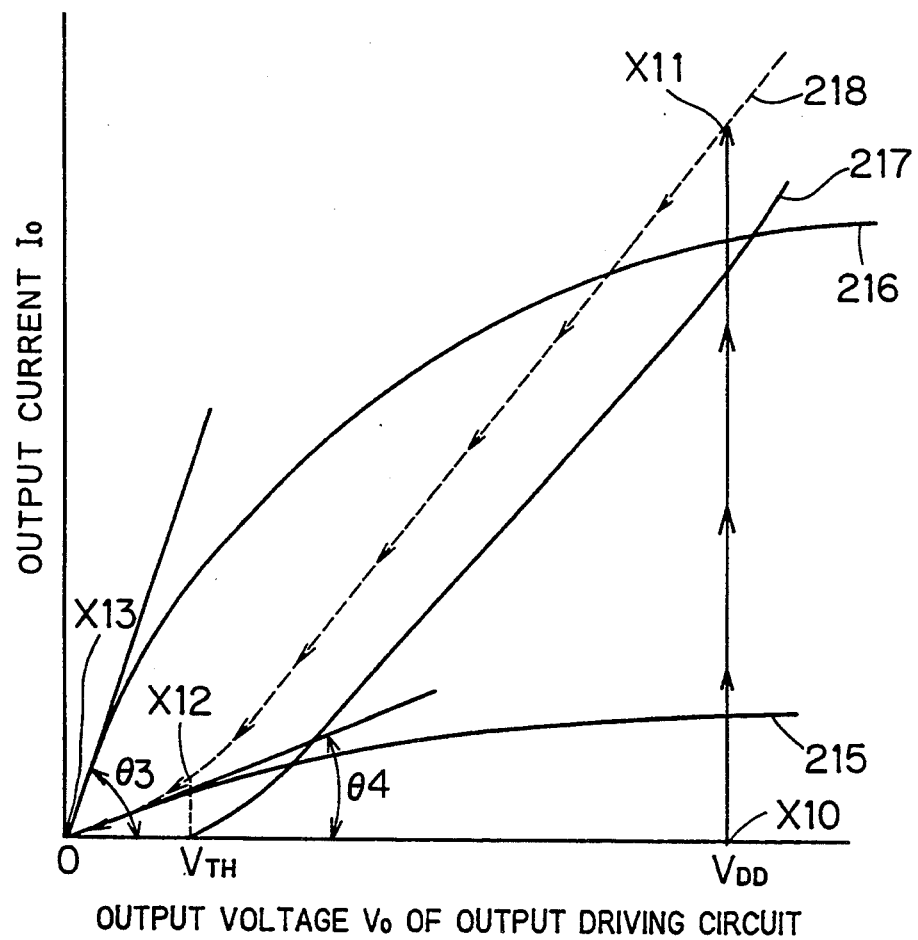
FIG. 26 is a characteristic diagram in relation to respective transistors and an output circuit for illustrating the operation of the output driving circuit shown in FIG. 25.

For example, output voltage/output current characteristics of the low level output driving circuit which is formed by the transistors 43N and 21P are now described with reference to FIG. 26. Referring to FIG. 26, a curve 215 represents the output characteristics of the N-channel transistor 43N. This curve 215 indicates that the transistor 43N has a small channel width/channel length ratio, a small ON-state current and considerably high internal resistance. On the other hand, the P-channel transistor 21P has a large channel width/channel length ratio as described above and hence the same has high current capacity and extremely high current drivability. When the output voltage is reduced to approach a gate-to-source threshold voltage $V_{TH}$, however, the P-channel transistor 21P abruptly enters a cutoff state since the same operates as a source follower, and its output characteristics are as shown by a curve 217. Thus, the total output characteristics of the low level output driving circuit which is formed by parallel connection of the transistors 43N and 21P are as shown by a curve 218. Also as to the high level output driving circuit which is formed by the transistors 20P and 44N, the transistor 20P exhibits output characteristics similar to those appearing on the curve 215 and the transistor 44N exhibits output characteristics similar to those appearing on the curve 217, while the total output characteristics are similar to those appearing on the curve 218.

The operations of the output driving circuit shown in FIG. 25 are now described in due order.

(1) When the input terminal 11 is at a low level:

The first P-channel transistor 20P is in an ON state and the first N-channel transistor 43N is in an OFF state, while the gate of the second P-channel transistor 21P goes to a high level by action of the inverter 80, whereby the second P-channel transistor 21P enters an OFF state. Thus, the output terminal 10 goes to a high level. At this time, the gate of the second N-channel transistor 44N goes to a high level, while its source is at a high level since the output terminal 10 is at a high level. Thus, the transistor 44N is in an OFF state since its gate-to-source voltage is below the threshold voltage.

(2) When the input terminal 11 is converted from a low level to a high level:

Both of the second N-channel transistor 43N and the second P-channel transistor 21P enter ON states, and an operating point is abruptly increased from a point X10 in FIG. 26 to a point X11 on the characteristic curve 218, to provide high current drivability. When the level of the output terminal 10 is reduced to approach 0 V and reaches a point close to a point X12, the transistor 21P enters an OFF state since the gate-to-source voltage thereof drops below the threshold value. Between the points X12 and X13, therefore, ON resistance $R_{ON}$ of the low level output driving circuit is substantially formed by the ON resistance $R_{ON}$ off the transistor 43N as shown by an inclination $\theta_4$ indicating $R_O{}^{-1}$. Thus, it is possible to prevent excess reduction of the ON resistance $R_{ON}$ of the low level output driving circuit, thereby suppressing generation of ringing on the output voltage waveform of the output terminal 10.

(3) When the input terminal 11 is at a high level:

Only the first N-channel transistor 43N is in an ON state, and the output terminal 10 is maintained at a level. Although a low level is applied to the gate of the second P-channel transistor 21P by an inverting operation of the inverter 80, the transistor 21P remains in an OFF state since the high level of the output terminal 10 is supplied to its source so that its gate-to-source voltage is below the threshold value.

(4) When the input terminal 11 is converted from a high level to a low level:

Through a similar process as the above (2), the first P-channel transistor 20P and the second N-channel transistor 44N of the high level output driving circuit first simultaneously enter ON states to drive a load with high current drivability, and finally only the P-channel transistor 20P remains in an ON state and the output terminal 10 goes to a high level. Also in this case, the high level output driving circuit has only the ON resistance of the first P-channel transistor 20P being in an ON state in the vicinity of a termination point of a transition period similarly to the above. Thus, it is possible to prevent excess reduction of the ON resistance $R_{ON}$ of the high level output driving circuit thereby suppressing generation of ringing.

When a load having inductance and capacitance of the same values L and C as those in FIG. 56 is connected to the output terminal 10, its simulated output voltage waveform is similar to that shown in FIG. 5, similarly to the first embodiment. As clearly understood from FIG. 5, ringing is substantially completely suppressed.

Although the output driving circuit of the ninth example employs a single inverter 80, the gates of the second P-channel transistor 21P and the second N-channel transistor 44N may alternatively be connected to the input terminal 11 through different inverters respectively.

Figure 27:
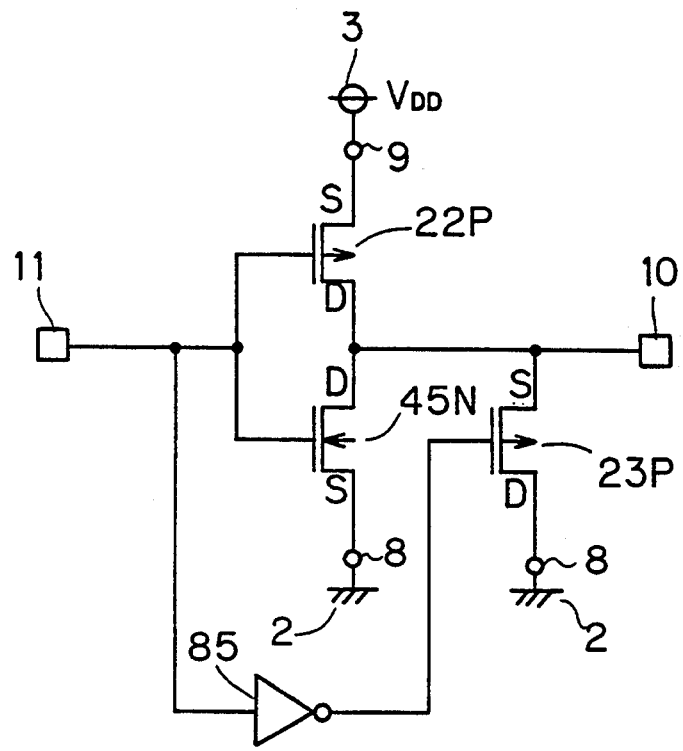
FIG. 27 is a circuit diagram showing a tenth example of the output driving circuit according to the present invention.

FIG. 27 illustrates a MOS transistor output driving circuit, which is a tenth example of the output driving circuit according to the present invention. A low level output driving circuit is formed by an N-channel transistor 45N which is similar to that of the output driving circuit shown in FIG. 25, a P-channel transistor 23P having a channel width/channel length ratio of at least twice that of the N-channel transistor 45N, and an inverter 85, while a high level output driving circuit is formed by only a single P-channel transistor 22P which is similar to that of the conventional output driving circuit shown in FIG. 54. In a logic circuit, a particularly high operating speed may be required for either the leading or trailing edge of its output voltage waveform, or ringing which is generated on either the trailing or leading edge may cause a problem.

The example shown in FIG. 27 is particularly effective when the operating speed for converting the output voltage of an output terminal 10 from a low level to a high level is not important and resulting ringing is not much problematic while the operating speed for converting the output voltage from a high level to a low level must be high and it is necessary to suppress resulting ringing.

Depending on application of the MOS transistor output driving circuit, the high level output driving circuit may be formed by the first P-channel transistor 22P, the second N-channel transistor 44N and the inverter 80 of the output driving circuit shown in FIG. 25 and the low level output driving circuit may be formed by the single N-channel transistor 45N which is similar to that of the conventional output driving circuit.

Figure 28:
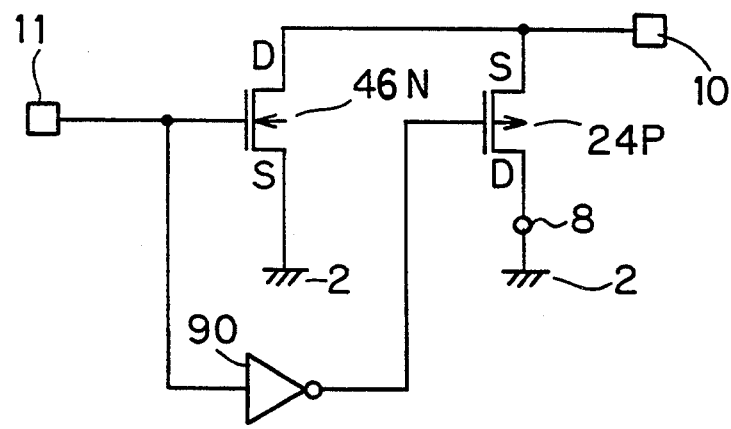
FIG. 28 is a circuit diagram showing an eleventh example of the output driving circuit according to the present invention.

FIG. 28 is a circuit diagram showing the so-called open drain type output circuit of a MOS transistor output driving circuit in an output circuit according to a twelfth embodiment of the present invention. In the twelfth embodiment, a low level output driving circuit which is formed by an N-channel transistor 46N being similar to that of the low level output driving circuit of the output driving circuit shown in FIG. 25, a P-channel transistor 24P having a channel width/channel length ratio at least twice that of the N-channel transistor 46N, and an inverter 90 is connected between an output terminal 10 and grounded power supply terminals 8. The output terminal 10 goes to a high level when an input terminal 11 is at a high level, while the former enters a high impedance state (floating state) when the latter is at a low level. Also in this embodiment, the output terminal 10 is abruptly driven to a low level when the input terminal 11 is converted from a low level to a high level, and no ringing is generated in the output voltage waveform.

Figure 29:
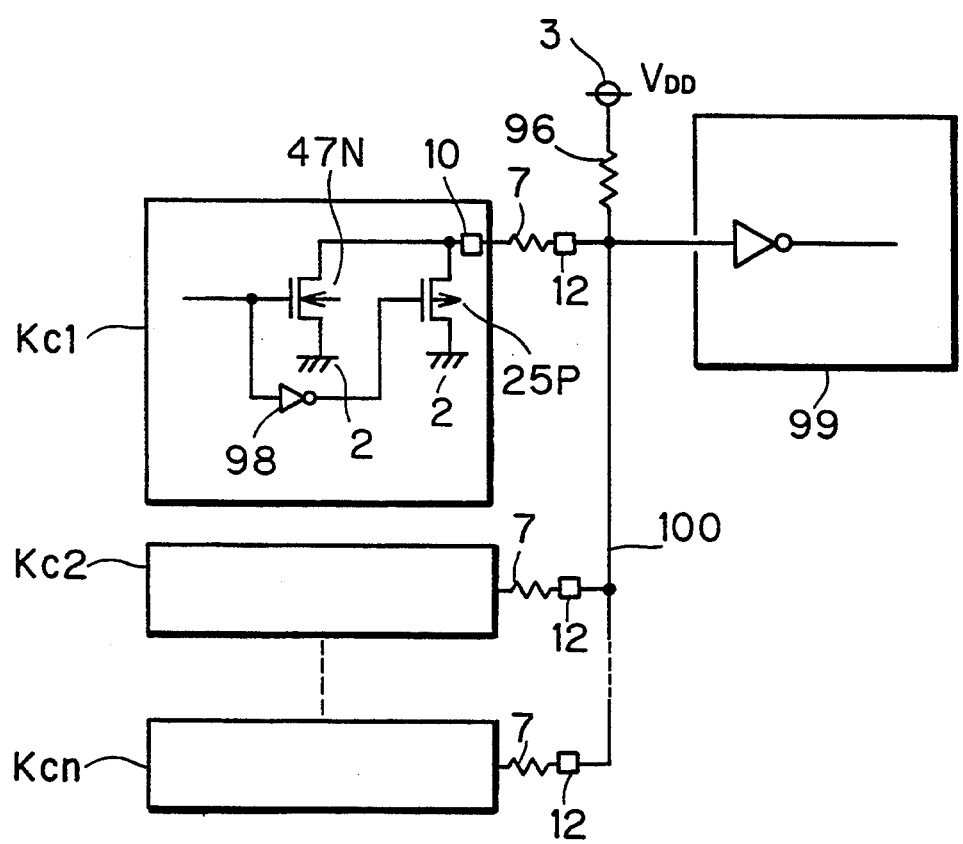
FIG. 29 is a schematic block diagram showing a working mode of an output circuit employing the output driving circuit shown in FIG. 28.

FIG. 29 illustrates working mode of the output driving circuit shown in FIG. 28. Respective output terminals 10 of a plurality of output driving circuits Kc1 Kc2, ..., Kcn shown in FIG. 28 are connected to output terminals 12 through voltage drop means 7, to be connected to a load resistor 96 as well as to an IC 99, such as a microcomputer, for example, through a bus line 100. An end of the resistor 96 is connected to a power source 3 which generates a voltage $V_{DD}$. In this circuit, a low level is supplied to the IC 99 when the output terminal 12 of any output circuit goes to a low level while the voltage $V_{DD}$, i.e., a high level, is supplied to the IC 99 through the resistor 96 when the output terminals of all output driving circuits Kc1 to Kcn are in high impedance states (floating states). The output driving circuits shown in FIGS. 25 and 27 cannot be used in the manner as shown in FIG. 29 since only either low or high output voltages are generated from the output terminals 10.

As to the open drain type output driving circuit, the high level output driving circuit of FIG. 25 which is formed by the P-channel transistor 20P, the N-channel transistor 44N having a channel width/channel length ratio of at least twice that of the P-channel transistor 20P and the inverter 80 may be provided between the output terminal 10 and the power supply terminal 9 which is set at the supply voltage $V_{DD}$ while opening the low level output driving circuit, as a matter of course. In this case, the output terminal goes to a high level when the input terminal is at a low level, while the former enters a high impedance state (floating state) when the latter is at a high level.

Figure 30:
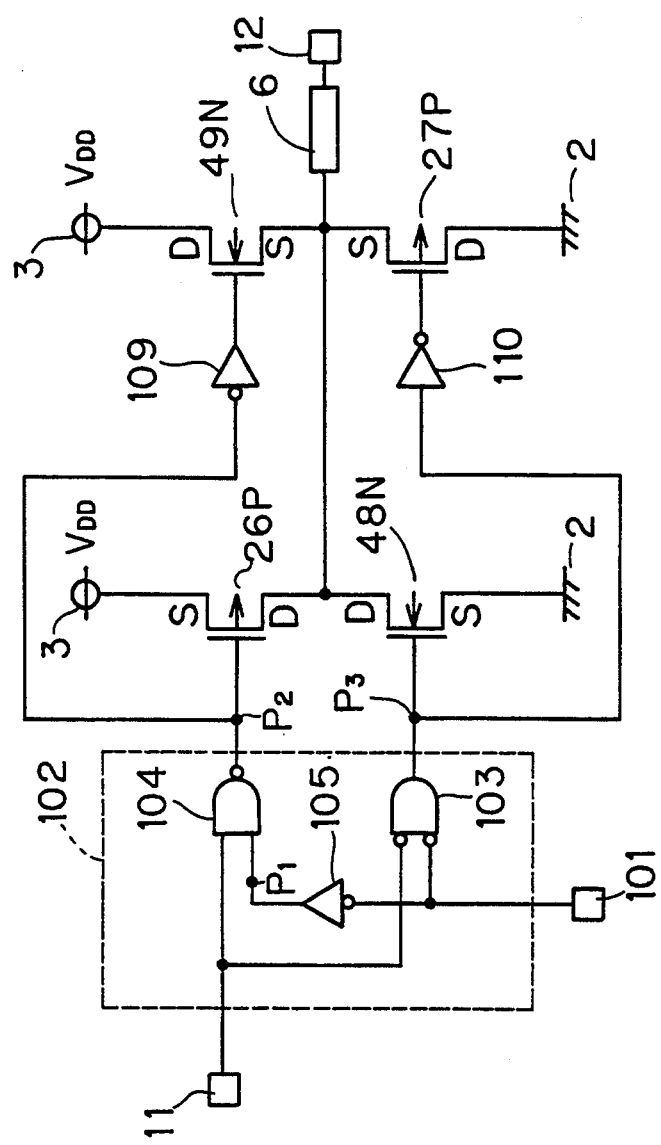
FIG. 30 is a schematic block diagram showing a working mode of an output circuit employing the output driving circuit shown in FIG. 25.

FIG. 30 illustrates working mode of the inventive MOS transistor output circuit employing the output driving circuit shown in FIG. 25. A high impedance control logic circuit 102 for bringing an output terminal 12 into a high impedance state (floating state) is provided between low and high level output driving circuits and an input terminal 11. Inverters 110 and 109 are connected to respective gates of a second P-channel transistor 27P and a second N-channel transistor 49N respectively.

As clearly understood from FIG. 30, the high impedance control circuit 102 is formed by an output NOT AND circuit (corresponding to NAND) 104 having a first input which is connected to the input terminal 11 and an output which is connected to a gate of a first P-channel transistor 26P as well as to the gate of the second N-channel transistor 49N through the inverter 109, an input NOT AND circuit (corresponding to NOR) 103 having a first input which is connected to the input terminal 11 and an output which is connected to a gate of an N-channel transistor 48N as well as to the gate of the second P-channel transistor 27P through the inverter 110, and an inverter 105 which is connected between a control input terminal 101 and a second input of the AND circuit 104. A second input of the NOT AND circuit 103 is directly connected to the control input terminal 101.

The operation of the MOS transistor output circuit shown in FIG. 30 is now described with reference to levels of the respective parts illustrated in FIG. 14. Referring to FIG. 14, (a) shows the level of an input signal which is supplied to the input terminal 11, and (b) shows a control signal CS which is supplied to the control input terminal 101, while (c) shows the level of a point $P_1$, which is $\overline{CS}$. Thus, levels of points $P_2$ and $P_3$ become as shown at (d) and (e) in FIG. 14. The output terminal 12 goes to a low level during periods $t_0$ to $t_1$ and $t_3$ to $t_4$ when the points $P_2$ and $P_3$ are at high levels while the same goes to a high level during a period $t_1$ to $t_2$ when the points $P_2$ and $P_3$ are at low levels. During a period $t_2$ to $t_3$ when the control signal CS which is supplied to the control input terminal 101 is at a high level, the point $P_2$ is at a high level and the point $P_3$ is at a low level, and hence both of the low and high level output driving circuits enter OFF states and the output terminal 12 enters a high impedance state (floating state). Thus, it is possible to control the state of the output terminal 12 by the level of the control signal CS which is supplied to the control input terminal 101.

Also in the MOS transistor output circuit shown in FIG. 30, the output signal is converted from a low level to a high level or vice versa at an extremely high operating speed while ON resistance $R_{ON}$ of the output driving circuit is prevented from excess reduction in the vicinity of termination of such conversion, whereby it is possible to suppress generation of ringing.

Figure 31:
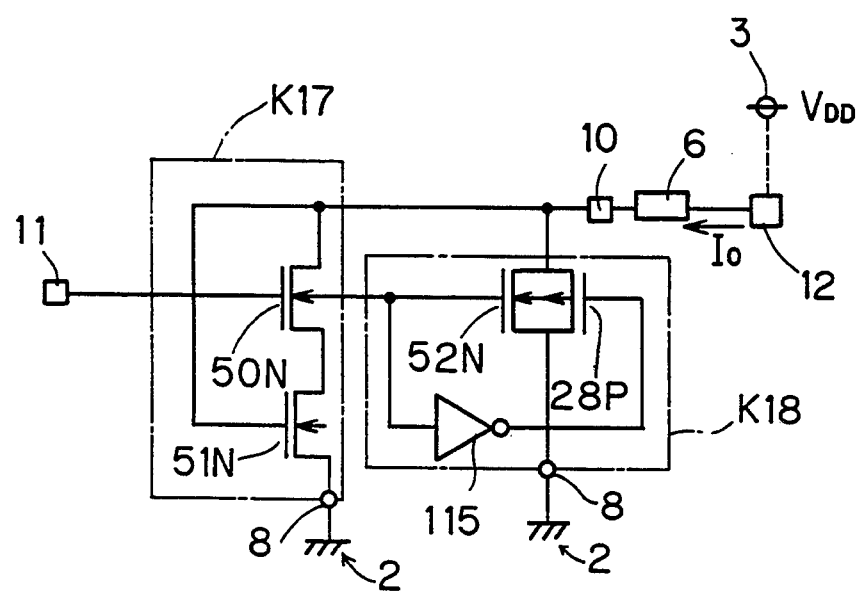
FIG. 31 is a circuit diagram showing a twelfth example of the output driving circuit according to the present invention.

FIG. 31 is a circuit diagram showing a twelfth example of the inventive output driving circuit. This example shows the so-called open drain circuit, in which an output terminal 12 is ordinarily connected to a power source 3 for generating a voltage $V_{DD}$ corresponding to a high logical level through a resistor. However, the resistor is omitted here for simplifying the description. Output driving circuits K17 and K18 are connected in parallel between an output terminal 10 and a ground 2, and connected to an input terminal 11 in common.

The output driving circuit K17 is formed by an N-channel MOS transistor 50N having a gate which is connected to the input terminal 11, and an N-channel MOS transistor 51N having a source which is connected to a grounded power supply terminal 8, a drain which is connected with a source of the transistor 50N, and a gate which is connected with the output terminal 10 and a drain of the transistor 50N respectively.

The output driving circuit K18 is formed by an inverter 115 having an input end which is connected with the input terminal 11, an N-channel MOS transistor 52N having a gate which is connected with the input terminal 11, a source which is connected with another power supply terminal 8 and a drain which is connected with the output terminal 10 respectively, and a P-channel MOS transistor 28P having a gate which is connected with an output end of the inverter 115, a source which is connected with the output terminal 10, and a drain which is connected with the power supply terminal 8 respectively. The transistors 52N and 28P form the so-called transmission gate.

Before explaining the operation of the twelfth example of the output driving circuit, operations of the output driving circuits K17 and K18 are now described.

In the output driving circuit K17, the transistor 50N is in an OFF state when the voltage of the output terminal 11 is 0 V (hereinafter referred to as voltage $V_{SS}$), i.e., at a low logical level. Even if the drain of the transistor 50N is at the voltage $V_{DD}$ corresponding to a high level and the transistor 51N is in an ON state, therefore, no current flows in the output driving circuit K17 since the transistor 50N is in an OFF state.

Figure 32:
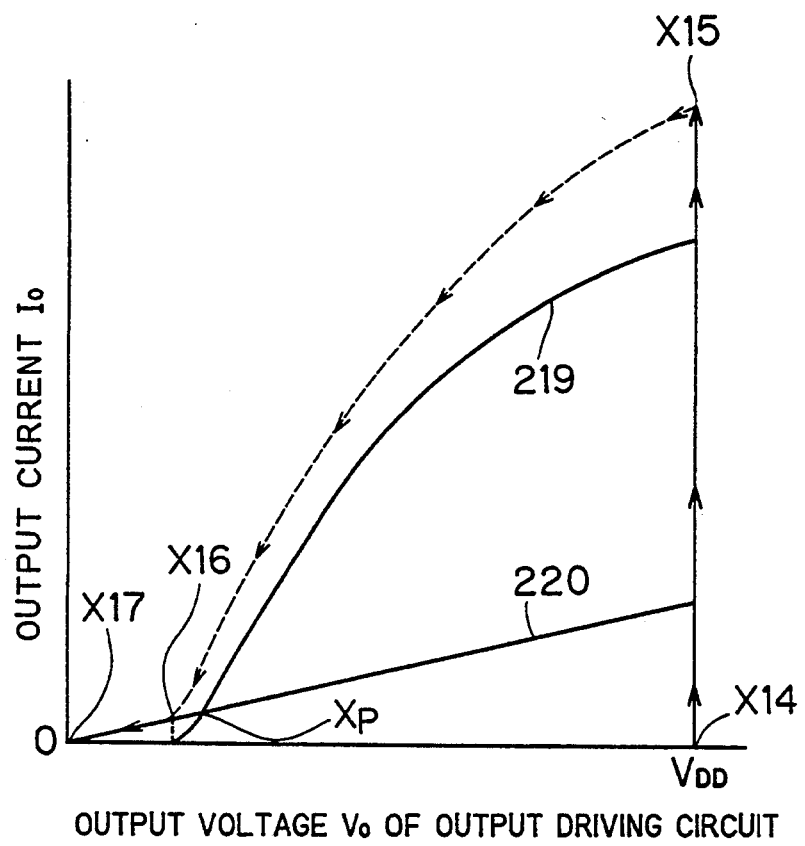
FIG. 32 is a diagram for illustrating the operation of the output driving circuit shown in FIG. 31.

If the voltage of the input terminal 11 is raised up to the voltage $V_{DD}$ in this case, the transistor 50N enters an ON state, whereby a current flows through the transistors 50N and 51N so that the voltage (hereinafter referred to as "output voltage $V_O$") of the output terminal 10 is reduced. Thus, the gate voltage of the transistor 51N is also reduced so that the transistor 51N enters an OFF state when its gate voltage drops below a certain threshold value. While the transistor 50N is in an ON state, current drivability of the output driving circuit K17 is abruptly reduced since the transistor 51N enters an OFF state. A curve 219 appearing in FIG. 32 shows such change of the current drivability.

In the output driving circuit K18, on the other hand, current drivability of the transistors 52N and 28P forming a transmission gate is designed to be lower than that of the transistors 50N and 51N. The inverter 115 complementarily transmits the voltage of the input terminal 11 to the transistors 52N and 28P respectively. Namely, the output driving circuit K18 operates as a resistor only when the voltage of the input terminal 11 is at a high level, while the former serves as an insulator when the voltage of the latter is at a low level. Therefore, its current drivability is substantially proportionate to the output voltage $V_O$, as shown by a curve 220 in FIG. 32.

Namely, the current drivability of the output driving circuit K18 is lower than that of the output driving circuit K17 when the output voltage $V_0$ is around the voltage $V_{DD}$, while the former is higher than the latter when the output voltage $V_0$ is around the voltage $V_{SS}$ and the ON resistance $R_{ON}$ is increased. This is indicated by an intersection point $X_P$ of the curves 219 and 220.

The operation of the output circuit shown in FIG. 31 is now described in due order.

When the input terminal 11 is at a low level, the transistors 50N, 52N and 28P are in OFF states and the output terminal 10 is at a high level (voltage $V_{DD}$). Therefore, both of the output driving circuits K17 and K18 feed no currents and the output voltage $V_0$ is maintained at the voltage $V_{DD}$ (point X14 in FIG. 32).

When the logical level of the input terminal 11 is converted from a low level to a high level, the transistors 50N, 52N and 28P immediately enter ON states. At this time, the output voltage $V_0$ is equal to the voltage $V_{DD}$, and the transistor 51N is also in an ON state. Thus, both of the output driving circuits K17 and K18 enter ON states in the output circuit shown in FIG. 31, whereby an output current Io flowing from the output terminal 10 is abruptly increased from the point X14 to a point X15 in FIG. 32 to reduce the output voltage $V_0$ with high current drivability (point X15 to point X16).

When the output voltage $V_0$ approaches the threshold voltage of the transistor 51N, however, the transistor 51N abruptly enters an OFF state and hence only the output driving circuit K18, which is formed by the transistors 52N and 28P, substantially drives the output current Io from the point X16 to a point X17. Therefore, the ON resistance $R_{ON}$ of the output circuit is determined substantially only by the output driving circuit K18 in this region, whereby it is possible to suppress generation of ringing in the output voltage waveform of the output terminal 10 by preventing excess reduction of the ON resistance $R_{ON}$.

Figure 33A:
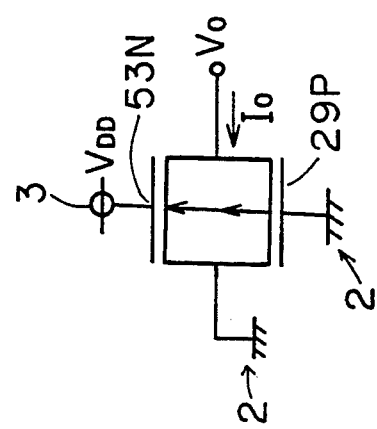
FIG. 33 is a diagram for illustrating the operation of a transmission gate.
Figure 33B:
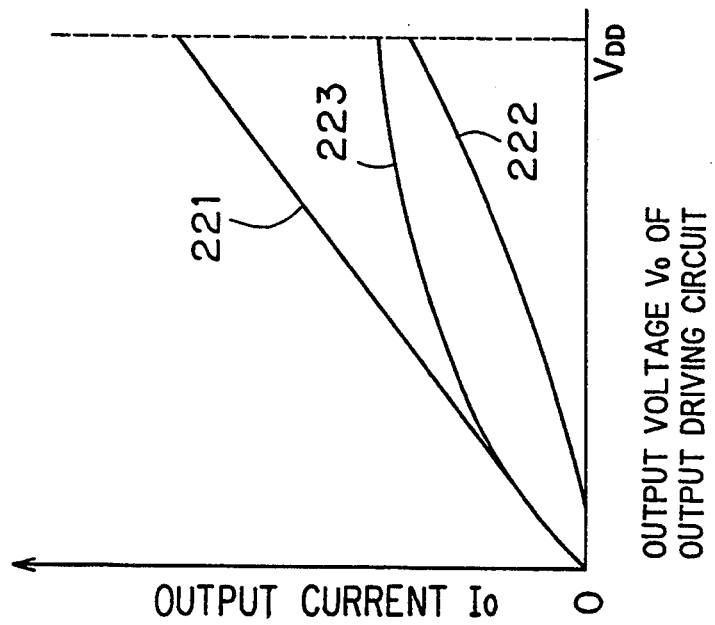

The output driving circuit K18 exhibits a substantially constant ON resistance $R_{ON}$ regardless of the value of the output voltage $V_O$, since the transistors 52N and 28P have complementary characteristics. When the logical level of the output terminal 11 is at a high level, the voltage $V_{DD}$ is applied to the gate of the transistor 52N while the voltage $V_{SS}$ is applied to the gate of the transistor 28P by action of the inverter 115 respectively, and the output circuit in the vicinity of the transistors 52N and 28P can be drawn as shown in FIG. 33. At this time, potential difference which is applied across the source and the drain of the transistor 52N is equal to the output voltage $V_O$ since $V_{SS}=0$. A shunt current of the output current Io to the transistor 52N is monotonically reduced along reduction of the output voltage $V_O$ as shown by a curve 223, while the amount of change, i.e., inclination of the curve 223 is increased.

On the other hand, potential difference which is equal to the output voltage $V_O$ is also applied across the source and the drain of the transistor 28P and a shunt current of the output current Io also flows to the transistor 28P, while its inclination is reduced along reduction of the output voltage $V_O$, as shown in a curve 222. Thus, the overall output current Io is substantially proportionate to the output voltage $V_O$, and the ON resistance $R_{ON}$ is hardly changed.

As hereinabove described, the ON resistance $R_{ON}$ of the output circuit can be regarded as an inverse number of inclination of a curve showing current drivability with respect to the output voltage $V_O$, i.e., the value of the output current Io, identically to that shown in FIG. 56. In general, current drivability of an N-channel MOS transistor is abruptly reduced as potential difference between a source and a drain is reduced, as hereinabove described. When the overall current drivability is increased in the conventional output circuit shown in FIG. 54, therefore, its characteristics are as shown by a curve 202 in FIG. 56, and its inclination $\theta_2$ is increased as compared with inclination $\theta_1$ of a curve 201.

Namely, its ON resistance $R_2$ is so reduced that ringing is easily caused in the output waveform. In the output driving circuit shown in FIG. 31, the output current Io is fed with relatively high current drivability when the output voltage $V_O$ is converted from the voltage $V_{DD}$ to the voltage $V_{SS}$ or the same is in the vicinity of the voltage $V_{DD}$ and with current drivability having relatively small dependency on fluctuation of the output voltage $V_O$ when the output voltage $V_O$ is around the voltage $V_{SS}$, whereby it is possible to suppress ringing substantially with no deterioration of the fall time of the waveform. In order to implement such current drivability, the second circuit (the output driving circuit K17 shown in FIG. 31) having current drivability which is monotonically reduced in a relatively large reduction ratio and the first circuit (the output driving circuit K18 shown in FIG. 31) having current drivability which is monotonously reduced in a relatively small reduction ratio are connected in parallel with each other.

The first circuit may alternatively be prepared from a circuit which is formed by transistors having high ON resistance values, for example, so far as the same has the aforementioned current drivability. However, the output driving circuit K18 shown in FIG. 31, which forms a transmission gate, is more preferable in view of impedance matching.

Figure 34:
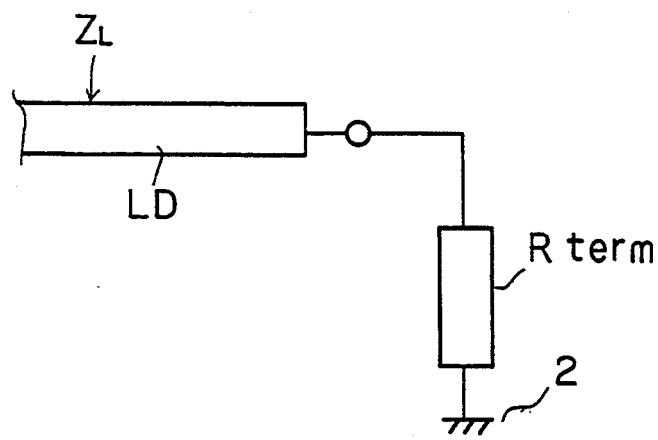
FIG. 34 is an explanatory diagram for a reflection coefficient.

When a load which is connected to an output circuit is a distributed constant element such as a transmission path, impedance matching of the load and the output circuit comes to a question. FIG. 34 illustrates the manner of connection of a load LD on the assumption that the ON resistance of an output circuit is terminating resistance $R_{term}$. When the load LD has characteristic impedance $Z_L$, a reflection coefficient $\rho$ in the output circuit is expressed as follows:

$$\rho = \frac{R_{term} - Z_L}{R_{term} + Z_L} \quad (3)$$

In general, it is preferable to suppress the absolute value of the reflection coefficient to be not more than about $\frac{1}{3}$. When ON resistance $R_{term}$ satisfying this condition is obtained, it is understood that the value may be at least $\frac{1}{2}$ and not more than twice the characteristic impedance $Z_L$ from the following expression:

$$\left| \frac{R_{term} - Z_L}{R_{term} + Z_L} \right| < \frac{1}{3} \quad (4)$$

It is possible to easily form an output circuit having ON resistance satisfying the aforementioned condition in correspondence to the characteristic impedance $Z_L$ of the load LD by employing a transmission gate having current drivability with excellent linearity with respect to the value of an output voltage $V_O$.

Figure 35:
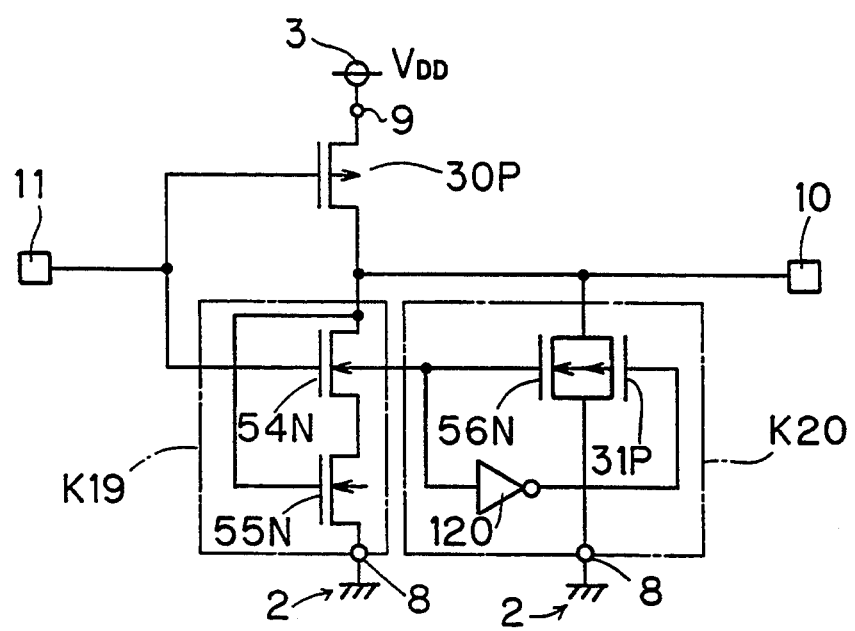
FIG. 35 is a circuit diagram showing a thirteenth example of the output driving circuit according to the present invention.

While FIG. 31 shows an open drain circuit as the twelfth example of the output driving circuit, a thirteenth example may be formed by providing a P-channel MOS transistor 30P between a power supply terminal 9 which is connected to a power source 3 and an output terminal 10, as shown in FIG. 35. In this example, it is possible to suppress ringing when an output voltage $V_O$ is converted from a high level to a low level similarly to the twelfth example, while it is impossible to suppress ringing when the voltage is converted from a high level to a low level, similarly to the conventional output circuit shown in FIG. 54.

Figure 36:
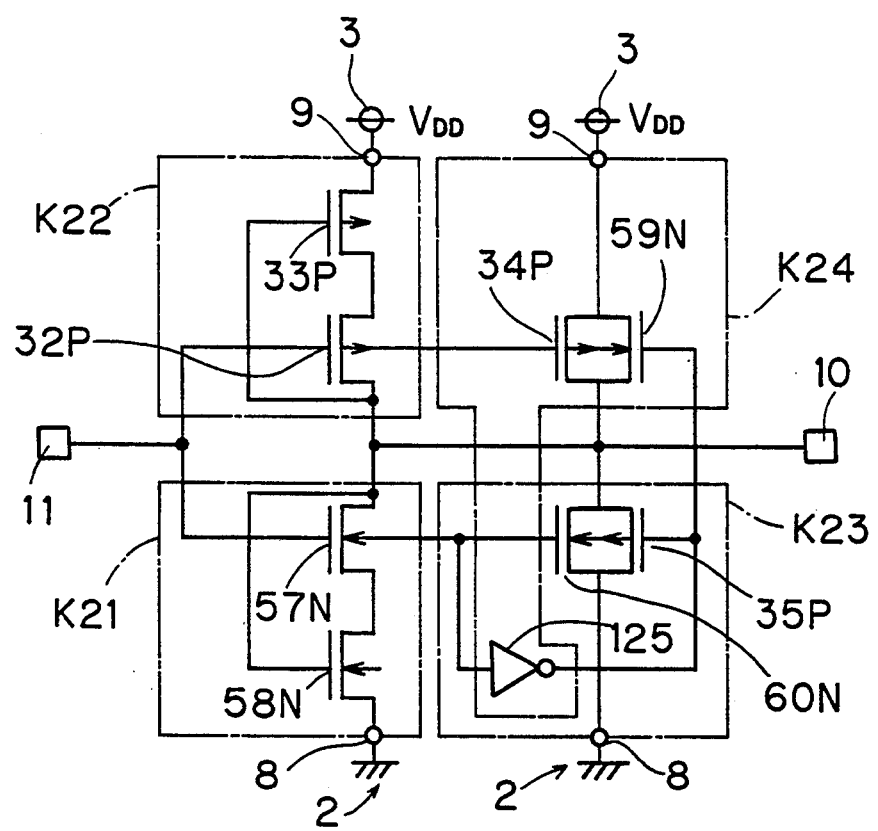
FIG. 36 is a circuit diagram showing a fourteenth example of the output driving circuit according to the present invention.

FIG. 36 is a circuit diagram showing a fourteenth example of the output driving circuit, which suppresses ringing of an output waveform with respect to fluctuation of a logical level in each direction. Between power sources $V_{DD}$ and $V_{SS}$, output driving circuits K21 and K22 as well as output driving circuits K23 and K24 are connected in series to each other through an output terminal 10 respectively. The output driving circuits K21 and K23 are identical to the output driving circuits K17 and K18 or K19 and K20 shown in the eleventh or twelfth example respectively.

The output driving circuit K22 is formed complementarily with the output driving circuit K21, while the output driving circuit K24 is formed complementarily with the output driving circuit K23 respectively. The output driving circuit K22 is formed by a P-channel MOS transistor 32P having a gate which is connected with an input terminal 11, and an N-channel MOS transistor 33P having a source which is connected with a power supply terminal 9, a drain which is connected with a source of the transistor 32, and a gate which is connected with the output terminal 10 and a drain of the transistor 32P respectively. The output driving circuit K24 is formed by an inverter 125 having an input end which is connected with the input terminal 11, a P-channel MOS transistor 34P having a gate which is connected with the input terminal 11, a source which is connected with another power supply terminal 9, and a drain which is connected with the output terminal 10 respectively, and an N-channel MOS transistor 59N having a gate which is connected with an output end of the inverter 125, a source which is connected with the output terminal 10, and a drain which is connected with the power supply terminal 9 respectively. The transistors 34P and 59N form the so-called transmission gate, to have the inverter 125 in common with the output driving circuit K23.

Operations of the output driving circuits K22 and K24 having the aforementioned structures are carried out complementarily with the output driving circuits K21 and K23 respectively.

When the input terminal 11 is at a voltage $V_{DD}$ (high logical level), the output voltage $V_O$ is at a voltage $V_{SS}$ (low level) since the output driving circuits K21 and K23 are in ON states, and the transistor 33P is in an ON state. However, no current flows in the output driving circuit K22 since the transistor 32P is in an OFF state, and hence the output voltage $V_O$ is maintained at the voltage $V_{SS}$.

If the voltage of the input terminal 11 is reduced to the voltage $V_{SS}$ (low logical level), the output driving circuits K21 and K23 immediately enter OFF states, so that the output voltage $V_O$ is decided by the operations of the output driving circuits K22 and K24.

Figure 37:
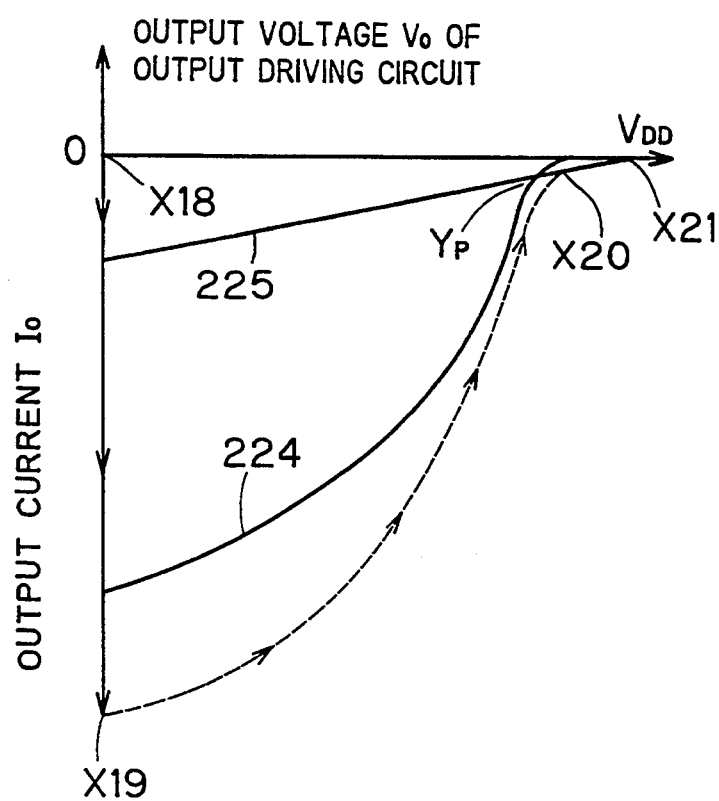
FIG. 37 is a diagram for illustrating the operation of the output driving circuit shown in FIG. 36.

At this time, current drivability of the output driving circuit K22 is as shown by a curve 224 appearing in FIG. 37. Namely, the current drivability is high when conversion of the output voltage $V_O$ from the voltage $V_{SS}$ to the voltage $V_{DD}$ is started (point X18 to point X19), while the current drivability is abruptly reduced when the output voltage $V_O$ exceeds the threshold value of the transistor 33P since the transistor 33P enters an OFF state in this case (point X20).

On the other hand, current drivability of the output driving circuit K24 is linearly change with respect to the output voltage $V_O$, similarly to the output driving circuit K18 (curve 225 in FIG. 37). Namely, the current drivability is lower than that of the output driving circuit K22 when the output voltage $V_O$ is around the voltage $V_{SS}$, while the current drivability exceeds that of the output driving circuit K22 when the output voltage $V_O$ is around the voltage $V_{DD}$ and the ON resistance $R_{ON}$ of the output circuit is increased. This is indicated by an intersection point $Y_P$ the curves 224 and 225.

Therefore, the operation of the output circuit shown in FIG. 36 is complementary to that shown in FIG. 32, as shown in FIG. 37. Namely, the current drivability is changed along X18, X19, X20 and X21 with increase of the output voltage $V_O$. Therefore, overshooting of the output waveform is reduced by an action similar to that of the twelfth example of the output driving circuit. In other words, it is possible to suppress both of overshooting and undershooting as to ringing of the output waveform similarly to the first embodiment as shown in FIG. 5, by providing the output driving circuits K21, K22, K23 and K24.

When the output driving circuits K21 and K22 are thus provided on both of the power sources $V_{SS}$ and $V_{DD}$, still another effect is attained as compared with the twelfth and thirteenth examples.

Figure 38:
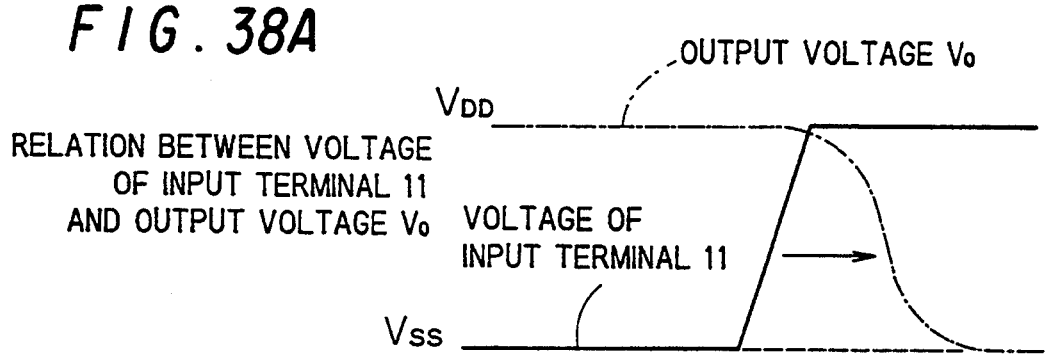
FIG. 38 is an explanatory diagram for a through current.

A solid waveform appearing in FIG. 38 shows such a state that the voltage of the input terminal 11 is converted from the voltage $V_{SS}$ to the voltage $V_{DD}$. As shown in this figure, the actual voltage is changed not in an ideal step form but in a ramp form.

Figure 54:
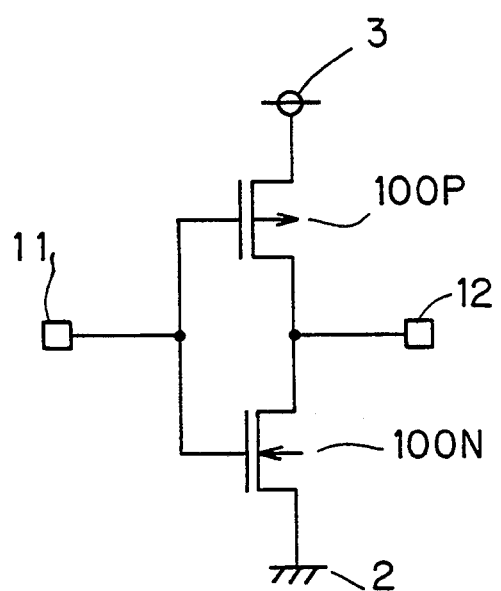
FIG. 54 illustrates a conventional CMOS output circuit.
Figure 55:
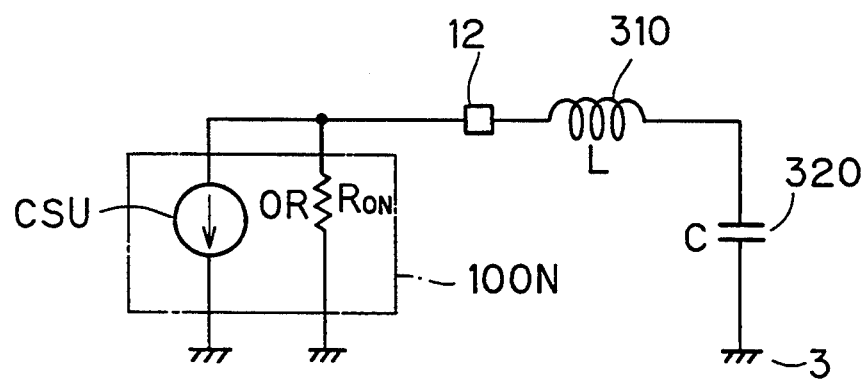
FIG. 55 is an output voltage/output current characteristic diagram of the conventional output circuit.

In the conventional output circuit shown in FIG. 54, on the other hand, the gates of the transistors 100P and 100N are connected to the input terminal 11 in common. Thus, there is such a time that the transistors 100P and 100N simultaneously enter ON states, and a current shown as a through current 1 in FIG. 38 flows in the transistors 100P and 100N to cause unnecessary power consumption.

In the output driving circuits K21 and K22 shown in FIG. 36, the output voltage $V_O$ is changed in a delay after the voltage change of the input terminal 11 (one-dot chain line in FIG. 38) to drive the transistors 57P and 33P, whereby a period when a current can flow in both of the transistors 32P and 33P (similarly through both of the transistors 57N and 58N) is short. Therefore, only a small current passes through the transistors 57N, 58N, 32P and 33P, as shown by a through current $\eta 2$ in FIG. 38. In other words, it is possible to prevent unnecessary power consumption.

Figure 39:
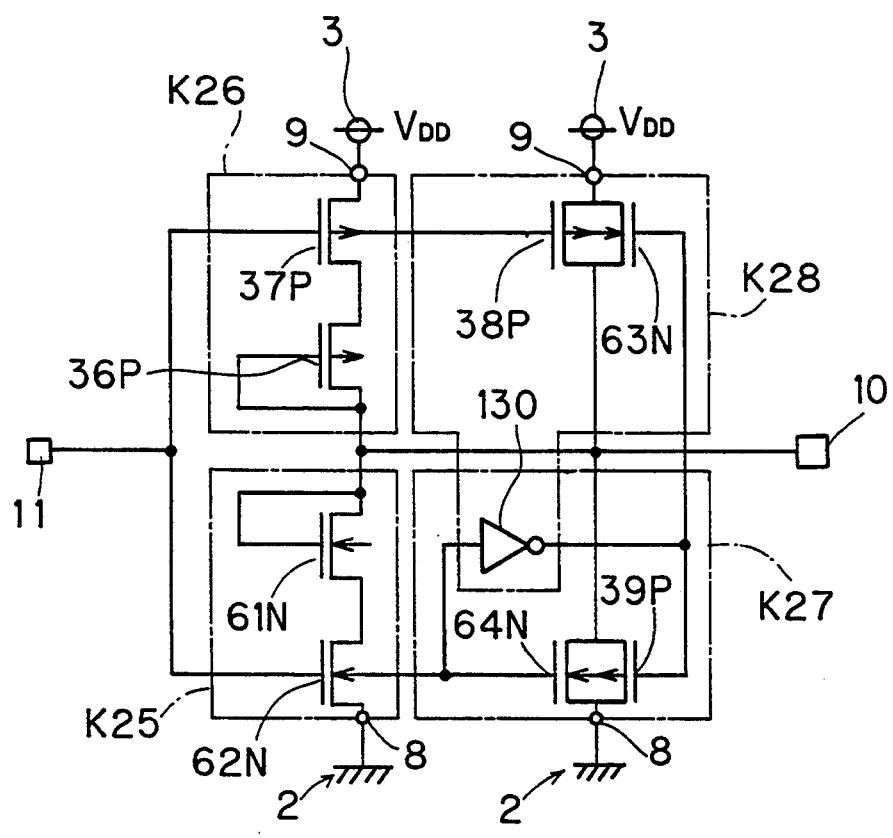
FIG. 39 is a circuit diagram showing a fifteenth example of the output driving circuit according to the present invention.

FIG. 39 is a circuit diagram showing a fifteenth example of the inventive output driving circuit. Output driving circuits K25 and K26 are provided in place of the output driving circuits K21 and K22 of the fourteenth example respectively.

The output driving circuit K25 is formed by an N-channel MOS transistor 62N having a gate which is connected with an input terminal 11 and a source which is connected with a power supply terminal 8 respectively, and an N-channel MOS transistor 61N having a source which is connected with a drain of the transistor 62N and a gate which is connected with its drain and an output terminal 10 respectively. The output driving circuit K26 is formed complementarily with the output driving circuit K25. Namely, the output driving circuit K26 is formed by a P-channel MOS transistor 37P having a gate which is connected with the input terminal 11 and a source which is connected with the power supply terminal 9 respectively and a P-channel MOS transistor 36P having a source which is connected with a drain of the transistor 37P and a gate which is connected with its drain and the output terminal 10 respectively.

The output driving circuit K25, which is similar in structure to the output driving circuit K21 of the fourteenth example except for that positions of the series-connected transistors 57N and 58N are exchanged between the power supply terminal 8 and the output terminal 10, performs the same operation as the output driving circuit K21. The output driving circuit K26 also performs the same operation as the output driving circuit K22 in the fourteenth example. Thus, the fifteenth example has the same effect as the fourteenth example.

Figure 40:
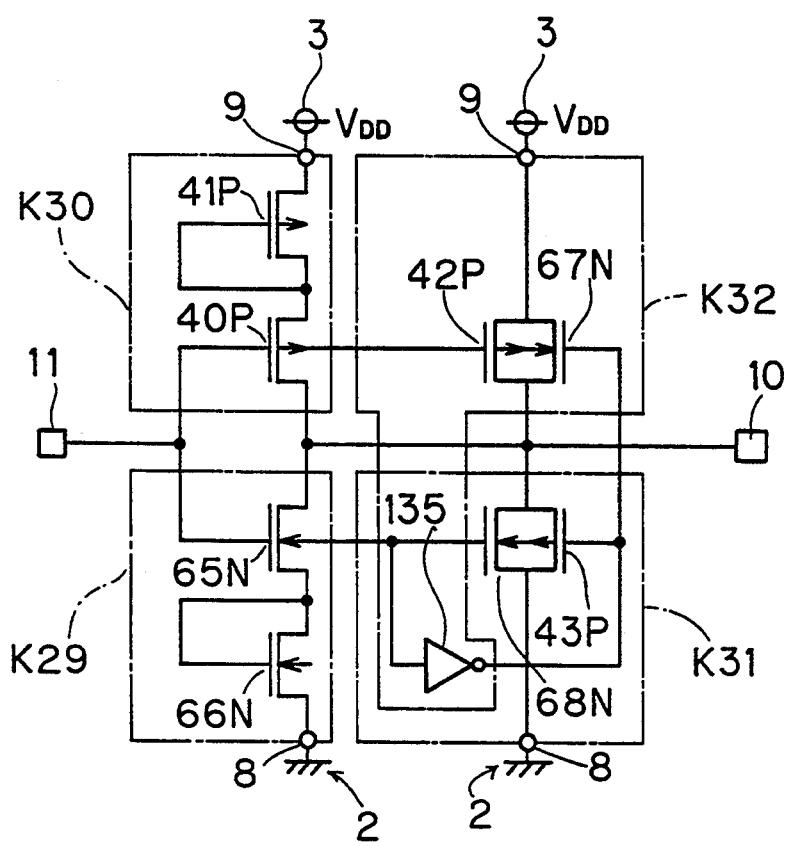
FIG. 40 is a circuit diagram showing a sixteenth example of the output driving circuit according to the present invention.

FIG. 40 is a circuit diagram showing a sixteenth example of the inventive output driving circuit. Output driving circuits K29 and K30 are provided in place of the output driving circuits K21 and K22 of the fourteenth example respectively.

The output driving circuit K29 is formed by an N-channel MOS transistor 65N having a gate which is connected with an input terminal 11 and a drain which is connected with an output terminal 10 respectively, and an N-channel MOS transistor 66N having a source which is connected with a power supply terminal 8 and a gate which is connected with its drain and a source of the transistor 65N respectively.

The output driving circuit K30 is formed complementarily with the output driving circuit K29. Namely, this output driving circuit K30 is formed by a P-channel MOS transistor 40P having a gate which is connected with the input terminal 11 and a drain which is connected with the output terminal 10 respectively, and a P-channel MOS transistor 41P having a source which is connected with a power supply terminal 9 and a gate which is connected with its drain and a source of the transistor 40P respectively.

In the output driving circuit K29, the transistor 66N is supplied with an output voltage $V_O$ in its gate when the transistor 65N is in an ON state, to perform an operation similar to that of the output driving circuit K21 of the fourteenth example. When the transistor 65N is in an OFF state, on the other hand, the operation of the transistor 66N exerts no influence on the output voltage $V_O$. Consequently, the output driving circuit K29 has an effect similar to that of the output driving circuit K21.

The output driving circuit K30 also has an effect similar to that of the output driving circuit K22 in the fourteenth example. Consequently, the sixteenth example also has the same effect as the fourteenth example.

Figure 41:
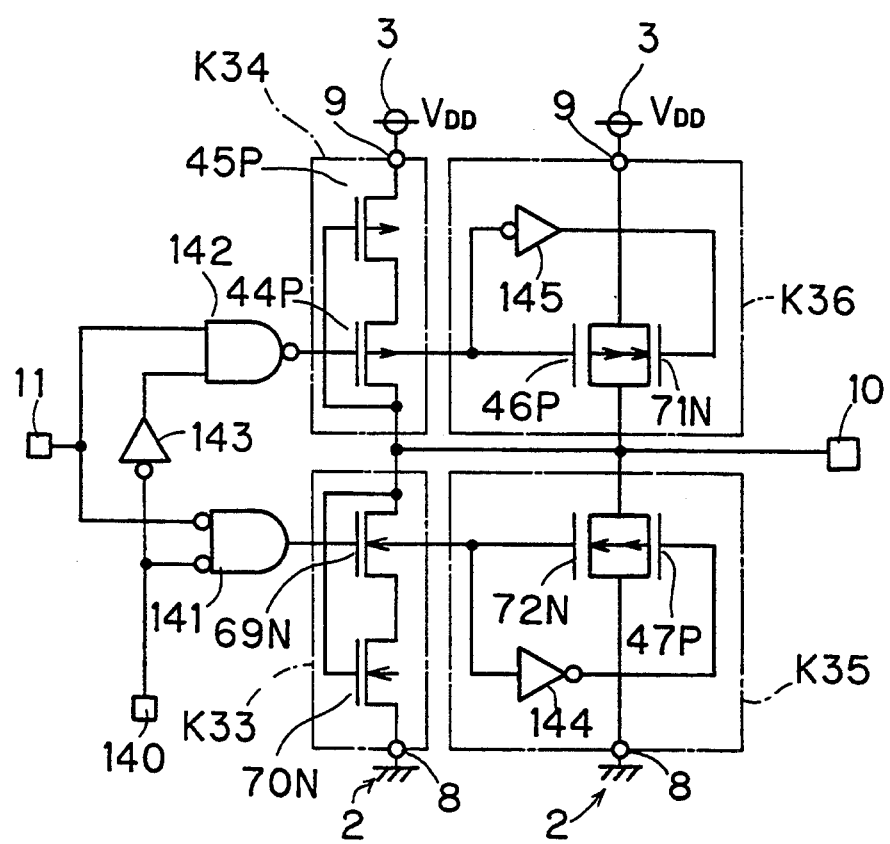
FIG. 41 is a circuit diagram showing a seventeenth example of the output driving circuit according to the present invention.

FIG. 41 is a circuit diagram showing a seventeenth example of the output driving circuit forming the so-called three state type inverter circuit. This example is similar in structure to the fourteenth example shown in FIG. 36, except for that a signal from an input terminal 11 is controlled by a signal from another input terminal 140 through an inverter 143 and gates 141 and 142. In this case, an output driving circuit K36 independently comprises an inverter 145, since the same cannot share an inverter 144 in common with an output driving circuit K35.

When the logical level of the input terminal 140 is low, the logical level of the input terminal 11 is inverted by the gates 141 and 142, to be inputted in output driving circuits K33 and K34 respectively. Thereafter ringing is suppressed in a similar manner to the fourteenth example, while a voltage at a logical level of the same polarity as the input terminal 11 is outputted from an output terminal 10, contrarily to the fourteenth example.

When the logical level of the input terminal 140 is low, on the other hand, the gates 141 and 142 output low and high levels respectively to bring both of transistors 44P and 69N into OFF states regardless of the logical level of the input terminal 11, whereby the voltage of the output terminal 10 enters a "third state", i.e., a high impedance state.

Thus, according to the present invention, it is possible to suppress ringing of output waveforms of output terminals in various output circuits.

Figure 42:
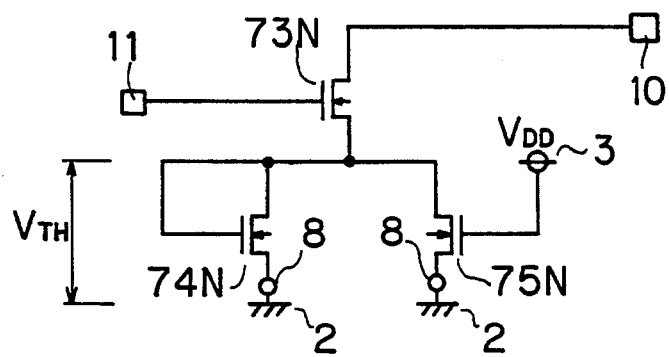
FIG. 42 is a circuit diagram showing an eighteenth example of the output driving circuit according to the present invention.

FIG. 42 is a circuit diagram showing an eighteenth example of the inventive output driving circuit. The output driving circuit shown in FIG. 42 outputs a low level. Referring to FIG. 42, this output driving circuit comprises a first N-channel transistor 73N, a second N-channel transistor 74N and a third N-channel transistor 75N. The first N-channel transistor 73N has a gate which is connected with an input terminal 11, a drain which is connected with an output terminal 10, and a source which is connected to a drain and a gate of the second N-channel transistor 74N and a drain of the third N-channel transistor 75N in common. The second N-channel transistor 74N has the gate which is connected to its drain and a source which is connected to a grounded power supply terminal 8. The third N-channel transistor 75N has a gate which is coupled to a power source 3 for generating a voltage $V_{DD}$ and a source which is connected to another power supply terminal 8. The first and second N-channel transistors 73N and 74N have high current drivability for speed increase. The ON resistance value of the third N-channel transistor 75N is matched with impedance of a wire or a load which is connected to the output terminal 10.

Figure 43:
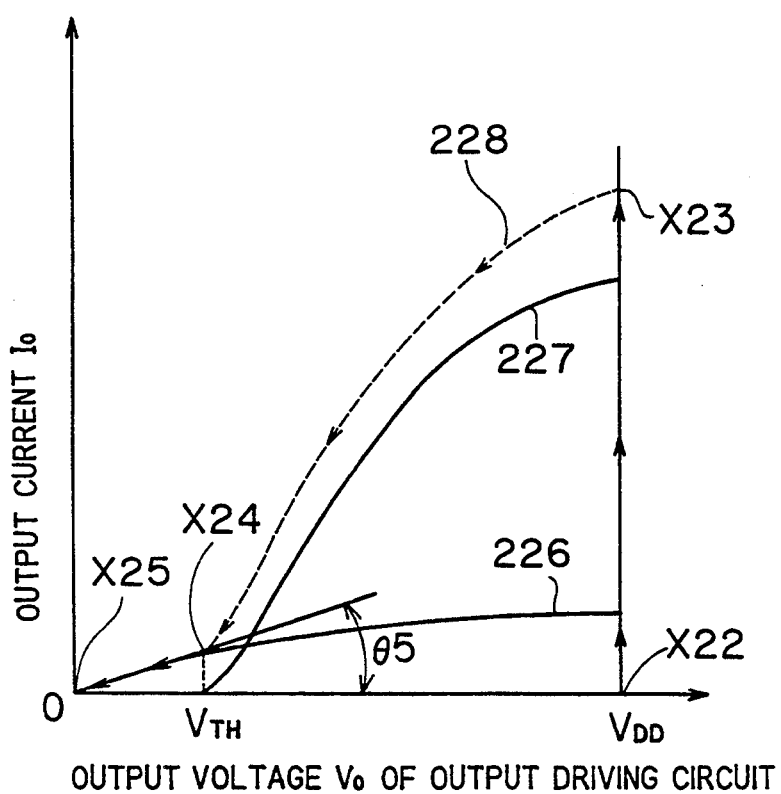
FIG. 43 illustrates output voltage/output current characteristics of the output driving circuit shown in FIG. 42.

FIG. 43 illustrates output voltage/output current characteristics of the output driving circuit shown in FIG. 42. Referring to FIG. 43, the axis of abscissas shows the output voltage $V_O$, and the axis of ordinates shows output current Io. A curve 228 shows a current which flows in a channel of the first N-channel transistor 73N, and this current flows to the output terminal 10. A curve 227 shows a current which flows in a channel of the second N-channel transistor 74N. A curve 226 shows a current which flows in a channel of the third N-channel transistor 75N. Symbols X22 and X23 show points starting inversion from high levels to low levels and symbol X24 shows a switch-off point to the second N-channel transistor 74N, while symbol X25 shows a point of termination of output inversion.

The operation of the output driving circuit shown in FIGS. 42 and 43 is now described.

When an input signal goes to a high level, the first N-channel transistor 73N enters an ON state and the output terminal 10 is connected with the drains of the second and third N-channel transistors 74N and 75N. The second N-channel transistor 74N enters an ON state in response to the drain voltage of the first N-channel transistor 73N since its gate and drain are connected in common. The third N-channel transistor 75N is regularly in an ON state, and the current shown by the curve 228 flows to the channel of the first N-channel transistor 73N in a period from the point X23 to the point X24. This current is diverged to the second and third N-channel transistors 74N and 75N, whereby the current shown by the curve 227 flows to the channel of the second N-channel transistor 74N and that shown by the curve 226 flows to the channel of the third N-channel transistor 75N.

When the voltage of an output signal is reduced to a threshold voltage $V_{TH}$ of the second N-channel transistor 74N at the point X24, the second N-channel transistor 74N is switched off so that the current from the first N-channel transistor 73N flows only to the channel of the third N-channel transistor 75N.

In a period from the point X24 to the point X25, the current is limited by ON resistance of the third N-channel transistor 75N, so that the output signal loosely falls.

Namely, until the period from the point X23 to the point X24, a load is driven by the first and second N-channel transistors 73N and 74N having high current drivability to abruptly reduce the level of the output signal, while the level of the output signal is loosely changed by the ON resistance of the third N-channel transistor 75N in the period from the point X24 to the point X25. Thus, it is possible to suppress generation of ringing in the output signal.

In the vicinity of an expected logical level (low level in this case), the resistance of the output driving circuit is decided by the ON resistance of the third N-channel transistor 75N, whereby it is possible to easily prevent reflection by impedance matching when the load is a transmission line. The proper range of the ON resistance of the output circuit is at least half to not more than twice the characteristic impedance of the load. In such a range, a reflection coefficient is not more than 0.33.

While the embodiment of FIG. 42 is illustrated as to a low level output driving circuit, a high level output driving circuit can be formed by changing the conductivity types shown in FIG. 42 and inverting the voltage and current characteristics.

Further, the third N-channel transistor 75N shown in FIG. 42 may be replaced by a resistor.

Figure 44:
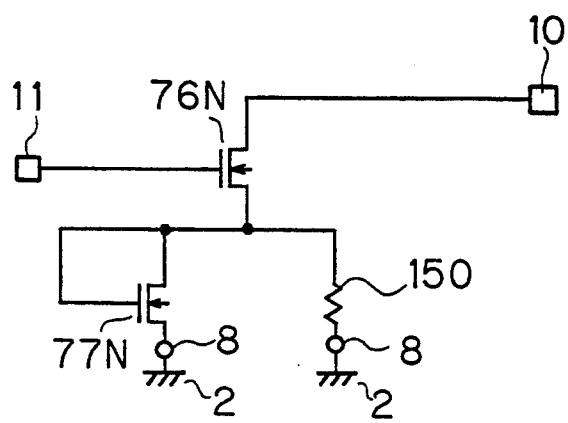
FIG. 44 is a circuit diagram showing a nineteenth example of the output driving circuit according to the present invention.

FIG. 44 is a circuit diagram showing a nineteenth example of the inventive output driving circuit. Referring to FIG. 44, this output driving circuit is different from that shown in FIG. 42 in a point that a resistor 150 is employed in place of the third N-channel transistor 75N. The resistor 150 has an end which is connected to a drain of a second N-channel transistor 77N, and another end which is grounded. The resistance value of the resistor 150 is set at a value for matching output impedance of the output circuit with characteristic impedance of a load, i.e., a value which is identical to the ON resistance value of the third N-channel transistor 75N shown in FIG. 42.

Figure 45:
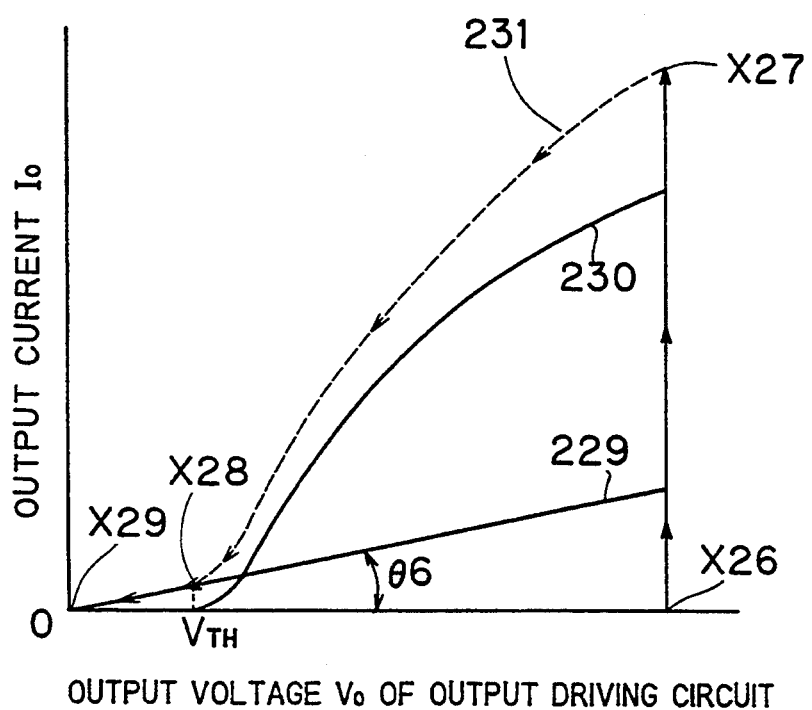
FIG. 45 illustrates output voltage/output current characteristics of the output driving circuit shown in FIG. 44.

FIG. 45 illustrates output voltage/output current characteristics of the output driving circuit shown in FIG. 44. Referring to FIG. 45, a curve 229 shows a current which flows in the resistor 150. Other curves 230 and 231 show currents which flow in transistors 77N and 76N. The curve 229 is in the form of a straight line since the resistance value of the resistor 150 is constant.

In operation, most of an output current flows through the second N-channel transistor 77N having high current drivability until the second N-channel transistor 77N is switched off, similarly to the output driving circuit shown in FIG. 42. After the second N-channel transistor 77N is turned off, the output current flows in the resistor 150, whereby the amount of the current is limited by the resistor 150 in the vicinity of a low level of an output signal.

Therefore, this output driving circuit has a functional effect which is similar to that of the output driving circuit shown in FIG. 42.

Figure 46:
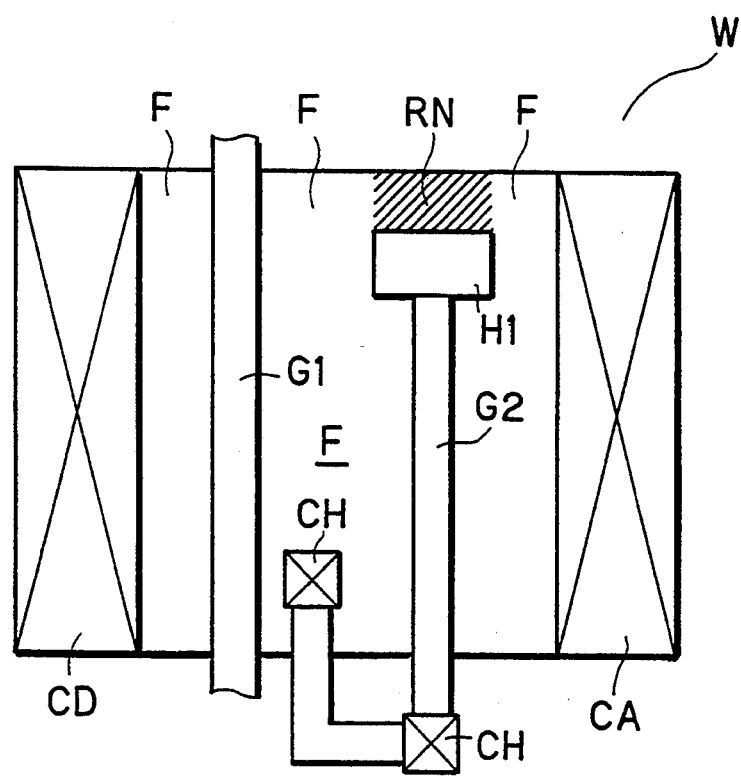
FIG. 46 illustrates the output driving circuit shown in FIG. 45, which is formed on a semiconductor substrate.

In a semiconductor integrated circuit device, however, a resistor generally requires an area which is larger than that of a transistor. In order to prevent area enlargement caused by provision of the resistor, the output driving circuit shown in FIG. 44 is formed in the following manner:

FIG. 46 illustrates the output driving circuit of FIG. 44, which is formed on a semiconductor substrate W. The output driving circuit shown in FIG. 46 includes a contact region CA between the semiconductor substrate W and a ground potential, a contact region CD of the output terminal 10, a gate G1 of the first N-channel transistor 76N, a gate G2 of the second N-channel transistor 77N, a diffused resistor RN, source-to-drain diffusion regions F, contact holes CH, a wire 22 connecting the contact holes CH with each other, and a wire H1 for connecting the resistor RN with the gate G2. Channels are formed under the respective gates G1 and G2. The diffused regions F formed on both sides of the gates G1 and G2 serve as a source and a drain respectively. The contact holes CH are provided in the source region of the first N-channel transistor 76N and the gate G2 of the second N-channel transistor 77N, and connected with each other by the wire formed by a good conductor such as aluminum. The diffused resistor RN is connected to the gate G2 of the second N-channel transistor 77N through the wire H1. Since the diffused resistor RN is formed in the diffusion region forming the first and second N-channel transistors 76N and 77N, only a small area may be provided for the resistor RN.

Figure 47:
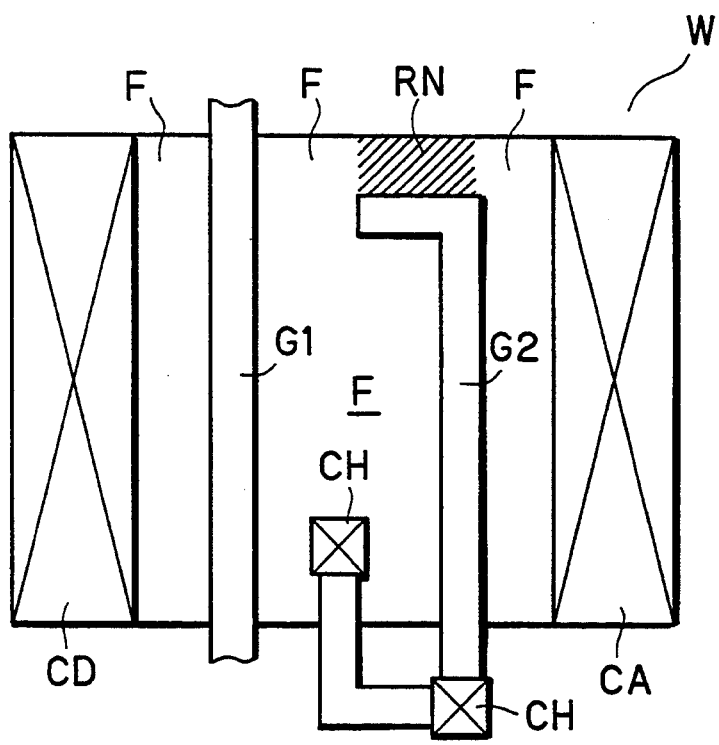
FIG. 47 illustrates the output driving circuit in FIG. 46, which is formed on a semiconductor substrate.

FIG. 47 illustrates a modification of the output driving circuit shown in FIG. 46. The output driving circuit shown in FIG. 47 is different from that shown in FIG. 46 in a point that a gate G2 is extended toward a region of a diffused resistor RN in place of the wire H1. Thus, the gate G2 can be connected with the diffused resistor RN by an extended part of the gate G2.

Figure 48:
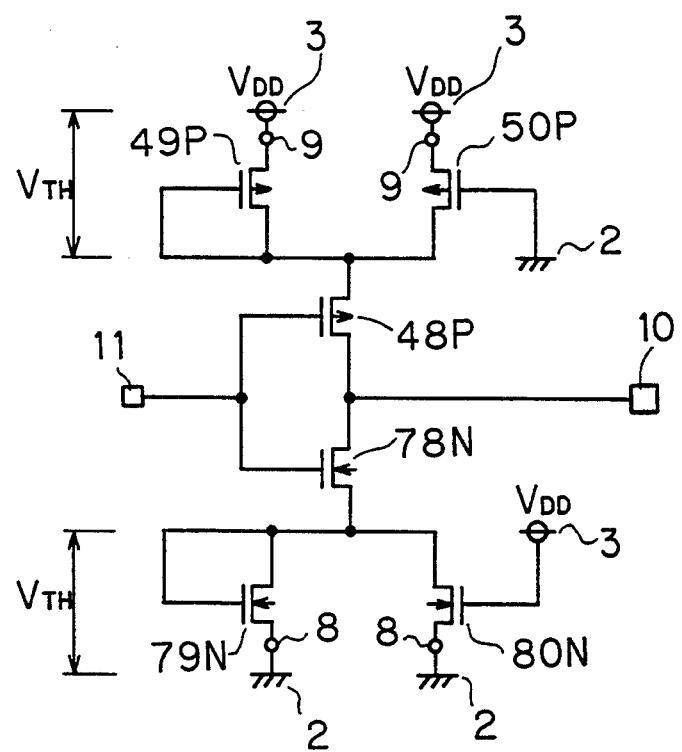
FIG. 48 is a circuit diagram showing a twentieth example of the output driving circuit according to the present invention.

FIG. 48 is a circuit diagram showing a twentieth example of the inventive output driving circuit. The output driving circuit shown in FIG. 48 is different from that shown in FIG. 42 in a point that a high level output driving circuit is added. This high level output driving circuit includes a first P-channel transistor 48P, a second P-channel transistor 49P and a third P-channel transistor 50P. The first P-channel transistor 48P has a gate which is connected to an input terminal 11 with a gate of a first N-channel transistor 78N, a drain which is connected to an output terminal 10 with a drain of the first N-channel transistor 78N, and a source which is connected to drains of the second and third P-channel transistors 49P and 50P in common. The second P-channel transistor 49P has a gate which is connected to its drain, and a source which is coupled to a power supply terminal 9 connected to a power source 3 for generating a voltage $V_{DD}$. The third P-channel transistor 50P has a grounded gate, and a source which is connected to another power supply terminal 9. The first and second P-channel transistors 48P and 49P have high current drivability for speed increase. The ON resistance value of the third P-channel transistor 50P is matched with characteristic impedance of a wire or a load which is connected to an output terminal of an output circuit.

Namely, this high level output driving circuit is different in conductivity type from the low level output driving circuit shown in FIG. 42, and its voltage and current characteristics are inverted. Therefore, it is possible to suppress generation of ringing in output transition from a high level to a low level and vice versa by the low and high level output driving circuits.

The output signal waveform of the output driving circuit shown in FIG. 48 is similar to that of the first embodiment as shown in FIG. 5. Load conditions (inductance and capacitance) in FIG. 5 are similar to those obtained by the output signal of FIG. 54.

Figure 49:
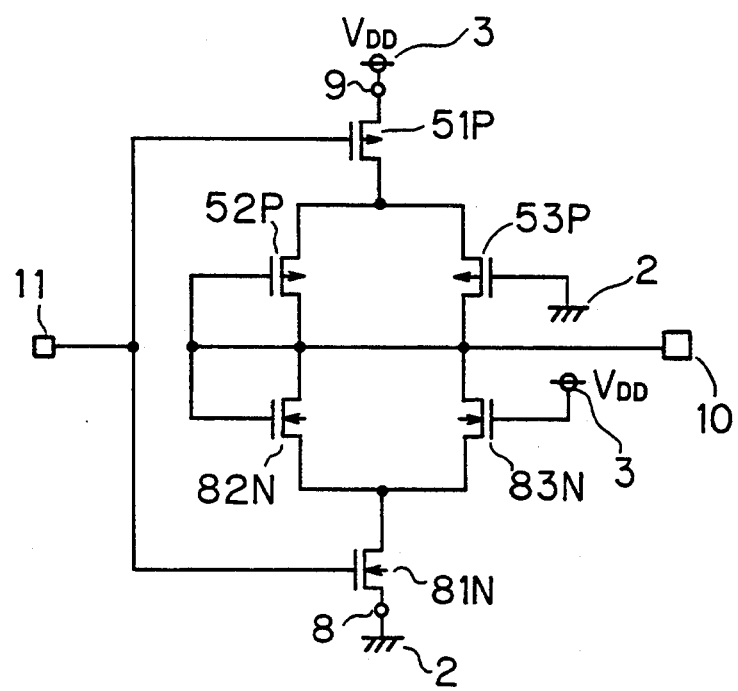
FIG. 49 is a circuit diagram showing a twenty-first example of the output driving circuit according to the present invention.

FIG. 49 is a circuit diagram showing a twenty-first example of the inventive output driving circuit. Referring to FIG. 49, this output driving circuit is different from that shown in FIG. 48 in a point that connection between a first N-channel transistor 81N and second and third N-channel transistors 82N and 83N as well as connection between a first P-channel transistor 51P and second and third P-channel transistors 52P and 53P are exchanged with each other. Also in this output driving circuit, a current flowing from an output terminal 10 to power supply terminals 8 and 9 is diverged similarly to the output driving circuit shown in FIG. 48. Thus, it is possible to attain an effect similar to that shown in FIG. 48.

Figure 50:
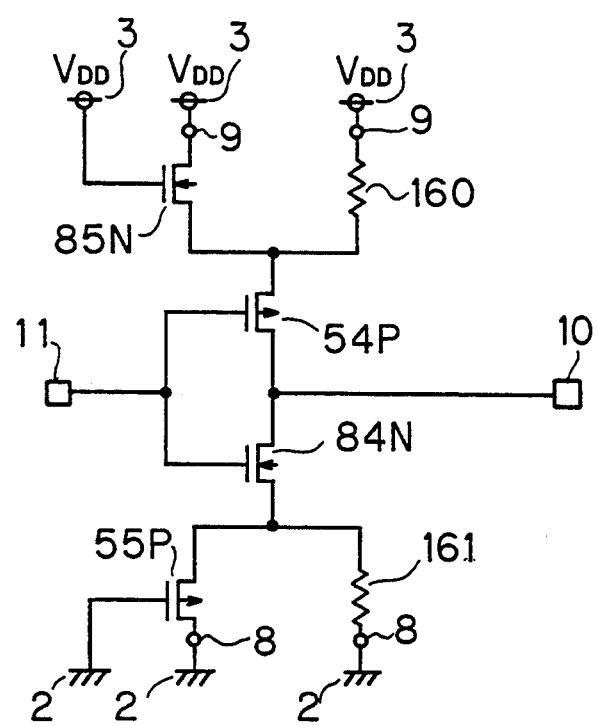
FIG. 50 is a circuit diagram showing a twenty-second example of the output driving circuit according to the present invention.

FIG. 50 is a circuit diagram showing a twenty-second example of the inventive output driving circuit. Referring to FIG. 50, this output driving circuit is different from that shown in FIG. 48 in a point that a P-channel transistor 55P is provided in place of the second N-channel transistor 79N and an N-channel transistor 85N is provided in place of the second P-channel transistor 49P, while a resistor 161 is provided in place of a third N-channel transistor 80N and a resistor 160 is provided in place of the third P-channel transistor 50P. A gate and a diffusion region of the P-channel transistor 55P are grounded, while a gate and a diffusion region of the N-channel transistor 85N are connected to power sources 3. Therefore, no latch-up circuit which is specific to a CMOS integrated circuit device is driven. This is now described in further detail with reference to FIG. 51.

Figure 51:
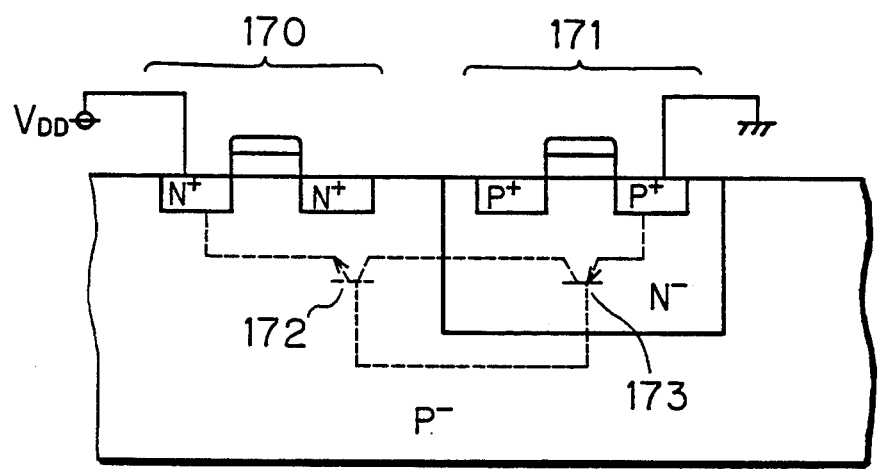
FIG. 51 is a sectional view showing a part of the output driving circuit shown in FIG. 50.

FIG. 51 is a sectional view showing a part of the output driving circuit shown in FIG. 50. Referring to FIG. 51, a pnp transistor 173 and an npn transistor 172 in FIG. 50 corresponding to the transistor 171 or 170, respectively, are parasitically formed by the P-channel transistor 55P and the N-channel transistor 85N. Therefore, a latch-up circuit which is specific to a CMOS integrated circuit device is formed as shown by broken lines in FIG. 51. However, a diffusion region (N+) of the N-channel transistor 85N is coupled to the power source 3, while a diffusion region (P+) of the P-channel transistor 55N is grounded. Therefore, no current flows to the pnp transistor 173 and the npn transistor 172 forming the latch-up circuit. Thus, the output driving circuit can prevent a latch-up phenomenon.

The resistors 160 and 161 may alternatively be replaced by MOS transistors.

Figure 52:
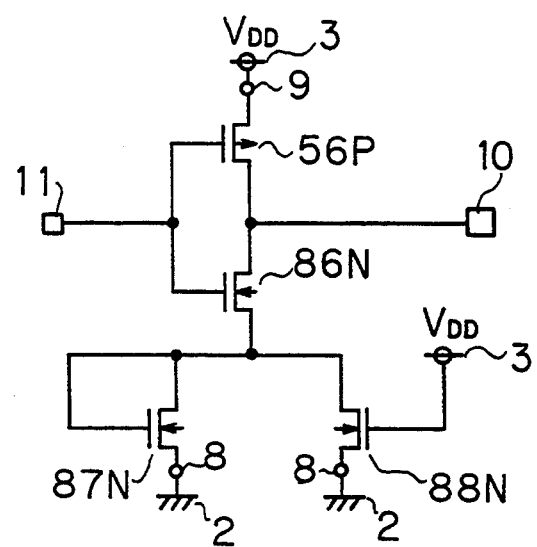
FIG. 52 is a circuit diagram showing a twenty-third example of the output driving circuit according to the present invention.

FIG. 52 illustrates a twenty-third example of the output driving circuit. Referring to FIG. 52, this output driving circuit is different from those shown in FIGS. 48 to 50 in a point that the output driving circuit shown in FIG. 42 is provided only in a low level output driving circuit. In this output driving circuit, generation of ringing can be suppressed only at a low level of an output signal. Therefore, this output driving circuit can be used for driving a load which does not malfunction when ringing is caused in a high level signal or the like. Thus, the low and high level output driving circuits can be independently combined with other output driving circuits.

A P-channel transistor 56P appearing in FIG. 52 can be omitted, to obtain an open drain output driving circuit.

Thus, the output driving circuit forming the inventive output circuit can be applied to an N-channel MOS output driving circuit or a P-channel MOS output driving circuit, in addition to a complementary output circuit.

Figure 53:
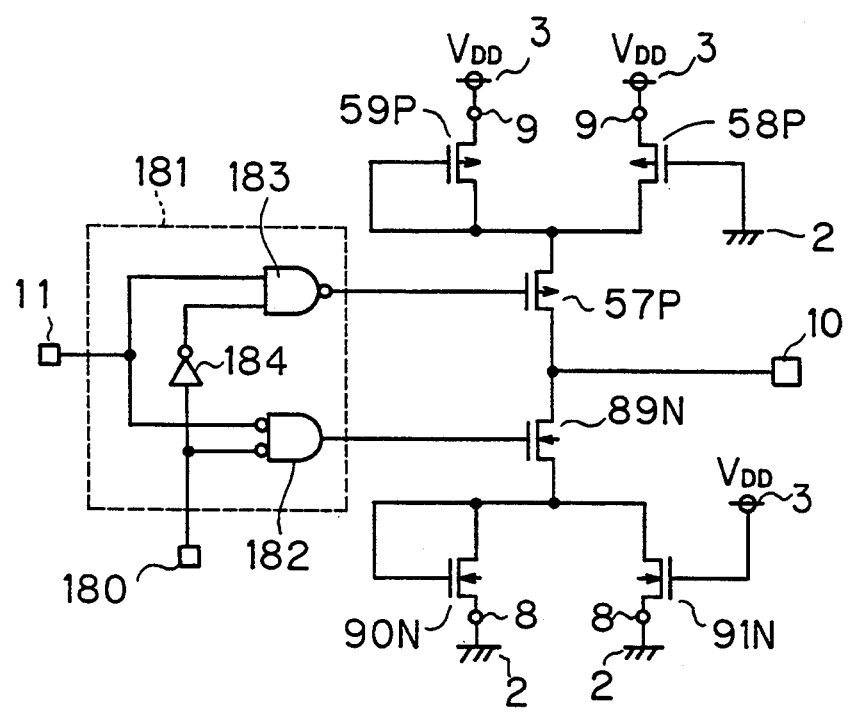
FIG. 53 is a circuit diagram showing a working mode of the output driving circuit shown in FIG. 48.

FIG. 53 illustrates working mode of the inventive MOS transistor output circuit shown in FIG. 48. A high impedance control logic circuit 181 for bringing an output terminal 10 into a high impedance state (floating state) is provided between low and high level output driving circuits and an input terminal 11.

As clearly understood from FIG. 53, the high impedance control circuit 181 is formed by an output NOT AND circuit (corresponding to NAND) 183 having a first input which is connected to the input terminal 11 and an output which is connected to a gate of a first P-channel transistor 57P, an input NOT AND circuit (corresponding to NOR) 182 having a first input which is connected to the input terminal 11 and an output which is connected to a gate of an N-channel transistor 89N, and an inverter 184 which is connected between a control input terminal 180 and a second input of the AND circuit 183. A second input of the AND circuit 182 is directly connected to the control input terminal 180.

When a high level input signal is supplied to the control terminal 180 in operation, the AND circuit 183 outputs a high level signal and the AND circuit 182 outputs a low level signal. Therefore, the first N-channel transistor 89N and the first P-channel transistor 57P enter OFF states. Thus, the output terminal 10 enters a high impedance state.

When a low level signal is supplied to the control terminal 180, on the other hand, the AND circuits 182 and 183 supply the signal which received in the input terminal 11 to the gates of the first N-channel transistor 89N and the first P-channel transistor 57P.

While the output driving circuit shown in FIG. 53 is connected to the control circuit for bringing its output signal into a high impedance state, the same may alternatively be connected to another type of control circuit.

While the invention has been shown and described in detail, the foregoing description is in all aspects illustrative and not restrictive. It is therefore understood that numerous modifications and variations can be devised without departing from the scope of the invention.

I claim:

1. An output circuit comprising:
   an input terminal being supplied with an input signal;
   an output terminal outputting an output signal of a first or second logical level;
   a power supply terminal supplying a voltage of said first logical level;
   resistor means having one end being connected to said output terminal; and
   an output driving circuit being connected between said power supply terminal and the other end of said resistor means for receiving said input signal as a control signal and providing said output signal to said output terminal in response to said input signal, said output driving circuit having such current drivability that the rate of change with respect to conversion of the level of said output signal outputted from said output terminal from said second logical level to said first logical level occurring when the level of said output signal is in the vicinity of said second logical level is larger than the rate of change with respect to said conversion occurring when the level of said output signal is in the vicinity of said first logical level, said current drivability being monotonically reduced with respect to said conversion.

2. An output circuit comprising:
   an input terminal being supplied with an input signal;
   an output terminal outputting an output signal of a first or second logical level;
   a power supply terminal supplying a voltage of said first logical level;
   voltage drop means having one end being connected to said output terminal; and
   an output driving circuit being connected between said power supply terminal and the other end of said voltage drop means for receiving said input signal as a control signal and providing said output signal to said output terminal in response to said input signal, said output driving circuit having such current drivability that the rate of change with respect to conversion of the level of said output signal outputted from said output terminal from said second logical level to said first logical level occurring when the level of said output signal is in the vicinity of said second logical level is larger than the rate of change with respect to said conversion occurring when the level of said output signal is in the vicinity of said first logical level, said current drivability being monotonically reduced with respect to said conversion, wherein said voltage drop means includes resistor means having a variable resistance value.

3. An output circuit in accordance with claim 2, wherein
said resistor means is formed by an element comprising as a plurality of resistors being formed on a substrate, so that said resistance value of said resistor means can be varied by changing the connection pattern of said element.

4. An output circuit in accordance with claim 3, wherein
said element includes a diffused resistor.

5. An output circuit in accordance with claim 3, wherein
said element includes a polysilicon resistor.

6. An output circuit in accordance with claim 3, wherein
said element includes a transistor, 7. An output circuit in accordance with claim 2, wherein
said resistor means comprises:
control means,
a plurality of elements being connected in a plurality of current paths connecting said output terminal with said output driving circuit for serving as resistors, and
at least one switch being independently connected in series to prescribed said elements so that its connection or non-connection state can be controlled by said control means.

8. An output circuit in accordance with claim 7, wherein
prescribed said elements are all said elements.

9. An output circuit in accordance with claim 7, wherein
said elements include diffused resistors.

10. An output circuit in accordance with claim 7, wherein
said elements are polysilicon resistors.

11. An output circuit in accordance with claim 7, wherein
said elements include transistors.

12. An output circuit comprising:
an input terminal being supplied with an input signal;
an output terminal outputting an output signal of a first or second logical level;
a power supply terminal supplying a voltage of said first logical level;
voltage drop means having one end being connected to said output terminal; and
an output driving circuit being connected between said power supply terminal and the other end of said voltage drop means for receiving said input signal as a control signal and providing said output signal to said output terminal in response to said input signal, said output driving circuit having such current drivability that the rate of change with respect to conversion of the level of said output signal outputted from said output terminal from said second logical level to said first logical level occurring when the level of said output signal is in the vicinity of said second logical level is larger than the rate of change with respect to said conversion occurring when the level of said output signal is in the vicinity of said first logical level, said current drivability being monotonically reduced with respect to said conversion, wherein said output driving circuit comprises:
a first circuit being connected between said other end of said voltage drop means and said power supply terminal and controlled by said input signal so that its current drivability is monotonically reduced as the level of said output signal outputted from said output terminal is converted from said second logical level to said first logical level and said current drivability is zeroed when the level of said output signal reaches said first logical level, and
a second circuit being connected in parallel with said first circuit and controlled by said input signal so that its current drivability is monotonically reduced at a larger reduction rate than said first circuit as the level of said output signal is converted from said second logical level to said first logical level and said current drivability is zeroed before the level of said output signal reaches said first logical level.

13. An output circuit in accordance with claim 12, wherein
said second circuit comprises first and second transistors being connected in series in a current path between said other end of said voltage drop means and said power supply terminal,
said first transistor has a control electrode being connected to said input terminal, and
said second transistor has a control electrode being connected to said current path.

14. An output circuit in accordance with claim 12, wherein
said first circuit comprises a transistor having a control electrode being connected with said input terminal, a first current electrode being connected with said power supply terminal, and a second current electrode being connected with said other end of said voltage drop means respectively.

15. An output circuit in accordance with claim 12, wherein
said first circuit comprises:
an inverter having an input end being connected with said input terminal, and
a transmission gate being connected between said other end of said voltage drop means and said power supply terminal, and
said transmission gate is formed by:
a first transistor having a control electrode being connected with said input terminal, a first current electrode being connected with said other end of said voltage drop means, and a second current electrode being connected with said power supply terminal respectively, and a second transistor, being complementary in polarity to said first transistor, having a control electrode being connected with an output end of said inverter, a first current electrode being connected with said other end of said voltage drop means, and a second current electrode being connected with said power supply terminal respectively.

16. An output circuit in accordance with claim 15, wherein
the sum of ON resistance of said transmission gate and the resistance value of said voltage drop means is set to be at least ½ and not more than twice the characteristic impedance of a load being connected with said output terminal.

17. An output circuit in accordance with claim 12, wherein
said first circuit comprises a first conductivity type first insulated gate transistor having a source electrode being connected with said power supply terminal, a gate electrode being connected with said input terminal, and a drain electrode being connected with said other end of said voltage drop means,
said second circuit comprises:
an inverter having an input end being connected to said input terminal, and
a second conductivity type second insulated gate transistor having a source electrode being connected with said other end of said voltage drop means, a gate electrode being connected with an output end of said inverter, and a drain electrode being connected with said power supply terminal, and
a value obtained by dividing the channel width of said first insulated gate transistor by its channel width is at least twice a value obtained by dividing the channel width of said second insulated gate transistor by its channel width.

18. An output circuit in accordance with claim 13, wherein
said first transistor has one electrode being connected with said other end of said voltage drop means and another electrode being connected with one electrode of said second transistor, while said second transistor has a control electrode being connected with its one electrode and another electrode being connected with said power supply terminal.

19. An output circuit in accordance with claim 18, wherein
both of said first and second transistors include first conductivity type insulated gate transistors.

20. An output circuit in accordance with claim 13, wherein
said first transistor has one electrode being connected with said power supply terminal and another electrode being connected with one electrode of said second transistor, while said second transistor has a control electrode being connected with its one electrode and another electrode being connected with said other end of said voltage drop means.

21. An output circuit in accordance with claim 20, wherein
both of said first and second transistors include first conductivity type insulated gate transistors.

22. An output circuit in accordance with claim 13, wherein
said first transistor has one electrode being connected with said power supply terminal and another electrode being connected with one electrode of said second transistor, while said second transistor has a control electrode being connected with said power supply terminal and another electrode being connected with said other end of said voltage drop means.

23. An output circuit in accordance with claim 22, wherein
said first transistor is a first conductivity type insulated gate transistor, and
said second transistor is a second conductivity type insulated gate transistor.

24. An output circuit in accordance with claim 13, wherein
said first transistor has one electrode being connected with said power supply terminal and another electrode being connected with one electrode of said second transistor while said second transistor has another electrode being connected with said output terminal through said voltage drop means and a control electrode being connected with its another electrode or said output terminal.

25. An output circuit in accordance with claim 24, wherein
both of said first and second transistors include first conductivity type insulated gate transistors.

26. An output circuit comprising:
an input terminal being supplied with an input signal;
an output terminal outputting an output signal of a first or second logical level;
a first power supply terminal supplying a voltage of said first logical level;
resistor means having one end being connected with said output terminal;
a second power supply terminal supplying a voltage of said second logical level;
a first output driving circuit being connected between said first power supply terminal and the other end of said voltage drop means for receiving said input signal as a control signal and providing said output signal of said first logical level to said output terminal in response to said input signal; and
a second output driving circuit being connected between said second power supply terminal and said other end of said voltage drop means for receiving said input signal as a control signal and providing said output signal of said second logical level to said output terminal in response to said input signal, wherein
said first output driving circuit has such current drivability that the rate of change with respect to unidirectional conversion of the level of said output signal outputted from said output terminal from said second logical level to said first logical level occurring when the level of said output signal is in the vicinity of said second logical level is larger than the rate of change with respect to said unidirectional conversion occurring when the level of said output signal is in the vicinity of said first logical level, said current drivability being monotonically reduced with respect to said unidirectional conversion, and
said second output driving circuit has such current drivability that the rate of change with respect to backward conversion of the level of said output signal outputted from said output terminal from said first logical level to said second logical level occurring when the level of said output signal is in the vicinity of said first logical level is larger than the rate of change with respect to said backward conversion occurring when the level of said output signal is in the vicinity of said second logical level, said current drivability being monotonically reduced with respect to said backward conversion.

27. An output circuit comprising:
an input terminal being supplied with an input signal;
an output terminal outputting an output signal of a first or second logical level;
a first power supply terminal supplying a voltage of said first logical level;
voltage drop means having one end being connected with said output terminal;
a second power supply terminal supplying a voltage of said second logical level;
a first output driving circuit being connected between said first power supply terminal and the other end of said voltage drop means for receiving said input signal as a control signal and providing said output signal of said first logical level to said output terminal in response to said input signal; and
a second output driving circuit being connected between said second power supply terminal and said other end of said voltage drop means for receiving said input signal as a control signal and providing said output signal of said second logical level to said output terminal in response to said input signal, wherein
said first output driving circuit has such current drivability that the rate of change with respect to unidirectional conversion of the level of said output signal outputted from said output terminal from said second logical level to said first logical level occurring when the level of said output signal is in the vicinity of said second logical level is larger than the rate of change with respect to said unidirectional conversion occurring when the level of said output signal is in the vicinity of said first logical level, said current drivability being monotonically reduced with respect to said unidirectional conversion, and
said second output driving circuit has such current drivability that the rate of change with respect to backward conversion of the level of said output signal outputted from said output terminal from said first logical level to said second logical level occurring when the level of said output signal is in the vicinity of said first logical level is larger than the rate of change with respect to said backward conversion occurring when the level of said output signal is in the vicinity of said second logical level, said current drivability being monotonically reduced with respect to said backward conversion, wherein said voltage drop means includes resistor means having a variable resistance value.

28. An output circuit comprising:
an input terminal being supplied with an input signal;
an output terminal outputting an output signal of a first or second logical level;
a first power supply terminal supplying a voltage of said first logical level;
voltage drop means having one end being connected with said output terminal;
a second power supply terminal supplying a voltage of said second logical level;
a first output driving circuit being connected between said first power supply terminal and the other end of said voltage drop means for receiving said input signal as a control signal and providing said output signal of said first logical level to said output terminal in response to said input signal; and
a second output driving circuit being connected between said second power supply terminal and said other end of said voltage drop means for receiving said input signal as a control signal and providing said output signal of said second logical level to said output terminal in response to said input signal, wherein
said first output driving circuit has such current drivability that the rate of change with respect to unidirectional conversion of the level of said output signal outputted from said output terminal from said second logical level to said first logical level occurring when the level of said output signal is in the vicinity of said second level is larger than the rate of change with respect to said unidirectional conversion occurring when the level of said output signal is in the vicinity of said first logical level, said current drivability being monotonically reduced with respect to said unidirectional conversion, and
said second output driving circuit has such current drivability that the rate of change with respect to backward conversion of the level of said output signal outputted from said output terminal from said first logical level to said second logical level occurring when the level of said output signal is in the vicinity of said first logical level is larger than the rate of change with respect to said backward conversion occurring when the level of said output signal is in the vicinity of said second logical level, said current drivability being monotonically reduced with respect to said backward conversion,
wherein said first output driving circuit comprises:
a first circuit being connected between said other end of said voltage drop means and said power supply terminal and controlled by said input terminal so that its current drivability is monotonically reduced along said unidirectional conversion of the level of said output signal being outputted from said output terminal and said current drivability is zeroed when the level of said output signal reaches said first logical level, and
a second circuit being connected in parallel with said first circuit and controlled by said input signal so that its current drivability is monotonically reduced at a larger reduction rate than said first circuit along said unidirectional conversion of the level of said output signal and said current drivability is zeroed before the level of said output signal reaches said first logical level, and
said second output driving circuit comprises:
a third circuit being connected between said other end of said voltage drop means and said second power supply terminal and controlled by said input signal so that its current drivability is monotonically reduced along said backward conversion of the level of said output signal being outputted from said output terminal and said current drivability is zeroed when the level of said output signal reaches said second logical level, and
a fourth circuit being connected in parallel with said third circuit and controlled by said input signal so that its current drivability is monotonically reduced at a larger reduction rate than said third circuit along said backward conversion of the level of said output signal and said current drivability is zeroed before the level of said output signal reaches said second logical level.

29. An output circuit in accordance with claim 28, wherein
said second circuit comprises:
a first transistor being connected in series in a first current path between said other end of said voltage drop means and said power supply terminal and having a control electrode being connected with said input terminal, and
a second transistor being connected in series in said first current path between said voltage drop means and said power supply terminal and having a control electrode being connected with said first current path, and
said fourth circuit comprises:
a third transistor being connected in series in a second current path between said other end of said voltage drop means and said second power supply terminal and having a control electrode being connected with said input terminal and
a fourth transistor being interposed in series in a second current path between said voltage drop means and said second power supply terminal and having a control electrode being connected with said second current path.

30. An output circuit in accordance with claim 28, wherein
said first circuit comprises a first transistor having a control electrode being connected with said input terminal, a first current electrode being connected with said first power supply terminal, and a second current electrode being connected with said other end of said voltage drop means respectively, and
said third circuit comprises a second transistor having a control electrode being connected with said input terminal, a first current electrode being connected with said second power supply terminal, and a second current electrode being connected with said output terminal respectively.

31. An output circuit in accordance with claim 28, wherein
said first circuit comprises:
a first inverter having an input end being connected with said input terminal, and
a first transmission gate being connected between said other end of said voltage drop means and said first power supply terminal,
said first transmission gate is formed by a first transistor having a control electrode being connected with said input terminal, a first current electrode being connected with said other end of said voltage drop means, and a second current electrode being connected with said power supply terminal, and a second transistor, being complementary in polarity to said first transistor, having a control electrode being connected with an output end of said first inverter, a first current electrode being connected with said other end of said voltage drop means, and a second current electrode being connected with said power supply terminal respectively,
said third circuit comprises:
a second inverter having an input end being connected with said input terminal, and
a second transmission gate being connected between said other end of said voltage drop means and said second power supply terminal, and
said second transmission gate is formed by a third transistor having a control electrode being connected with said input terminal, a first current electrode being connected with said other end of said voltage drop means, and a second current electrode being connected with said second power supply terminal, and a fourth transistor, being complementary in polarity to said third transistor, having a control electrode being connected with an output end of said second inverter, a first current electrode being connected with said other end of said voltage drop means, and a second current electrode being connected with said second power supply terminal respectively.

32. An output circuit in accordance with claim 31, wherein
the sum of ON resistance of said first or second transmission gate and the resistance value of said voltage drop means is set to be at least $\frac{1}{2}$ and not more than twice the characteristic impedance of a load which is connected with said one end of said voltage drop means.

33. An output circuit in accordance with claim 28, further comprising an inverter having an input end being connected with said input terminal, wherein
said first circuit comprises a first conductivity type first insulated gate transistor having a source electrode being connected with said first power supply terminal, a gate electrode being connected with said input terminal, and a drain electrode being connected with said other end of said voltage drop means,
said second circuit comprises a second conductivity type second insulated gate transistor having a source electrode being connected with said other end of said voltage drop means, a gate electrode being connected with an output end of said inverter, and a drain electrode being connected with said first power supply terminal,
said third circuit comprises a second conductivity type third insulated gate transistor having a source electrode being connected with said second power supply terminal, a gate electrode being connected with said input terminal, and a drain electrode being connected with said other end of said voltage drop means,
said fourth circuit comprises a first conductivity type fourth insulated gate transistor having a source electrode being connected with said other end of said voltage drop means, a gate electrode being connected with said output end of said inverter, and a drain electrode being connected with said second power supply terminal,
a value obtained by dividing the channel width of said first insulated gate transistor by its channel width of said first insulated gate transistor by its channel width is at least twice a value obtained by dividing the channel width of said second insulated gate transistor by its channel length, and
a value obtained by dividing the channel width of said third insulated gate transistor by its channel length is at least twice a value obtained by dividing the channel width of said fourth insulated gate transistor by its channel length.

34. An output circuit in accordance with claim 29, wherein said first transistor has one electrode being connected with said other end of said voltage drop means and another end being connected to one electrode of said second transistor, while said second transistor has a control electrode being connected with its one or other electrode and another electrode being connected with said first power supply terminal, and said third transistor has one electrode being connected to said other end of said voltage drop means and another electrode being connected to one electrode of said fourth transistor, while said fourth transistor has a control electrode being connected with its one or other electrode and another electrode being connected with said second power supply terminal.

35. An output circuit in accordance with claim 34, wherein both of said first and second transistors are first conductivity type insulated gate transistors, and both of said third and fourth transistors are second conductivity type insulated gate transistors.

36. An output circuit in accordance with claim 29, wherein said first transistor has one electrode being connected with said first power supply terminal and another electrode being connected with one electrode of said second transistor while said second transistor has a control electrode being connected with its one or other electrode and another electrode being connected with said other end of said voltage drop means, and said third transistor has one electrode being connected with said second power supply terminal and another electrode being connected with one electrode of said fourth transistor while said fourth transistor has a control electrode being connected with its one or other electrode and another electrode being connected with one end of said voltage drop means.

37. An output circuit in accordance with claim 36, wherein both of said first and second transistors are first conductivity type insulated gate transistors, and both of said third and fourth transistors are second conductivity type insulated gate transistors.

38. An output circuit in accordance with claim 29, wherein said first transistor has one electrode being connected with said power supply terminal and another electrode being connected with one electrode of said second transistor while said second transistor has a control electrode being connected with said power supply terminal and another electrode being connected to said other end of said voltage drop means, and said third transistor has one electrode being connected with said power supply terminal and another electrode being connected with one electrode of said fourth transistor while said fourth transistor has a control electrode being connected with said other end of said voltage drop means and another electrode being connected with said other end of said voltage drop means.

39. An output circuit in accordance with claim 38, wherein said first transistor is a first conductivity type insulated gate transistor, said second transistor is a second conductivity type insulated gate transistor, and both of said third and fourth transistors are first conductivity type insulated gate transistors.

40. An output circuit in accordance with claim 29, wherein said first transistor has one electrode being connected with said power supply terminal and another electrode being connected with one electrode of said second transistor while said second transistor has another electrode being connected with said output terminal through said voltage drop means and a control electrode being connected with its another electrode or said output terminal, and said third transistor has one electrode being connected with said power supply terminal and another electrode being connected with one electrode of said fourth transistor while said fourth transistor has another electrode being connected with said output terminal through said voltage drop means and a control electrode being connected with its another electrode or said output terminal.

41. An output circuit in accordance with claim 40, wherein both of said first and second transistors are first conductivity type insulated gate transistors, and both of said third and fourth transistors are second conductivity type insulated gate transistors.

42. An output circuit in accordance with claim 28, wherein said first circuit comprises a first conductivity type first insulated gate transistor having a source electrode being connected with said first power supply terminal, a gate electrode being connected with said input terminal, and a drain electrode being connected with one end of said voltage drop means, said second circuit comprises:

an inverter having an input end being connected with said input terminal, and a second conductivity type second insulated gate transistor having a source electrode being connected with said other end of said voltage drop means, a gate electrode being connected with an output end of said inverter, and a drain electrode being connected with said first power supply terminal, and said fourth circuit comprises:

a first transistor being connected in series in a current path between said other end of said voltage drop means and said second power terminal and having a control electrode being connected with said input terminal, and a second transistor being connected in series in said current path between said other end of said voltage drop means and said second power supply terminal and having a control electrode being connected with said current path.

43. An output circuit in accordance with claim 2, wherein said the output driving circuit comprising:

first switching means being connected between said other end of said voltage drop means and said power supply terminal and controlled by said input signal for switching, second switching means being supplied with an output signal from said output terminal through said first switching means and said voltage drop means for switching off when the level of said output signal exceeds a prescribed value, and another voltage drop means being connected in parallel with said second switching means.

* * * * *